(12) United States Patent
Ueno et al.

(10) Patent No.: US 6,300,656 B1
(45) Date of Patent: *Oct. 9, 2001

(54) NONVOLATILE SEMICONDUCTOR MEMORY DEVICE HAVING A DRAIN REGION OF DIFFERENT IMPURITY DENSITY AND CONDUCTIVITY TYPES

(75) Inventors: Shuichi Ueno; Shigeru Kusunoki; Yoshinori Okumura, all of Hyogo (JP)

(73) Assignee: Mitsubishi Denki Kabushiki Kaisha, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/647,532

(22) Filed: May 15, 1996

(30) Foreign Application Priority Data

Oct. 26, 1995 (JP) .................................................. 7-279155

(51) Int. Cl.[7] .................................................. G11C 11/34
(52) U.S. Cl. .................. 257/315; 257/314; 257/317; 257/336; 257/344; 257/497; 257/321; 257/322; 438/231; 438/232; 438/305; 438/306
(58) Field of Search .................................................. 257/314, 315, 257/316, 321, 303, 322, 296, 327, 328, 344, 369, 357, 380, 497, 404, 408; 438/201, 231, 232, 305, 306, FOR 169

(56) References Cited

U.S. PATENT DOCUMENTS

| | | | |
|---|---|---|---|
| 4,835,740 | | 5/1989 | Sato . |
| 5,189,497 | * | 2/1993 | Komori et al. ........................ 257/328 |
| 5,300,802 | * | 4/1994 | Komori et al. ........................ 257/315 |
| 5,337,274 | * | 8/1994 | Ohji ........................................ 257/315 |
| 5,366,915 | * | 11/1994 | Kodama . |
| 5,569,947 | * | 10/1996 | Iwasa et al. .......................... 257/382 |

FOREIGN PATENT DOCUMENTS

| | | |
|---|---|---|
| 2-372 | 1/1990 | (JP) . |
| 2-129968 | 5/1990 | (JP) . |
| 3-72682 | 3/1991 | (JP) . |
| 5110114 * | 4/1993 | (JP) ........................ 257/316 |
| 5-136427 | 6/1993 | (JP) . |
| 6-177399 | 6/1994 | (JP) . |

OTHER PUBLICATIONS

Y. Ohshima et al, Process and Device Technologies for 16Mbit EPROMs with Large–Tilt–Angle Implanted P–Pocket Cell, IDEM 90, pp. 95–98.

Flash Memory Technical Hand Book, Science Forum.

* cited by examiner

*Primary Examiner*—Fetsum Abraham
(74) *Attorney, Agent, or Firm*—McDermott, Will & Emery

(57) ABSTRACT

A nonvolatile semiconductor memory device includes an n-type region which is in contact with n[+] drain diffusion region at a surface of p-type silicon substrate and covers the periphery thereof. The device also includes a p-type impurity region which is in contact with n-type region and covers the periphery thereof. The n[+] drain diffusion region, n-type region and p[+] impurity region extend to region located immediately under the floating gate electrode. Thereby, the nonvolatile semiconductor memory device has a structure which can promote injection of high energy electrons along a gate electrode direction.

20 Claims, 41 Drawing Sheets

NONVOLATILE SEMICONDUCTOR MEMORY DEVICE HAVING A DRAIN REGION OF DIFFERENT IMPURITY DENSITY AND CONDUCTIVITY TYPES

BACKGROUND OF THE INVENTION

1. Field of the Invention

The present invention relates to a nonvolatile semiconductor memory device and a method of manufacturing the same, and in particular to a so-called flash memory, i.e., an EEPROM (electrically Erasable and Programmable Read Only Memory) allowing electrical erasing and writing of information, and a method of manufacturing the same.

2. Description of the Background Art

EEPROMs have been known as a kind of nonvolatile semiconductor memory devices which allow free programming of data and also allow electrical writing and erasing of information. Although the EEPROM has an advantage that both writing and erasing can be executed electrically, it requires two transistors, i.e., a select transistor and a memory transistor for each memory cell, so that integration to a higher degree is difficult. In view of this, there has been proposed a flash EEPROM, in which each memory cell is formed of one transistor, and entire written information charges can be electrically erased at a time. This is disclosed, for example, in U.S. Pat. No. 4,868,619.

FIG. 81 is a block diagram showing a general structure of a flash memory. Referring to FIG. 81, the structure includes a memory cell matrix 100, an X-address decoder 200, a Y-gate 300, a Y-address decoder 400, an address buffer 500, a write circuit 600, a sense amplifier 700, an I/O buffer 800 and a control logic 900.

Memory cell matrix 100 includes a plurality of memory transistors arranged in a matrix form. Memory matrix 100 is connected to X-address decoder 200 and Y-gate 300. X-address decoder 200 and Y-gate 300 function to select rows and columns in memory cell matrix 100, respectively. Y-gate 300 is connected to Y-address decoder 400. Y-address decoder 400 functions to provide information for selecting columns. X-address decoder 200 and Y-address decoder 400 are connected to address buffer 500. Address buffer 500 functions to store temporarily address information.

Y-gate 300 is connected to write circuit 600 and sense amplifier 700. Write circuit 600 functions to perform writing during data inputting. Sense amplifier 700 functions to determine "0" or "1" as a value of a current which flows during data outputting. Write circuit 600 and sense amplifier 700 each are connected to I/O buffer 800. I/O buffer 800 functions to store temporarily input/output data.

Address buffer 500 and I/O buffer 800 are connected to control logic 900. Control logic 900 functions to control the operation of flash memory. Control logic 900 performs control based on a chip enable signal /CE, an output enable signal /OE and a program signal. Characters "/" in reference characters such as "/CE" mean inversion.

FIG. 82 is an equivalent circuit diagram showing a schematic structure of memory cell matrix 100 shown in FIG. 81. Referring to FIG. 82, memory cell matrix 100 is provided with a plurality of word lines $WL_1, WL_2 \ldots, WL_i$ and a plurality of bit lines $BL_1, BL_2 \ldots, BL_j$ which extends perpendicularly to each other to form a matrix. The plurality of word lines $WL_1\ WL_2\ \ldots,\ WL_i$ are connected to X-address decoder 200 and are disposed in the row direction. The plurality of bit lines $BL_1\ BL_2\ \ldots,\ BL_j$ are connected to Y-gate 300 and are disposed in the column direction.

Memory transistors $Q_{11}, Q_{12}, \ldots, Q_{ij}$ are arranged at crossings of the word lines and bit lines, respectively. Each memory transistor has a drain connected to the corresponding bit line. A control gate of each memory transistor is connected to the corresponding word line. A source of each memory transistor is connected to the corresponding source line $S_1, S_2 \ldots, S_i$. The sources of memory transistors belonging to the same row are mutually connected.

A structure of each memory transistor forming the conventional flash memory will now be described below.

FIG. 83 is a fragmentary plan showing a schematic structure of memory cell matrix 100 of the conventional flash memory. FIG. 84 is a cross section taken along line D–D' in FIG. 83.

Referring mainly to FIG. 84, a p-type silicon substrate 1 is provided at its main surface with drain diffusion regions 13 and a source diffusion region 12 which are spaced from each other with channel regions 2 therebetween, respectively. A floating gate electrode 4 is formed on each channel region 2 with a thin oxide film 3 of about 100 Å in thickness therebetween. A control gate electrode 6 is formed on floating gate electrode 4 with an interlayer insulating film 5 therebetween. Floating gate electrode 4 and control gate electrode 6 are made of polycrystalline silicon doped with impurity, which will be referred to as "doped polycrystalline silicon" hereinafter. A thermal oxide film 51 is formed over p-type silicon substrate 1, floating gate electrode 4 and control gate electrode 6. A smooth coat film 8 made of, e.g., an oxide film is formed over floating gate electrode 4 and control gate electrode 6.

Smooth coat film 8 is provided with a contact hole 9 reaching a portion of a surface of source diffusion region 12. A bit line 52, which has a portion electrically connected to source diffusion region 12 through contact hole 9, extends on smooth coat film 8.

Referring mainly to FIG. 83, the plurality of word lines 6 are arranged perpendicularly to the plurality of bit lines 52. Each word line 6 is integral with the plurality of control gate electrodes 6. At each of crossings of word lines 6 and bit lines 52, there is formed floating gate electrode 4 located under control gate electrode 6. There are also formed element isolating oxide films 53, each of which is formed between two areas each including two floating gate electrodes 4 neighboring to each other in the column direction.

Referring to FIG. 85, description will be given on a write operation of a flash EEPROM utilizing channel hot electrons. A voltage $V_{D1}$ of about 6 to 8V is applied to drain diffusion region 13, and a voltage $V_{G1}$ of about 10 to 15V is applied to control gate electrode 6. Voltages $V_{D1}$ and $V_{G1}$ thus applied generate a large amount of high energy electrons near drain diffusion region 13 and oxide film 3. The electrons thus generated are partially introduced into floating gate electrode 4. Since the electrons are accumulated in floating gate electrode 4 in this manner, a threshold voltage $V_{TH}$ of the memory transistor increases. The state where threshold voltage $V_{TH}$ is higher than a predetermined value is a written state and is called a "0" state.

Referring to FIG. 86, an erase operation utilizing an F-N (Fowler-Nordheim) tunnel phenomenon will be described below. A voltage $V_S$ of about 10 to 12V is applied to source diffusion region 12, control gate electrode 6 is set to the ground potential, and drain diffusion region 13 is held at the floating state. Voltage $V_S$ applied to source diffusion region 12 generates an electric field, which causes the F-N tunnel phenomenon to move electrons from floating gate electrode 4 through thin oxide film 3. Since electrons are removed from floating gate electrode 4, threshold voltage $V_{TH}$ of the memory transistor lowers. The state where threshold voltage $V_{TH}$ is lower than the predetermined value is an erased state and is called an "1" state.

In a read operation, a voltage $V_{G2}$ of about 5V is applied to control gate electrode 6 shown in FIG. 84, and a voltage $V_{D2}$ of about 1 to 2V is applied to drain diffusion region 13. The foregoing determination of "1" or "0" is performed based on whether a current flows through the channel region of memory transistor, i.e., whether the memory transistor is on or off. Thereby, information is read.

For the flash memory described above, there has been proposed a drain structure (which will be referred to as a "pocket structure") shown in FIGS. 87 and 88 in order to improve write characteristics. FIG. 88 shows, on an enlarged scale, a region S in FIG. 87.

A structure shown in FIGS. 87 and 88 is provided with a p-type pocket region 15 which is in contact with drain diffusion region 13 and covers the periphery of the same. p-type pocket region 15 has an impurity concentration higher than that of the p-type silicon substrate. This raises an electric field at a drain end (region T in FIG. 88) in a pn junction (formed of drain diffusion region 13 and pocket region 15) as shown in FIG. 89.

FIG. 89 shows electric fields in a direction parallel to each channel along line F–F' in FIG. 88. More specifically, FIG. 89 shows at (a) the electric field in a structure not provided with the pocket region, and shows at (b) the electric field in a structure provided with the pocket region.

Provision of the pocket structure increases a rate of electrons having a high energy in all electrons running through the channel. This promotes introduction or injection of electrons into the gate, and thus increases the gate current.

As is apparent from the above, the pocket structure is employed for improving the write characteristics by increasing the absolute quantity of channel hot electrons.

By employing the pocket structure, the electric field (Ex) parallel to the channel can be enhanced at the drain end as described above, and a probability of generation of high energy electrons can be improved.

However, generated high energy electrons move toward the drain. In order to inject the high energy electrons into the floating gate electrode, therefore, it is necessary to change the moving direction so that the high energy electrons may be directed toward the floating gate electrode by elastic scattering. However, electrons are randomly directed by elastic collision with impurity 60 as shown in FIG. 90. Therefore, only a part of electrons have a moment in the floating gate electrode direction, i.e., moment directed toward the floating gate electrode.

Since the electric field along the gate electrode direction in a bulk is low at a region where channel hot electrons generate, the probability that high energy electrons have the moment in the gate electrode direction after elastic collision is disadvantageously low.

In the pocket structure (FIGS. 87 and 88) described above, the electric field (longitudinal electric field) in a vertical direction with respect to the channel of insulating film 3 increases at the drain end where the most high energy electrons are generated. It is defined that an arrival probability is a probability that generated high energy electrons arrive at the floating gate. In this case, the longitudinal electric field in insulating film 3 acts to reduce the arrival probability by the following reason.

First, under the application condition that drain voltage Vd is smaller than gate voltage Vg, the longitudinal electric field and the lateral electric field (i.e., electric field parallel to the channel) in the insulating film 3 are distributed at the drain end as shown in FIG. 91. Referring to FIG. 91, the most high energy electrons generate near a point where the lateral electric field attains the highest value. However, the nearly maximum longitudinal electric field also generates at the point where the maximum lateral electric field generates. As the longitudinal electric field is larger, more electrons are forced to return toward the substrate, resulting in lowering of the probability that high energy electrons are injected into the floating gate electrode.

In the pocket structure described above, a majority of channel hot electrons generate at the drain end. As shown in FIG. 91, however, the drain end is a region at which the longitudinal electric field increases, and in other words, is a region at which a large force generates to return the injected electrons in the floating gate electrode toward the substrate. Therefore, the pocket structure cannot be considered as the structure which allows the generated hot electrons to be injected efficiently into the floating gate electrode.

FIG. 92B shows change in potential distribution along the vertical direction (line E–E' in FIG. 92A) with respect to the channel at the drain end shown in FIG. 92A. Under the condition that drain voltage Vd is smaller than gate voltage Vg, a potential difference at the insulating film 3 increases as the longitudinal electric field at the insulating film 3 increases. Therefore, increase of the longitudinal electric field at the insulating film 3 results in increase in height of the potential barrier of insulating film 3 over which electrons must move, as shown in FIG. 93. The electrons must have energies of a magnitude which allows them to move over at least the barrier of insulating film 3 in order to allow injection of electrons into the floating gate electrode. Therefore, as the longitudinal electric field at insulating film 3 (i.e., height of the barrier of insulating film 3) increases, a rate of electrons having energies allowing movement over the barrier of insulating film 3 decreases, provided that the generated electrons always have the same high energy. It can be considered from the foregoing that the arrival probability is restricted to a low value in the pocket structure in which both of lateral and longitudinal electric fields increase at the drain end.

As described above, the conventional pocket structure suffers from a problem that the longitudinal electric field is high at the point where the maximum lateral electric field generates and the most hot electrons are produced, so that the generated high energy electrons cannot be injected into the floating gate electrode with a high probability.

SUMMARY OF THE INVENTION

Accordingly, an object of the invention is to provide a nonvolatile semiconductor memory device and a method of manufacturing the same, in which an electric field along a gate electrode direction in a bulk is enhanced at a region where channel hot electrons generate so as to increase a probability with which high energy electrons after elastic collision have a moment along the gate electrode direction.

Another object of the invention is to provide a nonvolatile semiconductor memory device and a method of manufacturing the same, in which a longitudinal electric field is reduced at a point where a lateral electric field has a peak and the most hot electrons generate so as to increase a probability with which generated high energy electrons are injected into a floating gate electrode.

According to an aspect of the invention, a nonvolatile semiconductor memory device allowing electrical erasing and writing of data includes a semiconductor substrate of a first conductivity type, a charge accumulating electrode layer, a control electrode layer, a pair of source/drain regions of a second conductivity type, a first impurity region of the second conductivity type, and a second impurity region of the first conductivity type. The semiconductor substrate has a main surface. The charge accumulating electrode layer is formed on the main surface of the semiconductor substrate with a first insulating film therebetween. The control electrode layer is formed on the charge accumulating electrode layer with a second insulating film therebetween. The pair of source/drain regions are formed at the main surface of the semiconductor substrate and are located at opposite sides of a region of the semiconductor substrate located under the charge accumulating electrode layer. The drain region extends to a region of the semiconductor substrate located immediately under the charge accumulating electrode layer. The first impurity region is located to be in contact with the drain region, and to have an impurity concentration lower than that of the drain region at the main surface of the semiconductor substrate located immediately under the charge accumulating electrode layer. The second impurity region is formed being in contact with the first impurity region at the main surface of the semiconductor substrate located immediately under the charge accumulating electrode layer, and has an impurity concentration higher than that of the semiconductor substrate.

In the nonvolatile semiconductor memory device according to the above aspect of the invention, the first impurity region of the second conductivity type having the impurity concentration smaller than that of the drain region is arranged between the drain region and the second impurity region forming a pocket region. Therefore, a point where a lateral electric field of the first insulating film can be shifted to an interface between the first and second impurity regions. Accordingly, it is possible to reduce a longitudinal electric field at a point of the maximum lateral electric field, as compared with the prior art. This reduces a force returning electrons in the first insulating film toward the substrate, and also reduces a height of an insulating film barrier over which electrons are to move, so that it is possible to increase a probability of arrival of high energy electrons to the charge accumulating electrode (floating gate electrode), and thus a gate current can be increased.

According to the above structure, the gate current can be increased without considerably increasing the impurity concentration of the second impurity region forming the pocket region. Therefore, it is possible to suppress a leak current between the diffusion region and the substrate, which may increase due to increase of the impurity concentration of the second impurity region, and thus the write capability can be improved.

Further, in the above structure, the gate current is increased by improving the injection efficiency, so that the write capability can be improved without increasing an electric field to be applied. When consideration is made based on the write capability, this structure can be operated with a low applied voltage. Therefore, this structure can be advantageously employed in a low-voltage operation element and a single-power-supply element.

Preferably, the device of the above aspect further includes a third impurity region of the first conductivity type covering peripheries of the source region and the second impurity region while being in contact with the source region and the second impurity region, and having an impurity concentration higher than that of the semiconductor substrate and lower than that of the second impurity region.

Since the third impurity region of the first conductivity type having the impurity concentration higher than that of the semiconductor substrate is formed at the main surface of the semiconductor substrate located between the source region and the drain region, punch-through can be prevented. Therefore, a limit gate length determined in view of an off breakdown voltage can be suppressed at a low value. Thus, the structure is advantageous for fabrication of microscopic devices.

In addition to the third impurity region, the second impurity region having the impurity concentration higher than that of the third impurity region is formed at the main surface of the semiconductor substrate between the source and drain regions. This prevents the punch-through further effectively.

By appropriately selecting the impurity concentrations of the second and third impurity regions, a threshold voltage can be controlled while maintaining an intended limit gate length and an intended write capability.

Further, by appropriately selecting the impurity concentrations of the second and third impurity regions, the impurity concentration of the second impurity region forming the pocket region can be reduced while maintaining an intended write capability and an intended threshold voltage. Therefore, the write capability can be improved without increasing the leak current between the diffusion region and the substrate.

Preferably, the device of the above aspect further includes a third impurity region of the second conductivity type formed in the drain region and having an impurity concentration higher than that of the drain region.

Preferably, the device of the above aspect further includes a third impurity region of said second conductivity type formed in the source region and having an impurity concentration higher than that of the source region.

Preferably, the device of the above aspect further includes a third impurity region of the second conductivity type formed in the drain region and having an impurity concentration higher than that of the drain region, and a fourth impurity region of said second conductivity type formed in the source region and having an impurity concentration higher than that of the source region.

Since the third impurity region(s) having the impurity concentration higher than those of the drain region and/or source region are formed at the drain region and/or source region, a parasitic resistance(s) of the drain region and/or source region can be reduced. Therefore, the current drive capability is increased, and thus improvement of the write capability and increase of the read speed can be expected.

Preferably, in the above aspect, a depth of the second impurity region from the main surface of the semiconductor substrate is smaller than that of the first impurity region.

Since the second impurity region is shallower than the first impurity region, an area through which the first and second impurity regions are in contact with each other can be small. Therefore, a junction leak current between the diffusion region and the substrate can be small, so that the voltage can be raised to a predetermined value, and a boost capability can be improved. Since the junction leak current can be small, the leak current of each of memory cells connected to word lines can be small, so that a sum of the leak currents per block may be small. Therefore, increase in number of the transistors per block can be expected.

Preferably, in the above aspect, the second impurity region is formed to cover a periphery of the first impurity region while being in contact with the first impurity region.

Since the second impurity region having the impurity concentration higher than that of the semiconductor substrate covers the first impurity region of the opposite conductivity type, a current which may cause the punch through can be reduced. Therefore, the channel length can be reduced, and shrinkage of the device is allowed.

Preferably, in the above aspect, the second and first impurity regions have the substantially equal depths from the main surface of the semiconductor substrate.

Since the second and first impurity regions have the substantially equal depths, an area through which the second and first impurity regions are in contact with each other can be small, so that a junction leak current between the diffusion region and the substrate can be small. Further, a current caused by punch through can be reduced.

Preferably, in the above aspect, the device further includes a third impurity region covering a periphery of the source region while being in contact with the source region, extending to a region immediately under the charge accumulating electrode layer, and having an impurity concentration lower than that of the source region.

Since the third impurity region having the impurity concentration smaller than that of the source region covers the source region, this promote extension of a depletion layer at the source side during operation of the memory transistor, and thus the source breakdown voltage increases. For example, when erasing (removal of electrons from the charge accumulating electrode layer) is performed at the source side using an F-N tunneling current, a high voltage can be applied to the source. Preferably, in the above aspect, the second impurity region is formed to be in contact with the source region and the first impurity region only at a region of the semiconductor substrate located immediately under the charge accumulating electrode layer, and has an impurity concentration higher than that of the semiconductor substrate.

Since the second impurity region of the first conductivity type having the impurity concentration higher than that of the semiconductor substrate is arranged at the main surface of the semiconductor substrate between the source region and the drain region, punch though can be prevented. Therefore, a limit gate length determined in view of an off breakdown voltage can be suppressed at a low value. Thus, the structure is advantageous for fabrication of microscopic devices.

In the structure where the second impurity region is formed, for example, only at a region immediately under the charge accumulating electrode layer, capacitances of the source and drain regions as well as a capacitance of the second impurity region are low. Therefore, increase of the read speed can be expected.

Preferably, in the above aspect, a depth of the second impurity region from the main surface of the semiconductor substrate is smaller than that of the first impurity region.

Since the second impurity region is shallower than the source/drain regions, it is possible to suppress variation of the threshold voltage, which may be caused by variation of the substrate potential. Therefore, it is possible, for example, to suppress variation of an unfixed potential of a terminal in an open state.

According to further another aspect of the invention, a nonvolatile semiconductor memory device allowing electrical erasing and writing of data includes a semiconductor substrate of a first conductivity type, a charge accumulating electrode layer, a control electrode layer, a pair of source/drain regions of a second conductivity type, a first impurity region of the first conductivity type and a second impurity region of the first conductivity type. The semiconductor substrate has a main surface. The charge accumulating electrode layer is formed on the main surface of the semiconductor substrate with a first insulating film therebetween. The control electrode layer is formed on the charge accumulating electrode layer with a second insulating film therebetween. The pair of source/drain regions are formed at the main surface of the semiconductor substrate, and are located at opposite sides of a region of the semiconductor substrate under the charge accumulating electrode layer. The drain region extends to a region of the semiconductor substrate located immediately under the charge accumulating electrode layer, and contains impurity at a concentration of $1 \times 10^{20}$ cm$^{-3}$ or more. The first impurity region covers a periphery of the drain region while it is in contact with the drain region, and has an impurity concentration larger than that of the semiconductor substrate. The second impurity region is formed to be in contact with the source region and the first impurity region at a region of the semiconductor substrate located immediately under the charge accumulating electrode layer, and has an impurity concentration higher than that of the semiconductor substrate and lower than that of the first impurity region.

According to the nonvolatile semiconductor memory device of the above aspect of the invention, the drain region is covered with the first impurity region of the opposite conductivity type having the impurity concentration larger than that of the semiconductor substrate. Therefore, an electric field along the gate electrode direction in the bulk increases, so that an efficiency of injection of high energy electrons into the charge accumulating electrode layer is improved. Accordingly, the gate current increases, and the write capability can be improved without increasing a voltage to be applied. By this reason, the structure is advantageously employed in a low-voltage operating element and a single-power-supply element.

Since the second impurity region of the first conductivity type having the impurity concentration higher than that of the semiconductor substrate is arranged at the main surface of the semiconductor substrate between the source region and the drain region, punch though can be prevented. Therefore, a limit gate length determined in view of an off breakdown voltage can be suppressed at a low value. Thus, the structure is advantageous for fabrication of microscopic devices.

In addition to the second impurity region, the first impurity region having the impurity concentration higher than that of the second impurity region is arranged at the main surface of the semiconductor substrate between the source and drain regions. Therefore, the punch through can be prevented more effectively.

By appropriately selecting the impurity concentrations of the first and second impurity regions, a threshold voltage can be controlled while maintaining an intended limit gate length and an intended write capability.

Further, by appropriately selecting the impurity concentrations of the first and second impurity regions, the impurity concentration of the first impurity region can be reduced while maintaining an intended write capability and an intended threshold voltage. Therefore, the write capability can be improved without increasing the leak current between the diffusion region and the substrate.

Preferably, in the above aspect, a depth of the second impurity region from the main surface of the semiconductor substrate is smaller than those of the source/drain regions.

Since the second impurity region is shallower than the source/drain regions, it is possible to suppress variation of the threshold voltage, which may be caused by variation of the substrate potential. Therefore, it is possible, for example, to suppress variation of an unfixed potential of a terminal in an open state.

Further, according to an aspect of the invention, a method of manufacturing a nonvolatile semiconductor memory device allowing electrical erasing and writing of data includes the following steps:

First, a charge accumulating electrode layer is formed on a main surface of a semiconductor substrate of a first conductivity type with a first insulating layer therebetween, and a control electrode layer is formed on the charge accumulating electrode layer with a second insulating film therebetween. A pair of source/drain regions of a second conductivity type are formed at the main surface of the semiconductor substrate and are located at opposite sides of a region of the semiconductor substrate located immediately under the charge accumulating electrode layer. The drain region extends to a region of the semiconductor substrate located immediately under the charge accumulating electrode layer. A first impurity region of a second conductivity type having an impurity concentration lower than that of the drain region and being in contact with the drain region is formed at the main surface of the semiconductor substrate located immediately under the charge accumulating electrode layer. A second impurity region of the first conductivity type having an impurity concentration higher than that of the semiconductor substrate and being in contact with the first impurity region is formed at the main surface of the semiconductor substrate located immediately under the charge accumulating electrode layer.

According to the above aspect of the invention, the method of manufacturing the nonvolatile semiconductor memory device can provide the nonvolatile semiconductor memory device in which high energy electrons can be injected into the charge accumulating electrode layer with a high injection efficiency.

According to another aspect of the invention, a method of manufacturing a nonvolatile semiconductor memory device allowing electrical erasing and writing of data includes the following steps:

First, a charge accumulating electrode layer is formed on a main surface of a semiconductor substrate of a first conductivity type with a first insulating layer therebetween, and a control electrode layer is formed on the charge accumulating electrode layer with a second insulating film therebetween. A pair of source/drain regions of a second conductivity type are formed at the main surface of the semiconductor substrate and are located at opposite sides of a region of the semiconductor substrate located immediately under the charge accumulating electrode layer. The drain region extends to a region of the semiconductor substrate located immediately under the charge accumulating electrode layer. A first impurity region of the second conductivity type having an impurity concentration lower than that of the drain region and being in contact with the drain region is formed at the main surface of the semiconductor substrate located immediately under the charge accumulating electrode layer. A second impurity region of the first conductivity type having an impurity concentration higher than that of the semiconductor substrate and being in contact with the source region and the first impurity region is formed at a region of the semiconductor substrate located immediately under the charge accumulating electrode layer.

According to the above aspect of the invention, the method of manufacturing the nonvolatile semiconductor memory device can provide the nonvolatile semiconductor memory device in which high energy electrons can be injected into the charge accumulating electrode layer with a high injection efficiency.

According to still another aspect of the invention, a method of manufacturing a nonvolatile semiconductor memory device allowing electrical erasing and writing of data includes the following steps:

A charge accumulating electrode layer is formed on a main surface of a semiconductor substrate of a first conductivity type with a first insulating layer therebetween, and a control electrode layer is formed on the charge accumulating electrode layer with a second insulating film therebetween. A pair of source/drain regions of the second conductivity type are formed at the main surface of the semiconductor substrate and are located at opposite sides of a region of the semiconductor substrate located immediately under the charge accumulating electrode layer. The drain region extends to a region of the semiconductor substrate located immediately under the charge accumulating electrode layer, and has an impurity concentration of $1 \times 10^{20}$ $cm^{-3}$ or more. A first impurity region of the first conductivity type being in contact with the drain region, covering a periphery of the drain region and having an impurity concentration larger than that of the semiconductor substrate is formed. A second impurity region of the first conductivity type having an impurity concentration larger than that of the semiconductor substrate and smaller than that of the first impurity region and being in contact with the source region and the first impurity region is formed at a region of the semiconductor substrate located immediately under the charge accumulating electrode layer.

According to the above aspect of the invention, the method of manufacturing the nonvolatile semiconductor memory device can provide the nonvolatile semiconductor memory device in which high energy electrons can be injected into the charge accumulating electrode layer with a high injection efficiency.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the invention will be described below with reference to the drawings.

Embodiment 1

Figure 1:
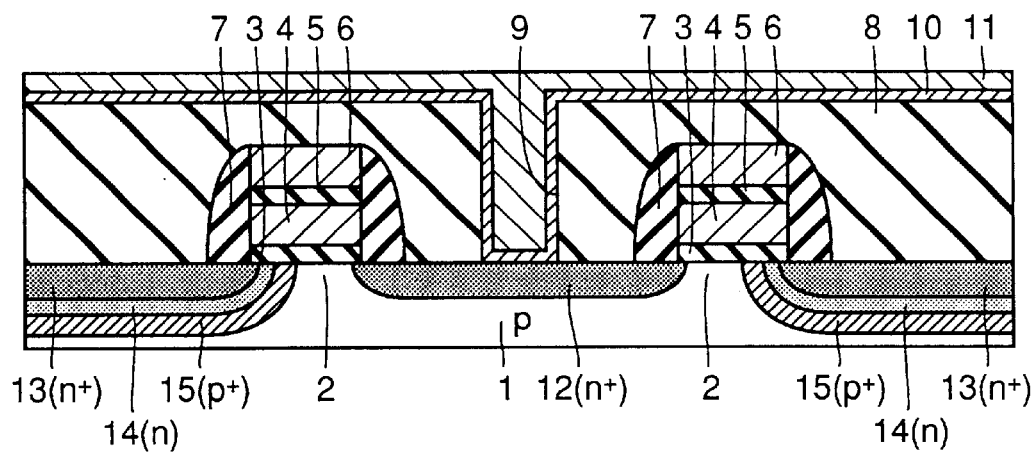
FIG. 1 is a cross section schematically showing a structure of a nonvolatile semiconductor memory device of an embodiment 1 of the invention.

Referring to FIG. 1, a memory transistor of a flash EEPROM includes an $n^+$ source diffusion region 12, $n^+$ drain diffusion regions 13, insulating films 3, floating gate electrodes 4, interlayer insulating films 5, and control gate electrodes 6. The $n^+$ source diffusion region 12 and $n^+$ drain diffusion region 13 are formed at a surface of a p-type silicon substrate 1 with a predetermined space between each other. Each floating gate electrode 4 is formed on a region between $n^+$ source diffusion region 12 and $n^+$ drain diffusion region 13 with insulating film 3 therebetween. Each control gate electrode layer 6 extends on floating gate electrode 4 with interlayer insulating layer 5 therebetween.

A side wall insulating layer 7 made of, e.g., a silicon oxide film, covers side surfaces of floating gate electrode 4 and control gate electrode 6.

The $n^+$ source diffusion region 12 and $n^+$ drain diffusion region 13 extend to regions in p-type silicon substrate 1 located immediately under the floating gate electrode 4. There are also formed n-type regions (HDD region) 14, each of which is in contact with and surrounds corresponding $n^+$ drain diffusion region 13. Each n-type region 14 is in contact with and surrounded by a $p^+$ pocket region 15. The n-type region 14 and $p^+$ pocket region 15 extend to regions in p-type silicon substrate 1 located immediately under the floating gate electrode 4.

A memory transistor 20 is covered with an interlayer insulating layer 8 formed on p-type silicon substrate 1. Interlayer insulating layer 8 is provided with a contact hole 9 reaching a surface portion of $n^+$ source diffusion region 12. A titanium alloy film 10 and an aluminum alloy interconnection layer 11 are formed in a layered form on interlayer insulating layer 8, and titanium alloy film 10 is in contact with $n^+$ source diffusion region 12 through contact hole 9.

Insulating film 3 is made of, e.g., a silicon oxide film, and has a thickness of about 100 Å. Floating gate electrode 4 is made of, e.g., doped polycrystalline silicon, and has a thickness of about 1000 Å. Interlayer insulating layer 5 is a composite film made of a silicon oxide film and a silicon nitride film, and has a whole thickness of about 200 Å. Control gate electrode 6 is made of, e.g., doped polycrystalline silicon, and has a thickness of about 2500 Å. Interlayer insulating layer 8 is formed of a layered structure made of, e.g., a PSG or BPSG film and a silicon oxide film not doped with impurity, and has a whole thickness of about 5000 to about 15000 Å. Contact hole 9 has an opening size, e.g., of about 0.6 to 1.5 μm. Titanium alloy film 10 has a thickness, e.g., of about 500 Å. Aluminum alloy interconnection layer 11 has a thickness, e.g., of about 10000 Å. Titanium alloy film 10 and aluminum alloy interconnection layer 11 form a bit line.

The impurity concentration of n-type impurity region 14 must be sufficiently higher than that of an LDD region used as an electric field relieving layer, and must be lower than that of $n^+$ drain diffusion region 13. The impurity concentration of $p^+$ pocket region 15 must be higher than that of p-type silicon substrate 1.

In this embodiment, $n^+$ source diffusion region 12 has the impurity concentration of $5\times10^{20}$ cm$^{-3}$, $n^+$ drain diffusion region 13 has the impurity concentration of $1\times10^{21}$ cm$^{-3}$, n-type region 14 has the impurity concentration of $1\times10^{20}$ cm$^{-3}$, and $p^+$ pocket region 15 has the impurity concentration of $1\times10^{19}$ cm$^{-3}$.

A method of manufacturing the nonvolatile semiconductor memory device of this embodiment will be described below.

Figure 2:
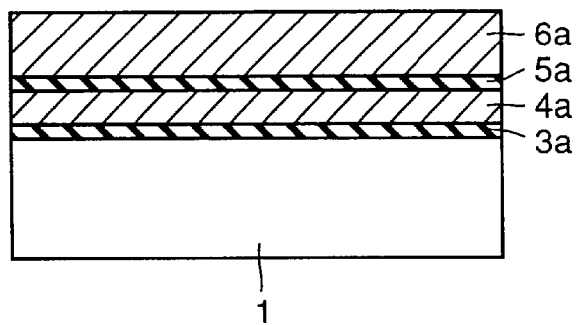
FIGS. 2 to 14 are schematic cross sections showing, in accordance with the order of steps, a method of manufacturing the nonvolatile semiconductor memory device of the embodiment 1 of the invention.

Referring to FIG. 2, a well region and an element isolating oxide film (not shown) are formed at predetermined regions in p-type silicon substrate 1, and then an insulating film 3a made of, e.g., a silicon oxide film having a thickness of about 100 Å is formed on the whole surface. Thereafter, a first doped polycrystalline silicon layer 4a of about 1000 Å in thickness is formed on insulating film 3a, and then is patterned into an intended configuration. An interlayer insulating layer 5a made of a composite film formed of, e.g., a silicon oxide film and a silicon nitride film and having a thickness of about 200 Å is formed on first doped polycrystalline silicon layer 4a. Then, a second doped polycrystalline silicon layer 6a of about 2500 Å in thickness is formed on interlayer insulating layer 5a.

Figure 3:
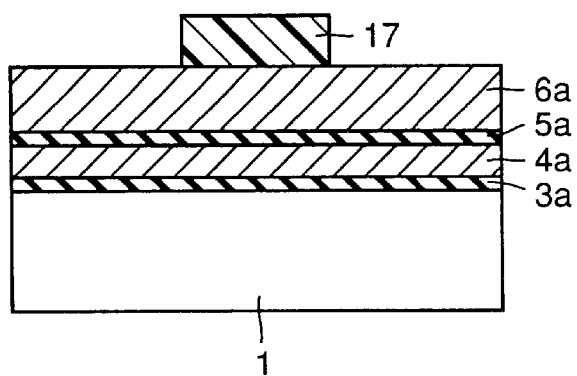

Referring to FIG. 3, a resist pattern 17 is formed at a predetermined region on second doped polycrystalline silicon layer 6a by photolithography. Using resist pattern 17 as a mask, anisotropic etching is effected to pattern second doped polycrystalline silicon layer 6a, interlayer insulating layer 5a, first doped polycrystalline silicon layer 4a and insulating film 3a.

Figure 4:
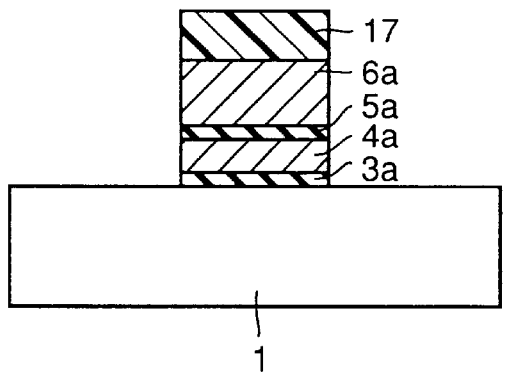

Referring to FIG. 4, the above patterning forms floating gate electrode 4 on p-type silicon substrate 1 with insulating film 3 therebetween, and also forms control gate electrode 6 on floating gate electrode 4 with interlayer insulating layer 5 therebetween. Then, resist pattern 17 is removed.

Figure 5:
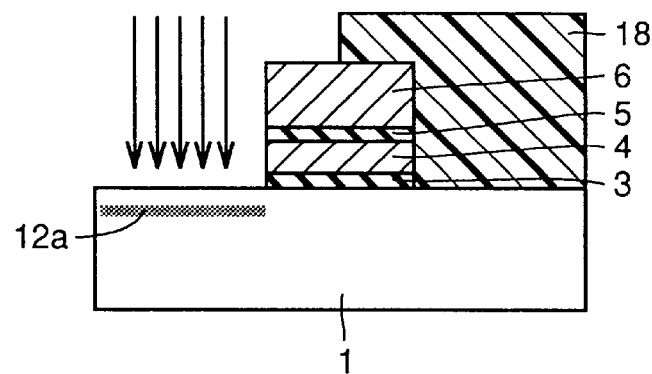

Referring to FIG. 5, a resist pattern 18 covering a drain formation region of the memory transistor is formed by conventional photolithography. Using resist pattern 18 and control gate electrode 6 as a mask, impurity such as arsenic (As) is ion-implanted into the main surface of p-type silicon substrate 1 under the conditions of about 35 keV and about $5\times10^{15}$ cm$^{-2}$. Thereby, a source region 12a is formed. Then, resist pattern 18 is removed.

Figure 6:
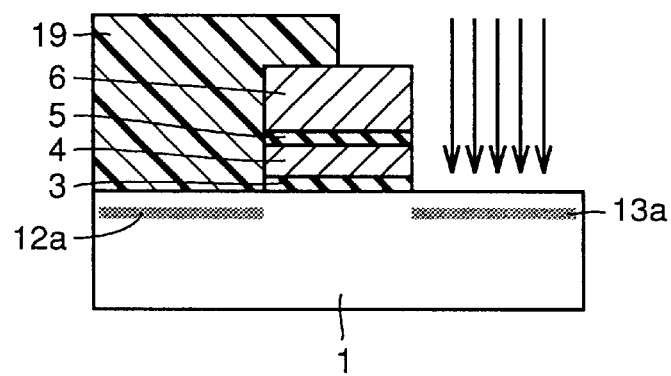

Referring to FIG. 6, a resist pattern 19 covering a source formation region of the memory transistor is formed by the conventional photolithography. Using resist pattern 19 and control gate electrode 6 as a mask, impurity such as arsenic (As) is ion-implanted into the main surface of p-type silicon substrate 1 under the conditions of about 35 keV and about $1\times10^{16}$ cm$^{-2}$. Thereby, a drain region 13a is formed.

Figure 7:
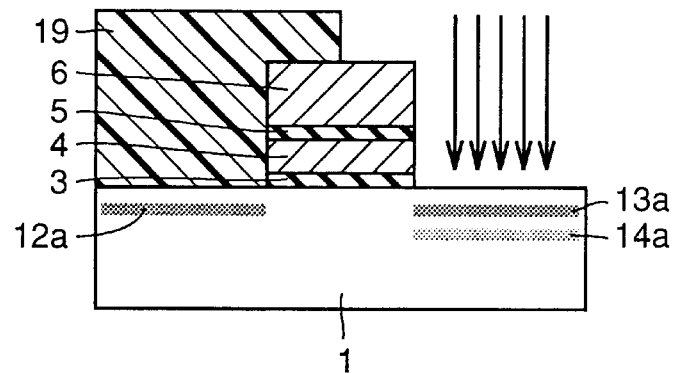

Referring to FIG. 7, using resist pattern 19 and control gate electrode 6 as a mask, impurity such as phosphorus (P) is ion-implanted under the conditions of about 50 keV and about $1\times10^{15}$ cm$^{-2}$. Thereby, an n-type region 14a is formed under drain region 13a.

Figure 8:
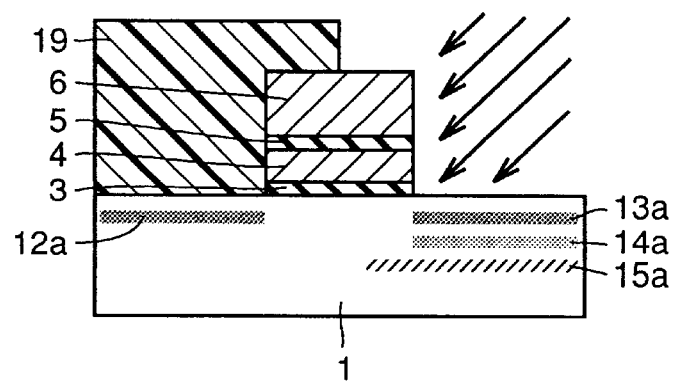

Referring to FIG. 8, using resist pattern 19 and control gate electrode 6 as a mask, impurity such as boron (B) is ion-implanted into the main surface of p-type silicon substrate 1 by a tilt-angle rotary implanting method under the conditions of about 35 keV and about $1\times10^{14}$ cm$^{-2}$. Thereby, a pocket region 15a is formed at a lower portion of n-type region 14a. Thereafter, resist pattern 19 is removed.

Figure 9:
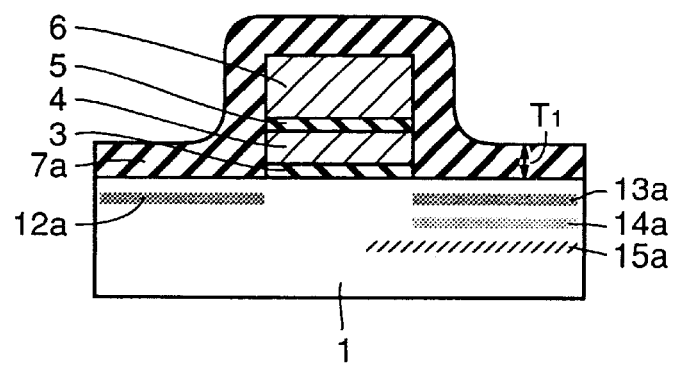

Referring to FIG. 9, a silicon oxide film 7a having a thickness, e.g., of 2000 Å is formed on the whole surface. Thereafter, anisotropic RIE (Reactive Ion Etching) is effected on silicon oxide film 7a.

Figure 10:
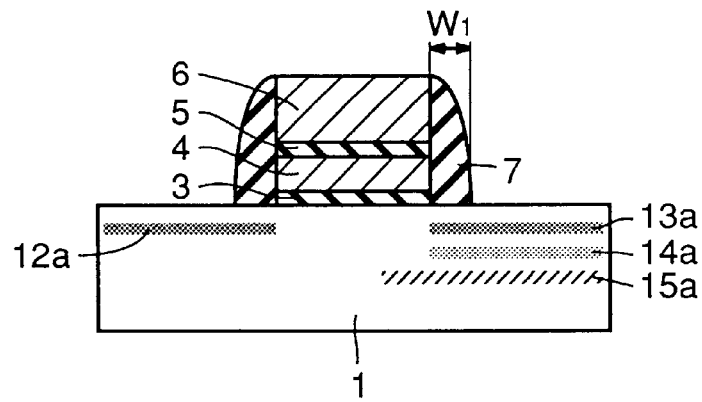

Referring to FIG. 10, this etching forms side wall insulating layer 7 made of, e.g., a silicon oxide film and covering the side surfaces of floating gate electrode 4 and control gate electrode 6. Side wall insulating layer 7 has a width or thickness $W_1$ of about 2000 Å. Thus, width $W_1$ of side wall insulating layer 7 is substantially equal to a thickness $T_1$ of silicon oxide film 7a (see FIG. 9). Accordingly, by controlling thickness $T_1$ of silicon oxide film 7a (see FIG. 9), width $W_1$ of side wall insulating layer 7 can be controlled easily.

Figure 11:
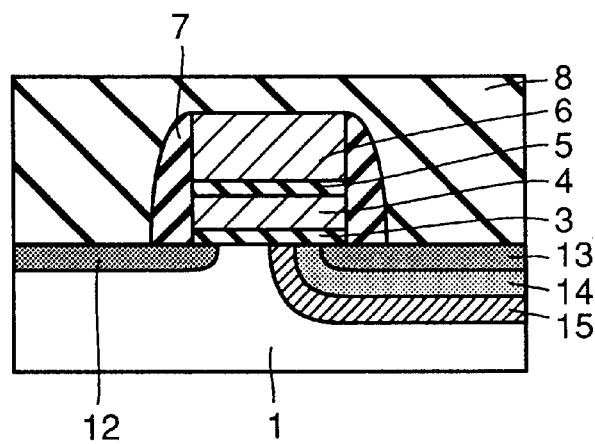

Referring to FIG. 11, a CVD (Chemical Vapor Deposition) or the like is executed to form interlayer insulating layer 8 having a thickness of about 5000 to about 15000 Å. Thereafter, a reflow method is executed to perform thermal treatment at a temperature of 700 to 1000° C. for flattening the surface thereof. Interlayer insulating layer 8 is formed of, e.g., a layered film made of a PSG or BPSG film and a silicon oxide film not doped with impurity. During this reflow, the source/drain regions and others are driven (diffused), so that n$^+$ source diffusion region 12, n$^+$ drain diffusion region 13, p$^+$ pocket region 15 and n-type region 14 are formed.

Figure 12:
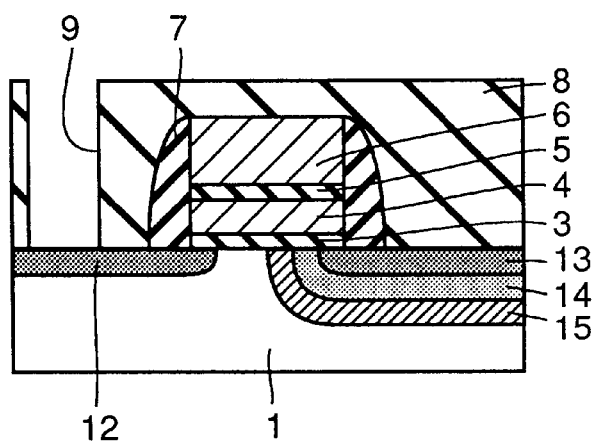

Referring to FIG. 12, contact hole 9 reaching n$^+$ source diffusion region 12 is formed at interlayer insulating layer 8 by conventional photolithography and etching techniques. Contact hole 9 has an opening size of about 0.6 to about 1.5 μm.

Figure 13:
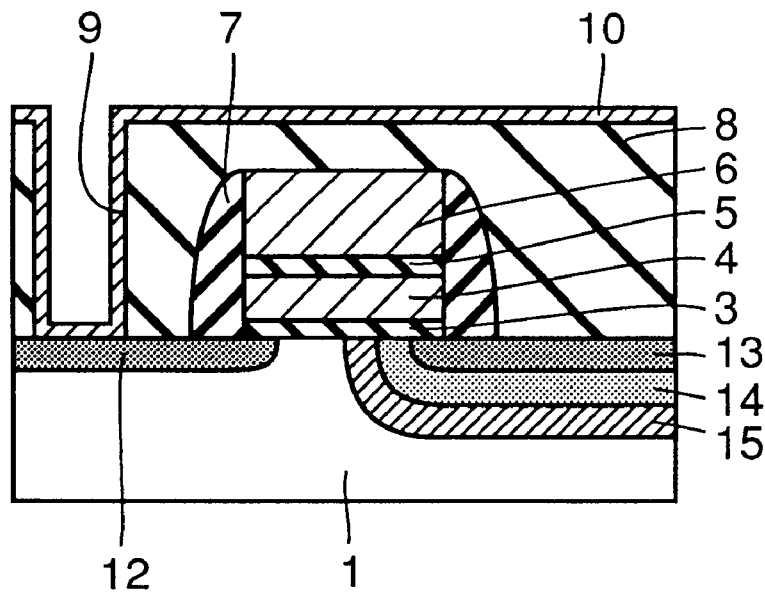

Referring to FIG. 13, a step is performed to form titanium alloy film 10, which is made of a TiN film, has a thickness of about 500 Å, extends on interlayer insulating layer 8 and has a portion electrically connected to n$^+$ source diffusion region 12 through contact hole 9.

Figure 14:
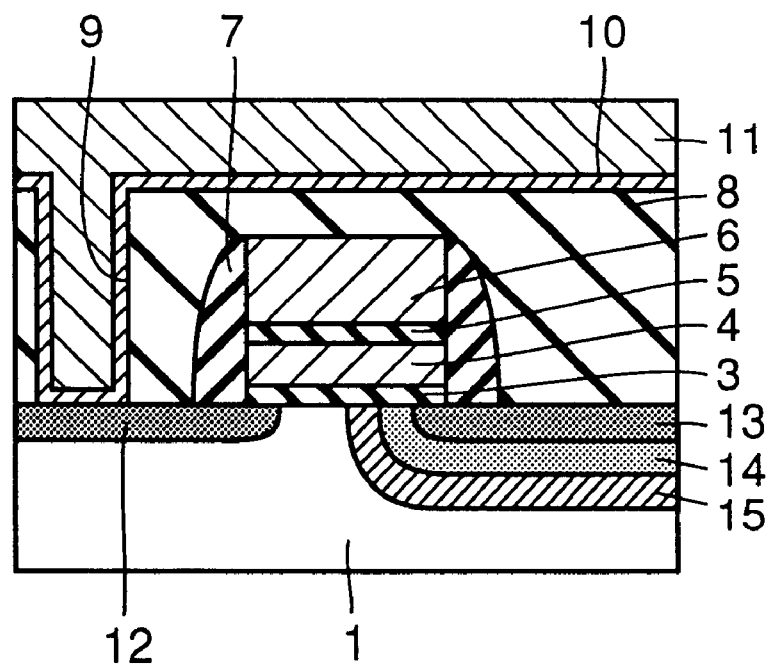

Referring to FIG. 14, a sputtering method or the like is executed to form aluminum alloy film 11 of about 10000 Å in thickness on titanium alloy film 10. Titanium alloy film 10 and aluminum alloy film 11 are patterned by photolithography and dry etching techniques. Thereby, titanium alloy film 10 and aluminum alloy film 11 form the bit line electrically connected to source diffusion region 12.

Figure 15:
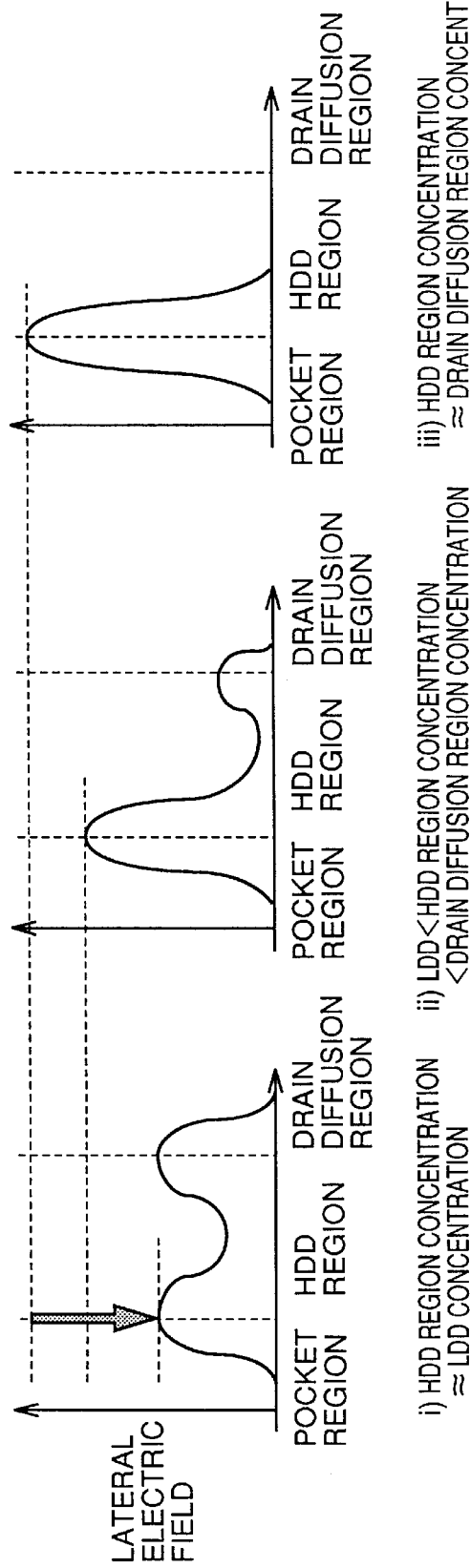
FIG. 15 is a graph showing change of a lateral electric field of an insulating film in accordance with change of an impurity concentration of an n-type region.

The nonvolatile semiconductor memory device of this embodiment is provided with n-type region 14, which is in contact with n$^+$ drain diffusion region 13 and surrounds n$^+$ drain diffusion region 13. FIG. 15 shows change in a lateral electric field in accordance with change in the impurity concentration of n-type region 14. Referring to FIG. 15, when the impurity concentration of n-type region is equal to that of a conventional LDD region, a lateral electric field generated between n-type region 14 (which is shown as the HDD region here) and p$^+$ pocket region 15 is substantially equal in intensity to the lateral electric field between HDD region 14 and n$^+$ drain diffusion region 13.

When the impurity concentration of HDD region 14 is higher than that of the LDD structure, the lateral electric field at a junction between HDD region 14 and p$^+$ pocket region 15 is higher than the lateral electric field generated at the junction between HDD region 14 and n$^+$ drain diffusion region 13.

Figure 16:
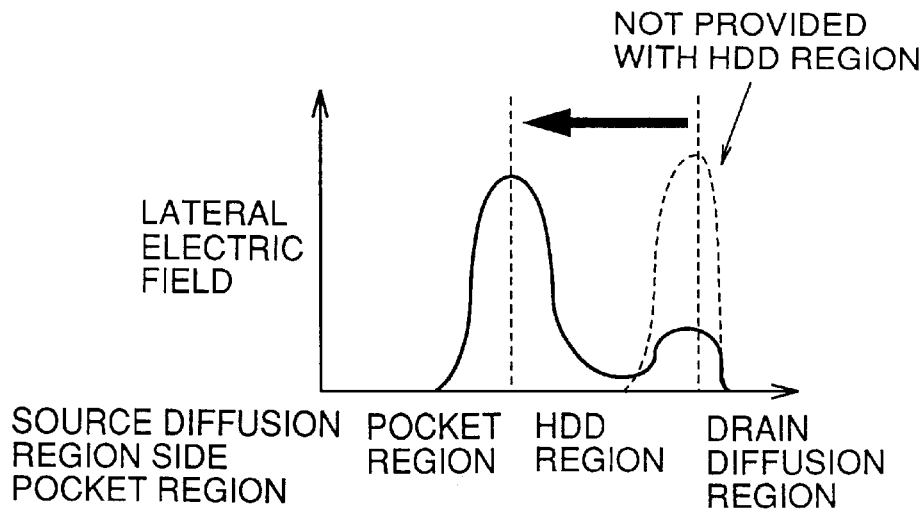
FIG. 16 shows change of a lateral electric field of an insulating film in structures provided with the n-type region and not provided with the same.

Owing to provision of HDD region (n-type region) 14 in this manner, a point where the lateral electric field of insulating film 3 attains the maximum intensity can be shifted toward the source diffusion region compared with the case where the HDD region (n-type region) is not provided as shown in FIG. 16.

The following simulation was performed with respect to change in the lateral and longitudinal electric fields of insulating film 3 in the structure provided with n-type region 14.

Figure 17:
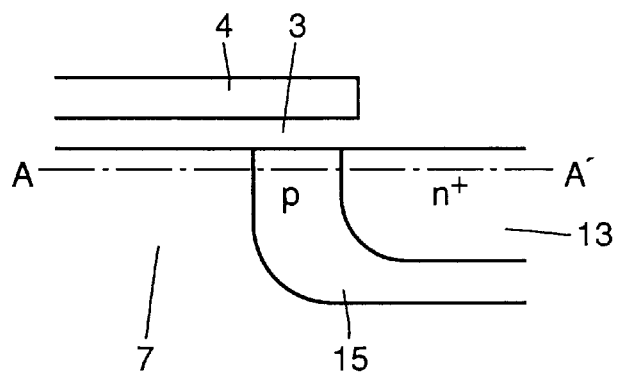
FIG. 17 is a fragmentary cross section of a conventional structure for showing a structure of a specimen used in simulation.
Figure 18:
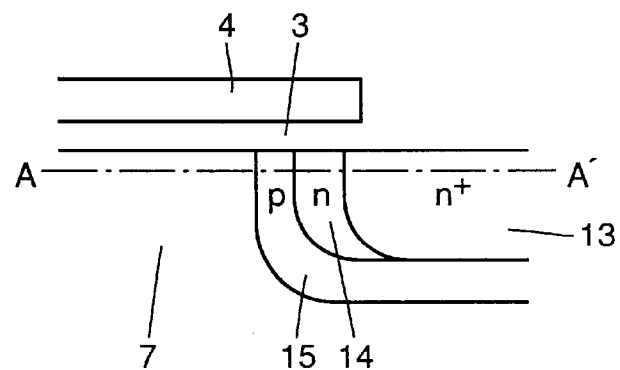
FIG. 18 is a fragmentary cross section of a structure of the invention for showing a structure of a specimen used in simulation.

As shown in FIGS. 17 and 18, specimens were prepared for the structure not provided with the n-type region (conventional example) and the structure provided with the same (embodiment of the invention).

The specimen of the conventional example shown in FIG. 17 was prepared in the following manner. After forming gate 4, arsenic (As) is implanted into substrate 1 under the conditions of 35 keV and $5\times10^{14}$ cm$^{-2}$ to form n$^+$ drain diffusion region 13, and boron (B) is ion-implanted by the tilt-angle rotary ion implantation with an angle of 45° with respect to the surface of substrate 1 under the conditions of 50 keV and $3\times10^3$ cm$^{-2}$, so that p-type pocket region 15 is formed.

Meanwhile, the specimen of the example of the invention was prepared as follows. After forming gate 4, arsenic (As) is implanted into substrate 1 under the conditions of 35 keV and $5\times10^{14}$ cm$^{-2}$ to form n$^+$ drain diffusion region 13, and phosphorus (P) is ion-implanted under the conditions of 35 keV and $1\times10^{14}$ cm$^{-2}$ to form n-type region 14. Further, boron (B) is ion-implanted by the tilt-angle rotary ion implantation with an angle of 45° with respect to the surface of substrate 1 under the conditions of 50 keV and $3\times10^{13}$ cm$^{-2}$, so that p-type pocket region 15 is formed.

Figure 19:
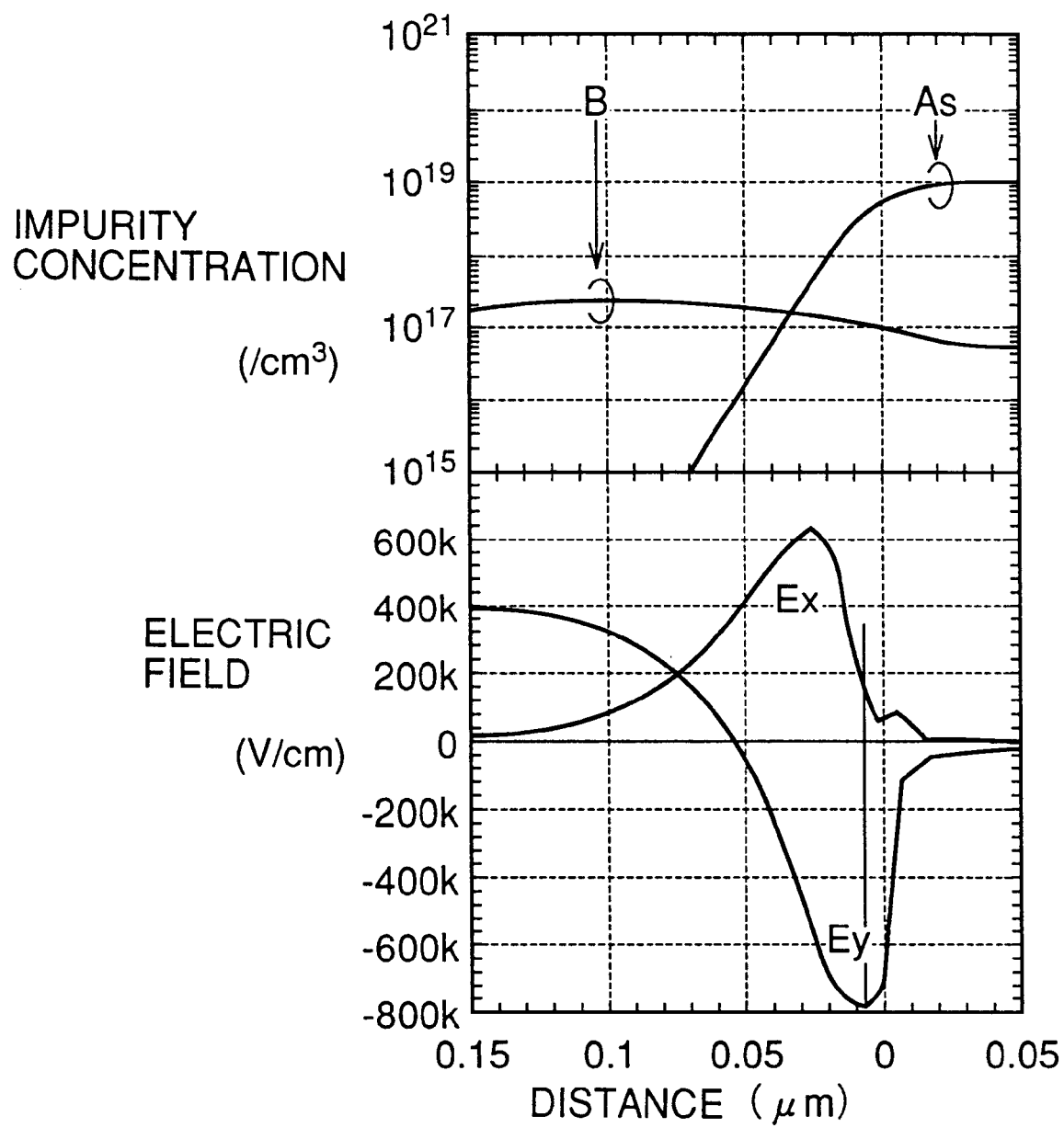
FIG. 19 is a graph showing an impurity concentration at various positions on line A–A' in FIG. 17 and an electric field of an insulating film corresponding to these positions.
Figure 20:
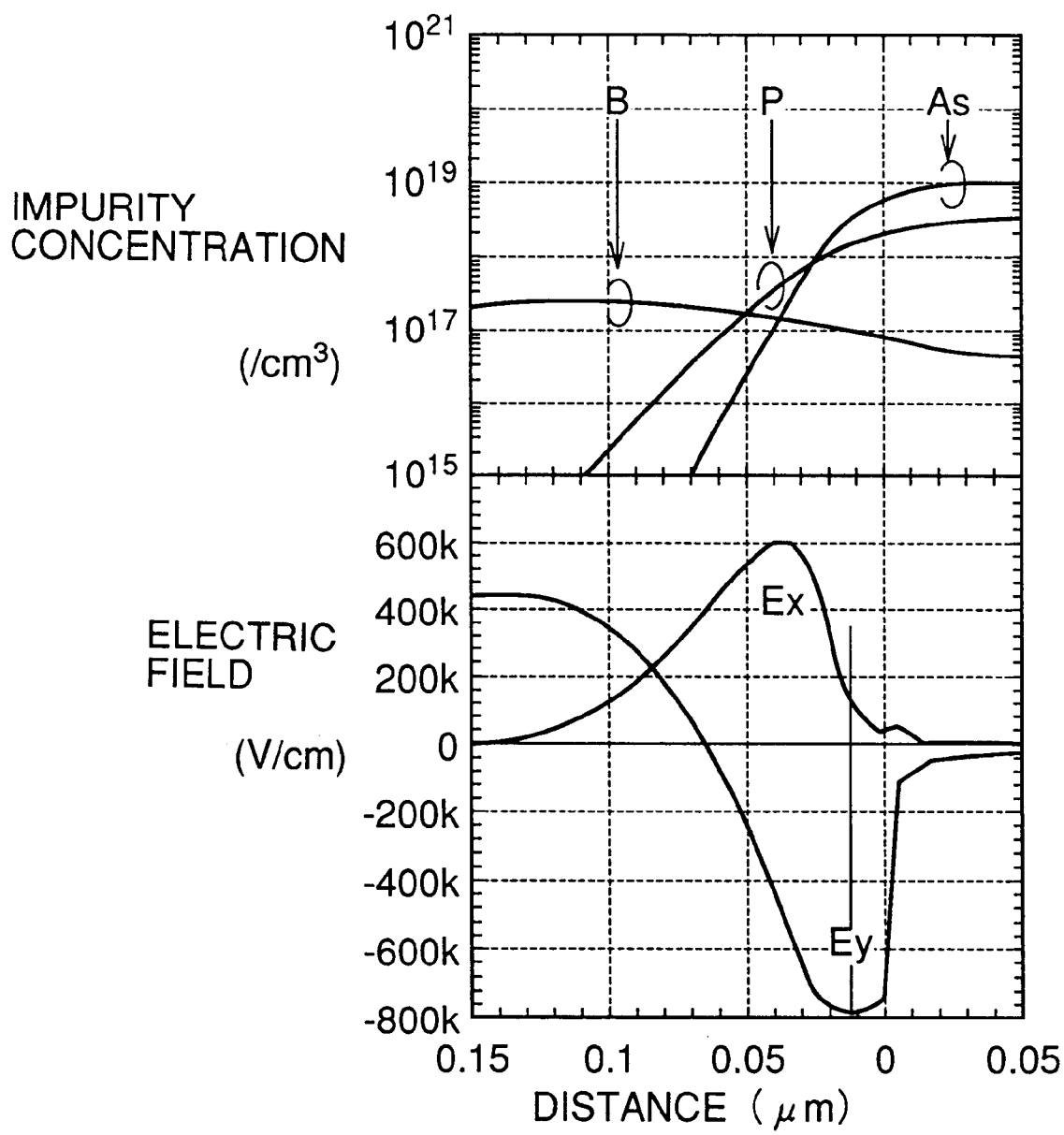
FIG. 20 is a graph showing an impurity concentration at various positions on line A–A' in FIG. 18 and an electric field of the insulating film corresponding to these positions.

FIG. 19 shows a graph representing the impurity concentration at various positions along line A–A' in the substrate of the conventional example shown in FIG. 17 as well as a graph representing the longitudinal and lateral electric fields of the gate insulating film corresponding to these positions. FIG. 20 shows a graph representing the impurity concentration at various positions along line A–A' in the substrate of the example of the invention shown in FIG. 18 as well as a graph representing the longitudinal and lateral electric fields of the gate insulating film corresponding to these positions.

Figure 21:
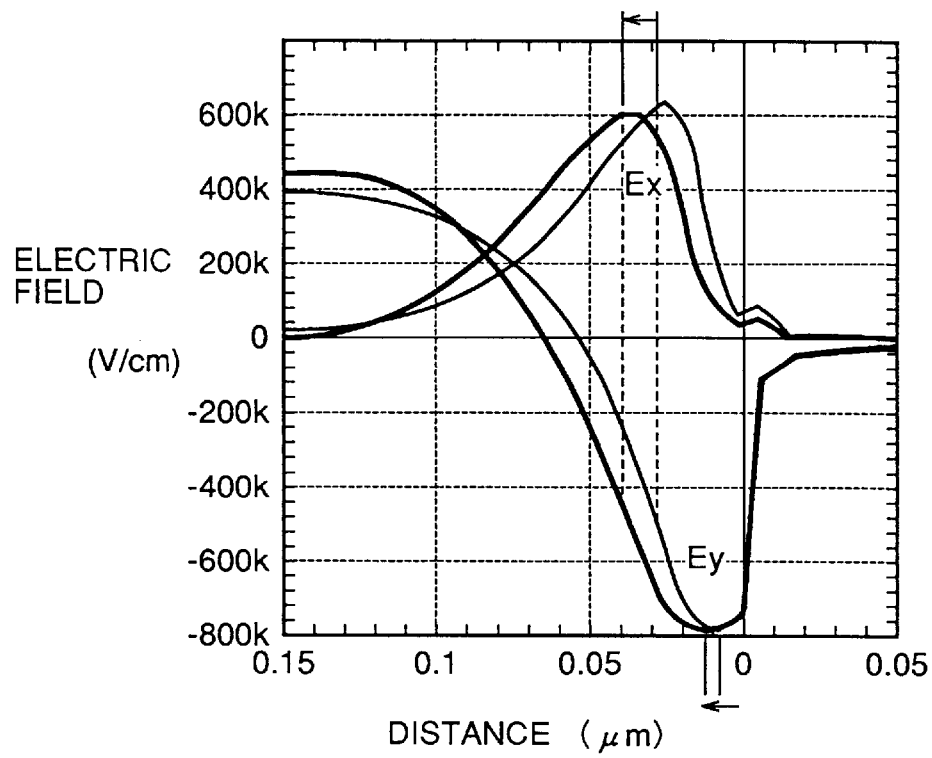
FIG. 21 is a graph showing an electric fields at various positions of specimens of the prior art and the embodiment of the invention.

FIG. 21 shows graphs of FIGS. 19 and 20 in an overlapped manner.

Referring particularly to FIG. 21, thick curves represent change in the lateral and longitudinal electric fields of the specimen of the inventional example, and thin curves represent change in the lateral and longitudinal electric fields of the conventional example. It can be understood also from FIG. 21 that provision of the n-type region as employed in the inventional example shown in FIG. 18 shifts the point of the maximum lateral electric field of insulating film 3 toward the source diffusion region. Owing to the shift of the point of the maximum lateral electric field toward the source diffusion region, an absolute value of the lateral electric field at the point of the maximum lateral electric field in the specimen of the inventional example is smaller than that of the conventional example.

Figure 22:
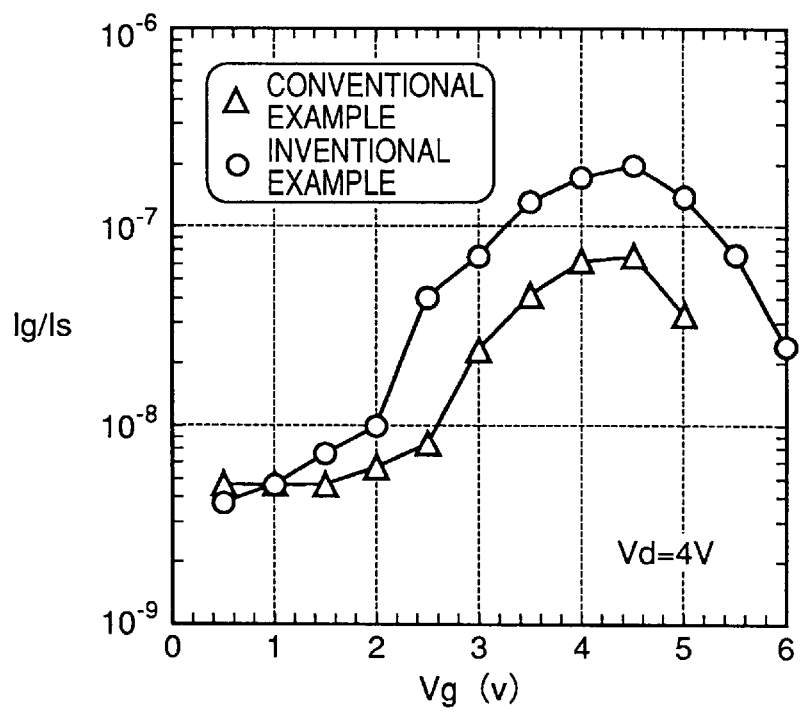
FIG. 22 is a graph showing relationships between a gate voltage and an injection efficiency of the prior art and the embodiment of the invention.

For the respective specimens shown in FIGS. 17 and 18, injection efficiencies (Ig/Is) were calculated with various values of gate voltage Vg. The result is shown in FIG. 22. Referring to FIG. 22, it can be seen that the injection efficiency (Ig/Is) of the structure of the inventional example (○), which is indicated by circular marks, is considerably advantageous compared with the structure of the conventional example (△) indicated by triangular marks.

From the above result of simulation, provision of n-type region 14 shown in FIG. 1 can shift the point of the maximum lateral electric field of insulating film 3, so that the longitudinal electric field can be reduced at the point of the maximum lateral electric field. This reduces the force returning electrons in insulating film 3 toward silicon substrate 1, and reduces the height of the barrier of insulating film 3 over which electrons are to be moved. Accordingly, the probability with which high energy electrons arrive at floating gate electrode 4 increases, and the gate current increases.

Figure 23:
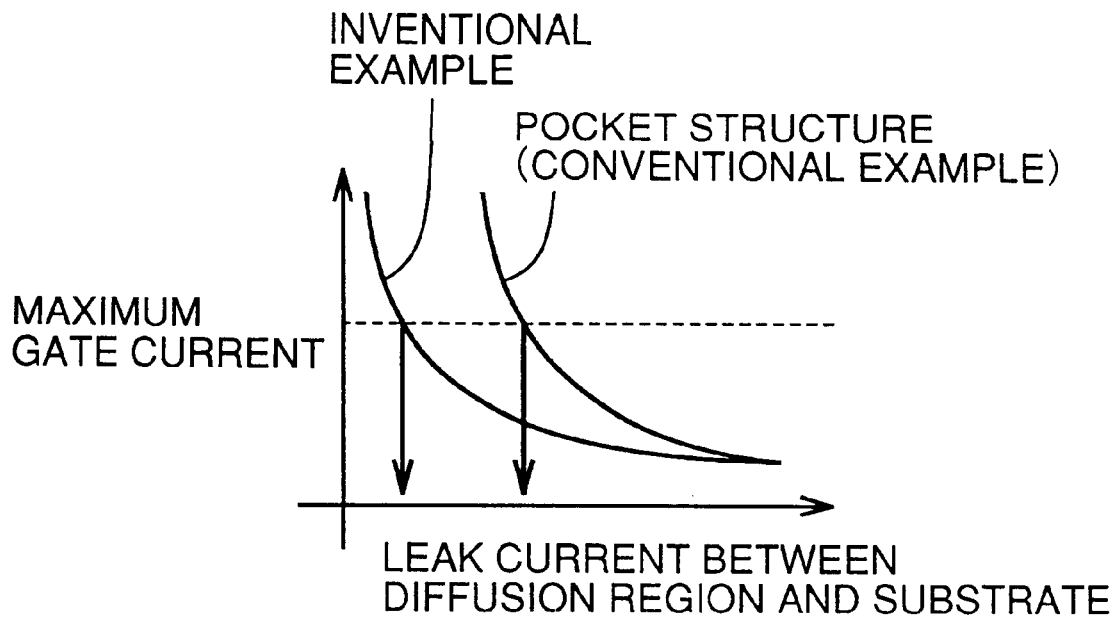
FIG. 23 is a graph showing relationships between a leak current and a maximum gate current of the prior art and the embodiment of the invention.

In the embodiment shown in FIG. 1, the gate current can be increased without increasing the impurity concentration of p$^+$ pocket region 15, owing to provision of n-type region 14. Therefore, as shown in FIG. 23, it is possible to suppress the leak current between the diffusion region and the substrate, and can improve the write efficiency.

In this structure, since the gate current is increased by improvement of the injection efficiency, the write capability can be improved without increasing the applied voltage. Meanwhile, when consideration is made based on the write capability, this structure can be operated with a low applied voltage. Therefore, it can be understood that this structure is advantageous to low-voltage operating elements and single-power-supply elements.

The structure shown in FIG. 1 will be compared with a memory transistor having a conventional LDD structure disclosed in Y. Ohshima et al., "PROCESS AND DEVICE TECHNOLOGIES FOR 16 Mbit EPROMs WITH LARGE-TILT-ANGLE IMPLANTED P-POCKET CELL", IEDM 90, pp. 95–98.

Figure 24:
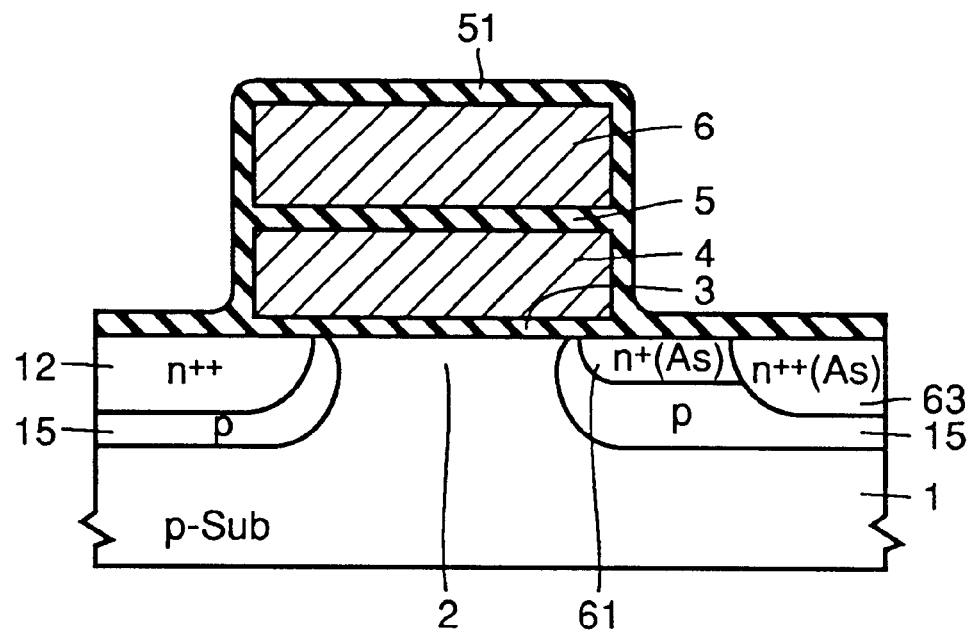
FIG. 24 is a schematic cross section showing a conventional LDD structure disclosed in a prior art reference.

FIG. 24 is a schematic cross section showing a structure of a memory transistor disclosed in the above reference. Referring to FIG. 24, p-type silicon substrate 1 is provided at its surface with an n$^{++}$ source diffusion region 12 as well as n-type drain regions 61 and 63 spaced from n$^{++}$ source region 12 by a predetermined distance. Floating gate electrode 4 is formed on a region between n$^{++}$ source diffusion region 12 and n-type drain regions 61 and 63 with insulating film 3 therebetween, and control gate electrode 6 is formed on floating gate electrode 4 with interlayer insulating layer 5 therebetween. There are formed p-type pocket regions 15, each of which is in contact with and surrounds n$^{++}$ source diffusion region 12 or n-type drain regions 61 and 63. The whole surface is covered with an insulating layer 51.

In this structure, the drain region has the conventional LDD structure formed of n$^+$ region 61 and n$^{++}$ region 63. In this conventional LDD structure, n$^{++}$ region 63 does not extend to the region immediately under the floating gate electrode 4. Therefore, high energy electrons generated at the vicinity of the drain end are suppressed from being injected into the floating gate electrode 4 to some extent.

Meanwhile, in the embodiment of the invention shown in FIG. 1, not only n-type region 14 but also n$^+$ drain diffusion region 13 extend to a region immediately under floating gate electrode 4. Therefore, high energy electrons generated near the drain end are efficiently injected into floating gate electrode 4.

The conventional LDD structures are disclosed also in Japanese Patent Laying-Open Nos. 2-129968 (1990), 6-177399 (1994), 2-372 (1990) and 3-72682 (1991).

Embodiment 2

Figure 25:
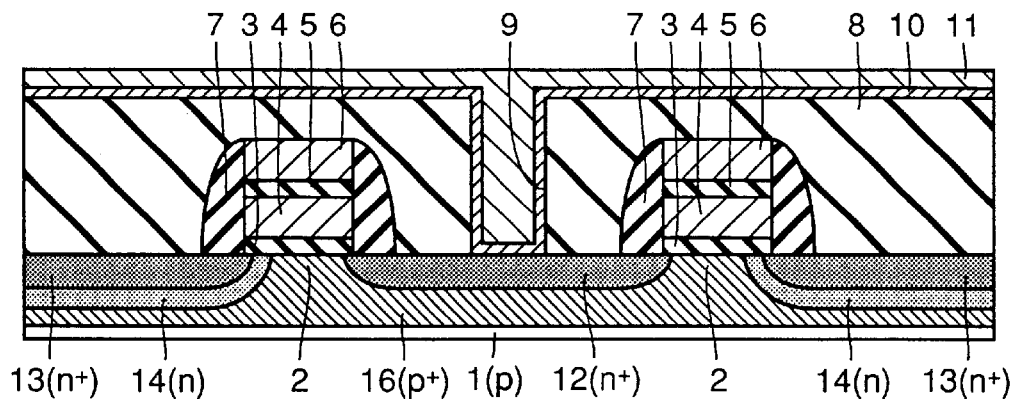
FIG. 25 is a cross section schematically showing a structure of a nonvolatile semiconductor memory device of an embodiment 2 of the invention.

Referring to FIG. 25, a structure of this embodiment differs from the structure of the embodiment 1 shown in FIG. 1 in that it does not include p$^+$ pocket region 15, and includes only a p-type impurity region 16. The p-type impurity region 16 covers not only the periphery of n-type region 14 but also channel region 2 and n$^+$ source diffusion region 12. The impurity concentration of p-type impurity region 16 is, for example, $5\times10^{18}$ cm$^{-3}$.

Since structures other than the above are substantially the same as those of the embodiment 1, the same or similar portions and members bear the same reference characters and will not be described below.

A method of manufacturing the nonvolatile semiconductor memory device of this embodiment will be described below.

Figure 26:
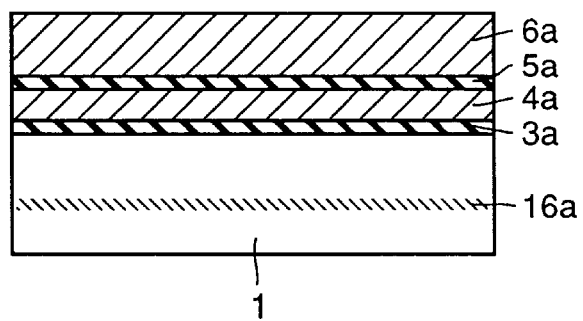
FIGS. 26 to 30 are schematic cross sections showing, in accordance with the order of steps, a method of manufacturing the nonvolatile semiconductor memory device of the embodiment 2 of the invention.

Referring first to FIG. 26, the well region and element isolating oxide film (not shown) are formed at predetermined regions of p-type silicon substrate 1. Boron (B) is ion-implanted into the main surface of p-type silicon sub-strate 1 under the conditions of about 50 keV and about $5\times10^{13}$ cm$^{-2}$. Thereby, channel dope region 16a is formed at a predetermined depth in p-type silicon substrate 1.

Then, insulating film 3a made of, e.g., a silicon oxide film and having a thickness of about 100 Å is formed on the whole surface. First doped polycrystalline silicon layer 4a of about 1000 Å in thickness is formed on insulating film 3a. Interlayer insulating layer 5a of about 200 Å in thickness made of, e.g., a silicon oxide film and a silicon nitride film is formed on first doped polycrystalline silicon layer 4a. Then, second doped polycrystalline silicon layer 5a of, e.g., 2500 Å in thickness is formed on interlayer insulating layer 4a.

Thereafter, steps similar to those of the embodiment 1 shown in FIGS. 3 and 4 are performed for manufacturing the structure of this embodiment.

Figure 27:
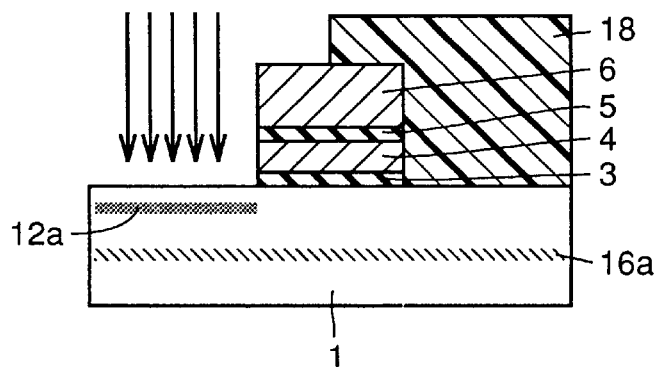

Referring to FIG. 27, resist pattern 18 is formed over the drain formation region of the memory transistor by the conventional photolithography. Using resist pattern 18 and control gate electrode 6 as a mask, arsenic (As) is ion-implanted into the main surface of p-type silicon substrate 1 under the conditions of about 35 keV and about $5\times10^{15}$ cm$^{-2}$. Thereby, source region 12a is formed at p-type silicon substrate 1. Thereafter, resist pattern 18 is removed.

Figure 28:
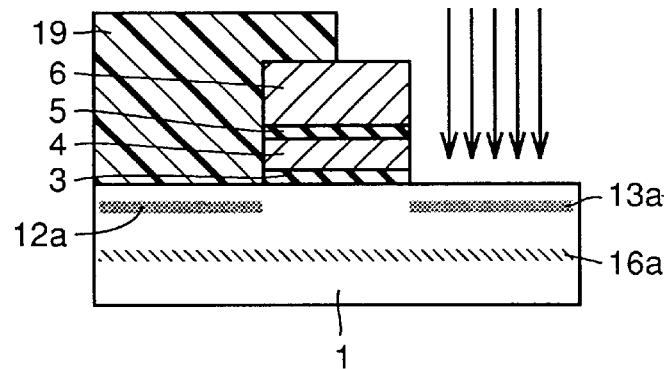

Referring to FIG. 28, resist pattern 19 is formed over the source formation region of the memory transistor by the conventional photolithography. Using resist pattern 19 and control gate electrode 6 as a mask, arsenic (As) is ion-implanted into the main surface of p-type silicon substrate 1 under the conditions of about 35 keV and about $1\times10^{16}$ cm$^{-2}$. Thereby, drain region 13a is formed above channel dope region 16a in p-type silicon substrate 1.

Figure 29:
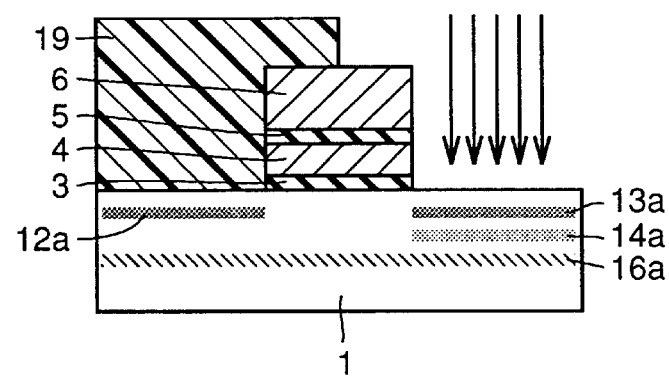

Referring to FIG. 29, using resist pattern 19 and control gate electrode 6 as a mask, phosphorus (P) is ion-implanted into the main surface of p-type silicon substrate 1 under the conditions of about 35 keV and about $5\times10^{15}$ cm$^{-2}$. Thereby, n-type region 14a is formed between channel dope region 16a and drain region 13a.

Figure 30:
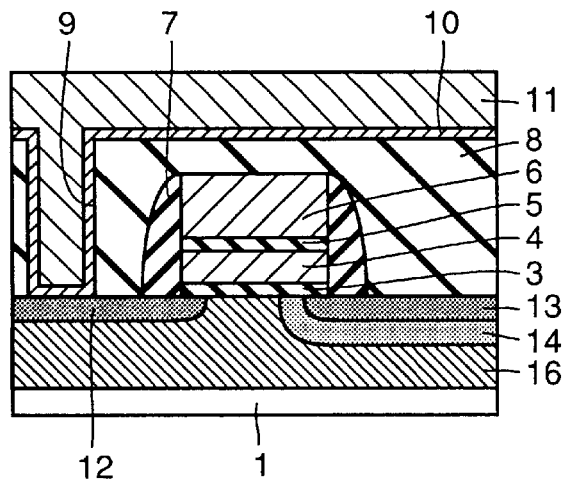

Thereafter, the nonvolatile semiconductor memory device shown in FIG. 30 is completed through steps similar to those of the embodiment 1 shown in FIGS. 8 to 14.

The nonvolatile semiconductor memory device of this embodiment is provided with n-type region 14 covering n$^+$ drain diffusion region 13 similarly to the embodiment 1. Therefore, high energy electrons can be injected into floating gate electrode 4 with a high efficiency, and thus the gate current can be increased. Also, the leak current between the diffusion region and the substrate can be suppressed. Further, the structure is advantageous to low-voltage operating elements and single-power-supply elements, similarly to the embodiment 1.

In addition to the above, p+ impurity region 16 covers not only n-type region 14 but also channel region 2 and n+ source diffusion region 12. Therefore, punch through is suppressed, and a limit gate length determined based on the off breakdown voltage can be short. Thus, the structure of this embodiment is advantageous to microscopic device fabrication.

Embodiment 3

Figure 31:
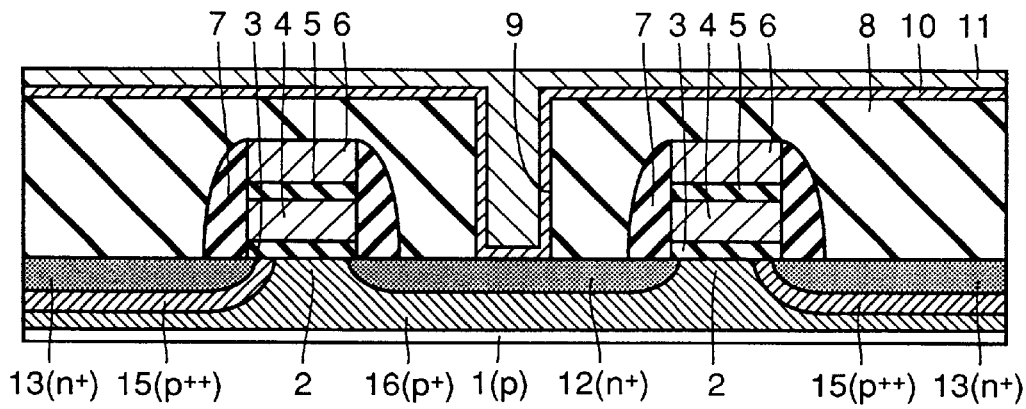
FIG. 31 is a cross section schematically showing a structure of a nonvolatile semiconductor memory device of an embodiment 3 of the invention.

Referring to FIG. 31, a structure of this embodiment differs from that of the embodiment 1 shown in FIG. 1 in that it does not include n-type region 14 and includes p-type impurity region 16. Since n-type region 14 is not employed, p++ pocket region 15 is in contact with n+ drain diffusion region 13, and surrounds the periphery thereof. The p+ impurity region 16 is in contact with and surrounds p+ pocket region 15, and covers channel region 2 and n+ source diffusion region 12.

The p+ impurity region 16 has an impurity concentration, which is higher than that of p-type silicon substrate 1 and is lower than that of p++ pocket region 15.

The n+ drain diffusion region 13 and n+ source diffusion region 12 have impurity concentrations of $1 \times 10^{20}$ cm$^{-3}$ or more.

Since structures other than the above are substantially the same as those of the embodiment 1, the same or similar portions and members bear the same reference characters and will not be described below.

A method of manufacturing the nonvolatile semiconductor memory device of this embodiment will be described below.

Figure 32:
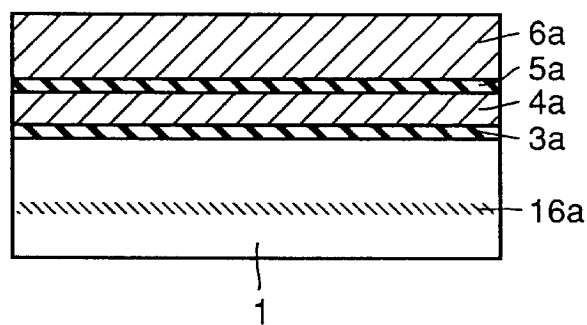
FIGS. 32 to 36 are schematic cross sections showing, in accordance with the order of steps, a method of manufacturing the nonvolatile semiconductor memory device of the embodiment 3 of the invention.

Referring first to FIG. 32, the well region and element isolating oxide film (not shown) are formed at predetermined regions of p-type silicon substrate 1. Boron (B) is ion-implanted into the main surface of p-type silicon substrate 1 under the conditions of about 50 keV and about $5 \times 10^{13}$ cm$^{-2}$. Thereby, a channel dope region 16a is formed at a predetermined depth in p-type silicon substrate 1. Then, an insulating film 3a made of, e.g., a silicon oxide film and having a thickness of about 100 Å is formed on the whole surface. First doped polycrystalline silicon layer 4a of about 1000 Å in thickness is formed on insulating film 3a. Interlayer insulating layer 5a of about 200 Å in thickness made of, e.g., a composite film formed of a silicon oxide film and a silicon nitride film is formed on first doped polycrystalline silicon layer 4a. Then, second doped polycrystalline silicon layer 5a of, e.g., 2500 Å in thickness is formed on interlayer insulating layer 4a.

Thereafter, steps similar to those of the embodiment 1 shown in FIGS. 3 and 4 are performed for manufacturing the structure of this embodiment.

Figure 33:
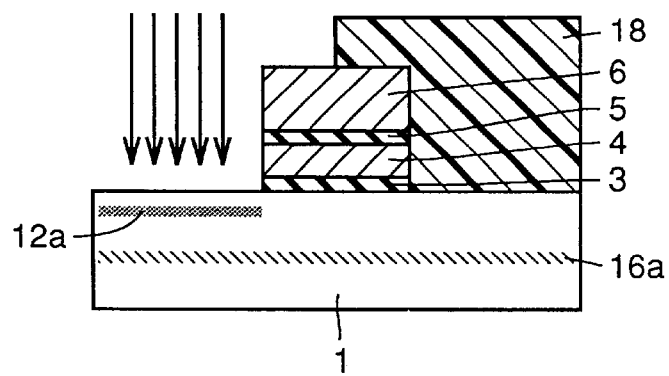

Referring to FIG. 33, resist pattern 18 is formed over the drain formation region of the memory transistor by the conventional photolithography. Using resist pattern 18 and control gate electrode 6 as a mask, arsenic (As) is ion-implanted into the main surface of p-type silicon substrate 1 under the conditions of about 35 keV and about $5 \times 10^{15}$ cm$^{-2}$. Thereby, source diffusion region 12a is formed. Thereafter, resist pattern 18 is removed.

Figure 34:
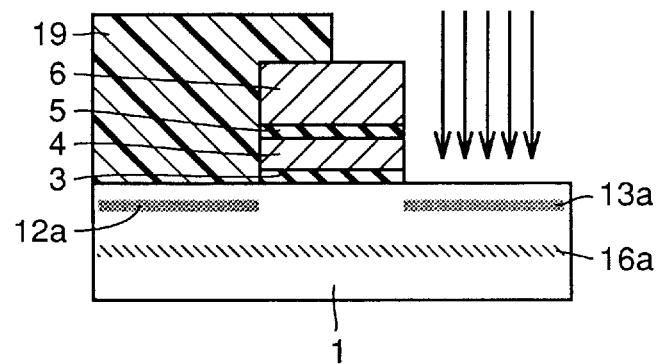

Referring to FIG. 34, resist pattern 19 is formed over the source formation region of the memory transistor by the conventional photolithography. Using resist pattern 19 and control gate electrode 6 as a mask, arsenic (As) is ion-implanted into the main surface of p-type silicon substrate 1 under the conditions of about 35 keV and about $1 \times 10^{16}$ cm$^{-2}$. Thereby, drain region 13a is formed above channel dope region 16a in p-type silicon substrate 1.

Figure 35:
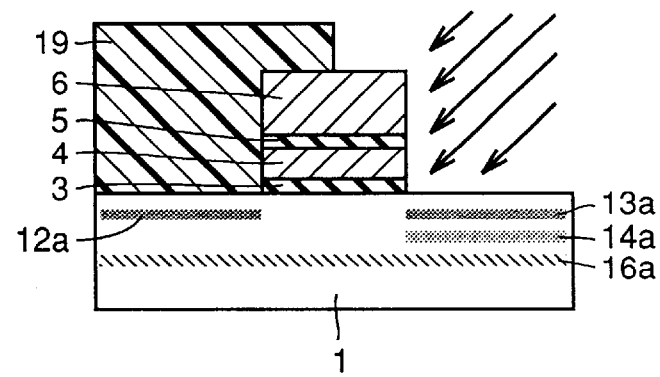

Referring to FIG. 35, using resist pattern 19 and control gate electrode 6 as a mask, boron (B) is ion-implanted by tilt-angle rotary implantation with an angle of 45° into the main surface of p-type silicon substrate 1 under the conditions of about 35 keV and about $5 \times 10^{13}$ cm$^{-2}$. Thereby, p-type pocket region 15a is formed between channel dope region 16a and drain region 13a.

Figure 36:
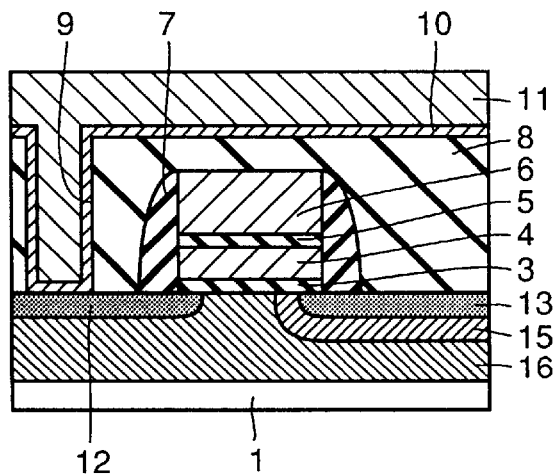

Thereafter, the nonvolatile semiconductor memory device shown in FIG. 36 is completed through steps similar to those of the embodiment 1 shown in FIGS. 9 to 14.

In the nonvolatile semiconductor memory device of this embodiment, the injection efficiency is improved by increasing the longitudinal electric field in the bulk, whereby the gate electrode is increased. This will be described below more in detail.

Before this description, Poisson's Equation will be derived.

Figure 37:
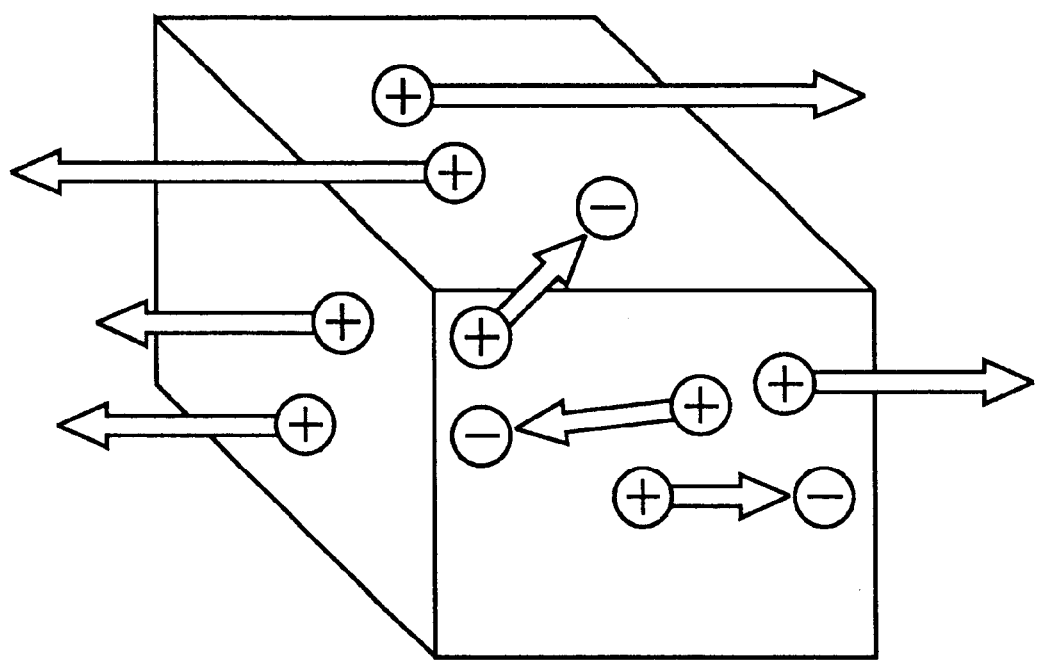
FIG. 37 shows a sum of charges in a certain space.

When one positive charge exists, one negative charge paired therewith necessarily exists. For one pair, there necessarily exists only one line of electric force directed from the positive to the negative. Therefore, when a certain space, e.g., of a rectangular parallelepiped is defined as shown in FIG. 37, the sum of lines of electric force projecting from the defined space is equal in number to the sum of charges which are not paired with charges existing in the space. When the charges not paired in the space are, e.g., five in number, the lines of electric force projected from the space are five in number.

Assuming that D represents the number of lines of electric forces per area, sum Q of internal charges can be obtained by integration of D along the surface of the space. This can be represented by the following formula:

$$Q = \iint D\,ds$$

Assuming that Na represents the impurity concentration per volume, Q can be obtained by integration of Na over the whole area in the rectangular parallelepiped, as represented by the following formula:

$$Q = \iiint qNa\,dV$$

From the above, a relationship between Na and D can be represented as follows:

$$\iint D\,dS = \iiint qNa\,dV \rightarrow qNA = (d/dx)D \quad (1)$$

As a multiplier between the electric force line density (D) and electric field (E), there exists a dielectric constant ($\epsilon$). The dielectric constant represents a degree of induction of electric force lines with respect to the electric field, and is defined to satisfy the following formula:

$$D = \epsilon E$$

Based the above relationship, the formula (1) can be rewritten into the following formula:

$$qNa = (d/dx)\epsilon E$$

Further, the electric field E is the quantity defined by position differentiation of the potential (electric potential).

$$E = -(d/dx)V$$

From the above, Poisson's Equation can be derived as the following formula (2):

$$qNa/\epsilon = -(d/dx)(d/dx)V \quad (2)$$

In the strict sense of the word, the potential is different from the electric potential, these can be considered to be substantially the same.

Figure 38:
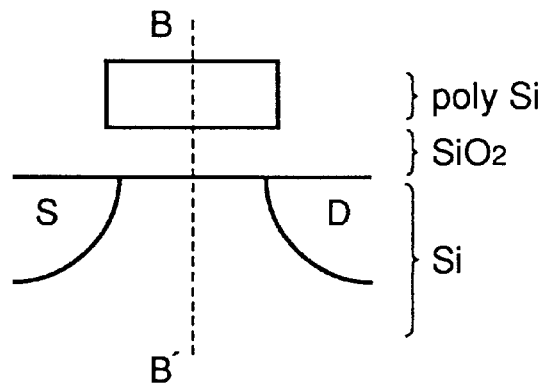
FIG. 38 is a schematic cross section showing a structure of a conventional MOS transistor.
Figure 39:
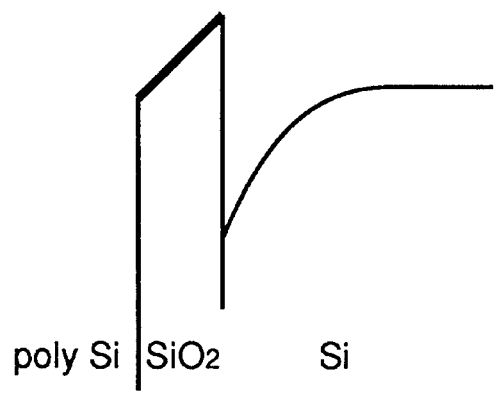
FIG. 39 shows distribution of a potential along line B–B' in FIG. 38.

FIG. 39 shows distribution of the potential in the direction indicated by line B–B' in the MOS (Metal Oxide Semiconductor) transistor shown in FIG. 38. The curve of potential in Si is derived by solving the Poisson's equation. The potential is represented by φ.

$$(qN/\epsilon) = -(d^2\phi/dx^2) \tag{3}$$

By integration of the above formula (3), the following formula (4) is derived:

$$-(d\phi/dx) = (qN/\epsilon)(x-x_b) = E \tag{4}$$

The left member in the formula (4) represents the electric field, and specifically represents the quantity determined by a gradient of the curve of the potential. When coordinates are set such that φ is given by the ordinate and x is given by the abscissa, the gradient goes to 0 at $x=x_b$. The above formula will be solve based on the conditions assumed as described above.

$$\phi = -(qN/\epsilon)\{(x^2/2) - x_b x\} - 2\phi_b \tag{5}$$

Figure 40:
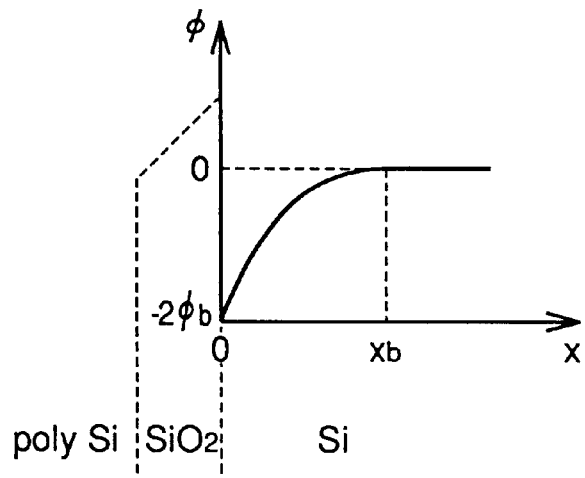
FIG. 40 shows the same potential distribution as that in FIG. 39 together with coordinates.

The left member in the formula (5) represents the potential, and determines the curve in FIG. 40. Here, it is assumed that a relationship of $\phi = -2\phi_b$ with x=0 is established. Although $\phi_b$ is a constant which is given as a physical quantity, $x_b$ is a variable. $x_b$ can be calculated as follows by substituting 0 for φ in the formula (5) (φ=0) when x is $x_b$ $$0 = -(qN/\epsilon)\{(x^2/2) - x^2 b\} - 2\phi_b \rightarrow x_b\{(2\epsilon/qN)2\phi_b\}^{1/2} \tag{6}$$

By substituting the formula (6) for the formula (5), an intended potential curve in the bulk can be formulated as follows:

$$\phi = -(qN/\epsilon)\{(x^2/2) - x\{(2\epsilon/qN)2\phi_b\}^{1/2} - 2\phi_b$$
$$= -(qN/2\epsilon)x^2 - 2x(qN\phi_b/\epsilon)^{1/2} - 2\phi_b$$

Here, a relationship between the electric field E in the bulk and the substrate concentration N can be represented by the following formula which is derived from combination of the formulas (6) and (4).

$$E = (qN/\epsilon)[x - \{(2\epsilon/qN)2\phi_b\}^{1/2}]$$
$$= (qN/\epsilon)x - 2(qN\phi_b/\epsilon)^{1/2}$$

In the above formula, N is sufficiently larger than 1, so that it is apparent that electric field E along the gate electrode direction in the bulk increases as substrate concentration N increases.

As described above, the longitudinal electric field along the gate electrode direction in the bilk can be increased by provision of $p^+$ impurity region 16 and $p^{++}$ pocket region 15 which have the impurity concentrations higher than that of p-type silicon substrate 1, as is done in this embodiment. Thereby, the gate current can be increased, and the write capability can be improved without increasing the applied voltage. Meanwhile, when consideration is made based on the write capability, this structure can be operated with a low applied voltage. Therefore, it can be understood that this structure is advantageous to low-voltage operating elements and single-power-supply elements.

Since $p^{++}$ pocket region 15 having the impurity concentration higher than that of p-type silicon substrate 1 is arranged at the main surface of p-type silicon substrate 1 between $n^+$ source diffusion region 12 and $n^+$ drain diffusion region 13, punch through can be prevented. Therefore, a limit gate length determined based on the off breakdown voltage can be short. Thus, the structure of this embodiment is advantageous to microscopic device fabrication.

In addition to $p^{++}$ pocket region 15, $p^+$ impurity region 16 having the impurity concentration higher than that of p-type silicon substrate 1 is arranged at the main surface of p-type silicon substrate 1 between $n^+$ source diffusion region 12 and $n^+$ drain diffusion region 13. Therefore, punch through can be prevented further effectively.

By appropriately selecting the impurity concentrations of $p^{++}$ pocket region 15 and p-type impurity region 16, the threshold voltage can be controlled while maintaining the intended limit gate length and intended write capability.

In addition to the above, by appropriately selecting the impurity concentrations of $p^{++}$ pocket region 15 and p-type impurity region 16, the impurity concentration of $p^{++}$ pocket region 15 can be reduced while maintaining the intended write capability and intended threshold voltage. Therefore, the write capability can be improved without increasing the leak current between the diffusion region and the substrate.

Embodiment 4

Figure 41:
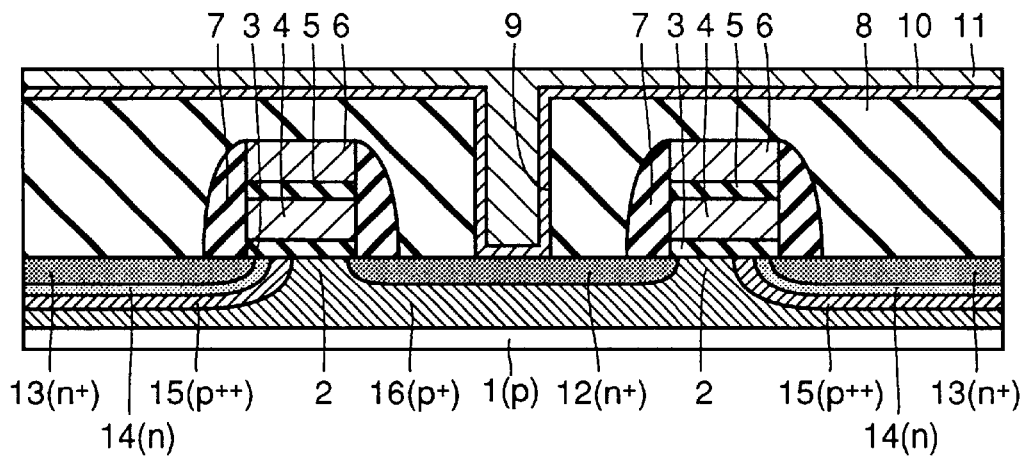
FIG. 41 is a cross section schematically showing a structure of a nonvolatile semiconductor memory device of an embodiment 4 of the invention.

Referring to FIG. 41, a structure of this embodiment differs from the structure of the embodiment 3 shown in FIG. 31 in that it additionally includes n-type region 14. The n-type region 14 is in contact with $n^+$ drain diffusion region 13, and covers the periphery of the same. The $p^{++}$ pocket region 15 is in contact with n-type region 14, and covers the periphery of the same. The n-type region 14 has the impurity concentration lower than that of the drain diffusion region.

Since structures other than the above are substantially the same as those of the embodiment 3, the same or similar portions and members bear the same reference characters and will not be described below.

A method of manufacturing the nonvolatile semiconductor memory device of this embodiment will be described below.

Figure 42:
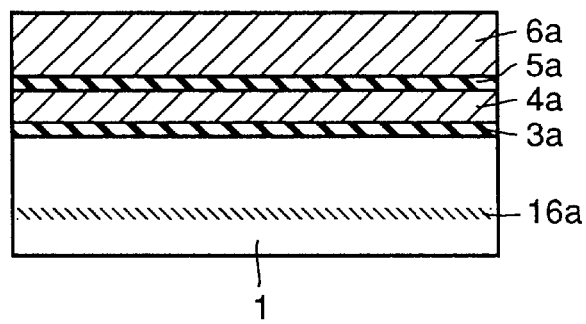
FIGS. 42 to 47 are schematic cross sections showing, in accordance with the order of steps, a method of manufacturing the nonvolatile semiconductor memory device of the embodiment 4 of the invention.

Referring first to FIG. 42, the well region and element isolating oxide film (not shown) are formed at predetermined regions of p-type silicon substrate 1. Boron (B) is ion-implanted into the main surface of p-type silicon substrate 1 under the conditions of about 50 keV and about $5 \times 10^{13}$ cm$^{-2}$. Thereby, channel dope region 16a is formed at p-type silicon substrate 1. Then, insulating film 3a made of, e.g., a silicon oxide film and having a thickness of about 100 Å is formed on the whole surface. First doped polycrystalline silicon layer 4a of about 1000 Å in thickness is formed on insulating film 3a. Interlayer insulating layer 5a of about 200 Å in thickness made of, e.g., a composite film formed of a silicon oxide film and a silicon nitride film is formed on first doped polycrystalline silicon layer 4a. Then, second doped polycrystalline silicon layer 5a of about 2500 Å in thickness is formed on interlayer insulating layer 4a.

Thereafter, steps similar to those of the embodiment 1 shown in FIGS. 3 and 4 are performed for manufacturing the structure of this embodiment.

Figure 43:
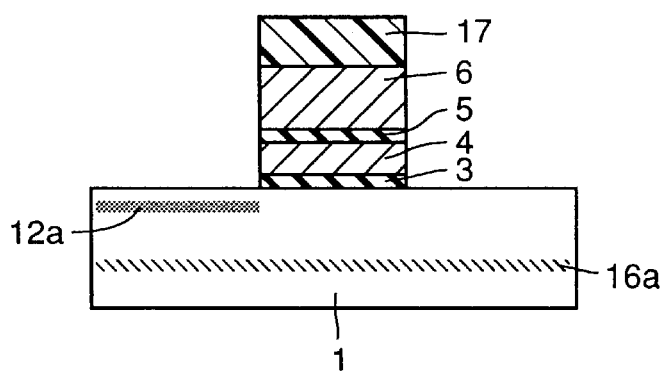

Referring to FIG. 43, resist pattern 18 is formed over the drain formation region of the memory transistor by the conventional photolithography. Using resist pattern 18 and control gate electrode 6 as a mask, arsenic (As) is ion-implanted into the main surface of p-type silicon substrate 1 under the conditions of about 35 keV and about $5 \times 10^{15}$ cm$^{-2}$. Thereby, source region 12a is formed above channel dope region 16a. Thereafter, resist pattern 18 is removed.

Figure 44:
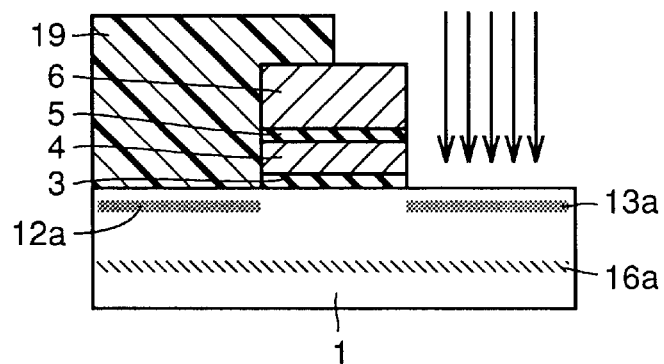

Referring to FIG. 44, resist pattern 19 is formed over the source formation region of the memory transistor by the conventional photolithography. Using resist pattern 19 and control gate electrode 6 as a mask, arsenic (As) is ion-implanted into the main surface of p-type silicon substrate 1 under the conditions of about 35 keV and about $1\times10^{16}$ cm$^{-2}$. Thereby, drain region 13a is formed above channel dope region 16a.

Figure 45:
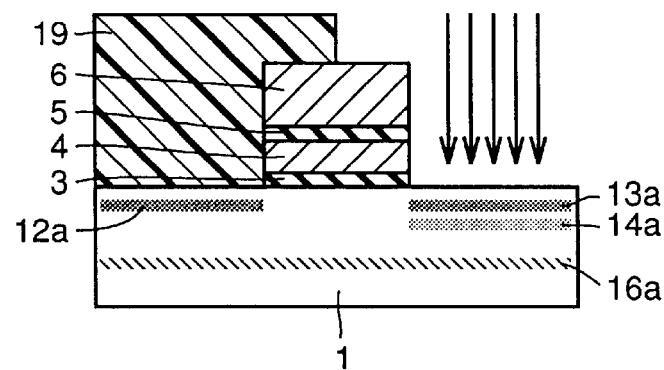

Referring to FIG. 45, using resist pattern 19 and control gate electrode 6 as a mask, phosphorus (P) is ion-implanted into the main surface of p-type silicon substrate 1 under the conditions of about 35 keV and about $5\times10^{15}$ cm$^{-2}$. Thereby, n-type region 14a is formed between channel dope region 16a and drain region 13a.

Figure 46:
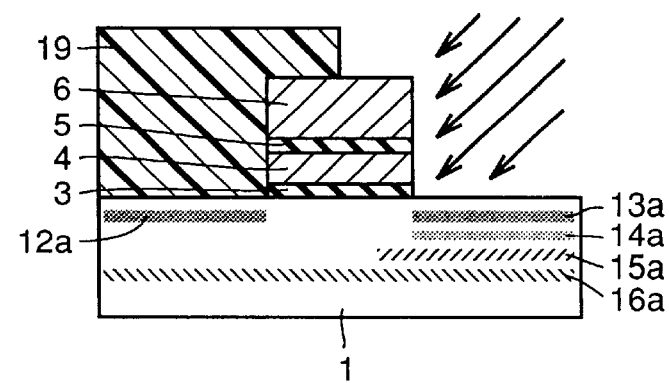

Referring to FIG. 46, using resist pattern 19 and control gate electrode 6 as a mask, boron (B) is implanted by tilt-angle rotary implantation with an angel of 45° into the main surface of p-type silicon substrate 1 under the conditions of about 35 keV and $5\times10^{13}$ cm$^{-2}$. Thereby, p-type region 15a is formed between channel dope region 16a and n-type region 14a.

Figure 47:
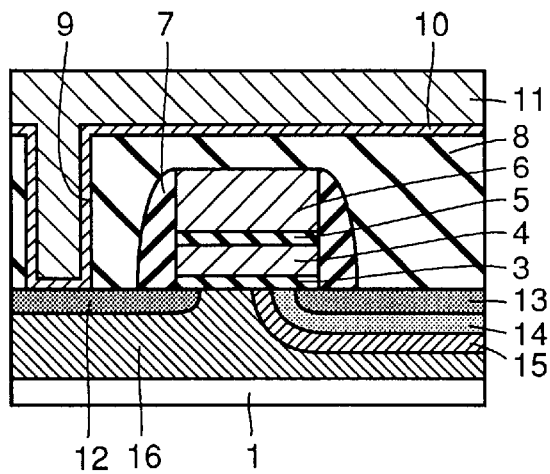

Thereafter, the nonvolatile semiconductor memory device shown in FIG. 47 is completed through steps similar to those of the embodiment 1 shown in FIGS. 9 to 14.

The nonvolatile semiconductor memory device of this embodiment is provided with n-type region 14 which is in contact with n$^+$ drain diffusion region 13 and covers the periphery thereof, similarly to the embodiment 1 as shown in FIG. 41. Therefore, the lateral electric field of insulating film 3 can be shifted toward source diffusion region 12. Thereby, the longitudinal electric field can be reduced at the point where the maximum lateral electric field generates. This reduces the force returning electrons in insulating film 3 toward p-type silicon substrate 1, and also reduces a height of the insulating film barrier over which electrons are to be moved. Therefore, the probability of arrival of high energy electrons at floating gate electrode 4 can be increased, and the gate current can be increased.

The p$^{++}$ pocket region 15 and p$^+$ impurity region 16 which have the impurity concentrations higher than that of silicon substrate 1 are arranged between n$^+$ source diffusion region 12 and n$^+$ drain diffusion region 13. Since high substrate concentration is set between n$^+$ drain diffusion region 13 and n$^+$ source diffusion region 12, the electric field along the gate electrode direction in the bulk can be large. This further improves the efficiency of injection of high energy electrons into floating gate electrode 4.

In this manner, the gate current can be increased further, so that the write capability can be improved without increasing the applied voltage. Meanwhile, when consideration is made based on the write capability, this structure can be operated with a low applied voltage. Therefore, it can be understood that this structure is advantageous to low-voltage operating elements and single-power-supply elements.

Since p$^{++}$ pocket region 15 having the impurity concentration higher than that of p-type silicon substrate 1 is arranged between n$^+$ source diffusion region 12 and n$^+$ drain diffusion region 13, punch through can be prevented. Therefore, a limit gate length determined based on the off breakdown voltage can be short. Thus, the structure of this embodiment is advantageous to microscopic device fabrication.

In addition to p$^{++}$ pocket region 15, p-type region 16 having the impurity concentration higher than that of p-type silicon substrate 1 is arranged between n$^+$ source diffusion region 12 and n$^+$ drain diffusion region 13. Therefore, the punch through can be prevented further effectively.

By appropriately selecting the impurity concentrations of p$^{++}$ pocket region 15 and p$^+$ type impurity region 16, the threshold voltage can be controlled while maintaining the intended limit gate length and intended write capability.

In addition to the above, by appropriately selecting the impurity concentrations of p$^{++}$ pocket region 15 and p-type impurity region 16, the impurity concentration of p$^{++}$ pocket region 15 can be reduced while maintaining the intended write capability and intended threshold voltage. Therefore, the write capability can be improved without increasing the leak current between the diffusion region and the substrate.

Embodiment 5

Figure 48:
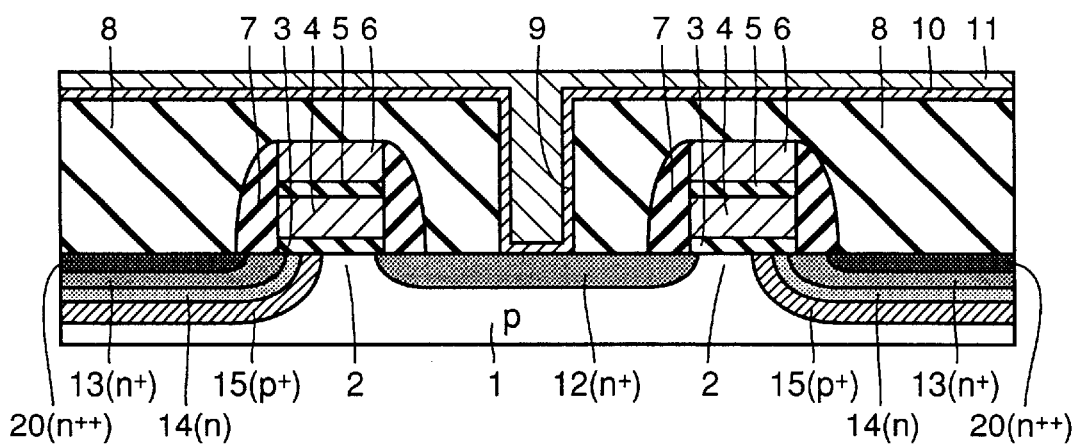
FIG. 48 is a cross section schematically showing a structure of a nonvolatile semiconductor memory device of an embodiment 5 of the invention.

Referring to FIG. 48, a structure of this embodiment differs from the structure of the embodiment 1 shown in FIG. 1 in that it additionally includes n$^{++}$ impurity region 20. The n$^{++}$ impurity region 20 is formed at the surface of p-type silicon substrate 1 within n$^+$ drain diffusion region 13. The n$^{++}$ impurity region 20 has the impurity concentration higher than that of n$^+$ drain region 13. The n$^{++}$ impurity region 20 does not extend to a position immediately under floating gate electrode 4, and extends to a position immediately under side wall insulating layer 7.

In the above structure, n$^+$ drain diffusion region 13 has an impurity concentration of $1\times10^{20}$ cm$^{-3}$, n-type region 14 has an impurity concentration of $5\times10^{19}$ cm$^{-3}$, and n$^{++}$ impurity region 20 has an impurity concentration of about $1\times10^{21}$ cm$^{-3}$.

Since structures other than the above are substantially the same as those of the embodiment 1, the same or similar portions and members bear the same reference characters and will not be described below.

A method of manufacturing the nonvolatile semiconductor memory device of this embodiment will be described below.

In the method of manufacturing the structure of this embodiment, steps similar to those of the embodiment 1 shown in FIGS. 2 to 10 are first performed.

Figure 49:
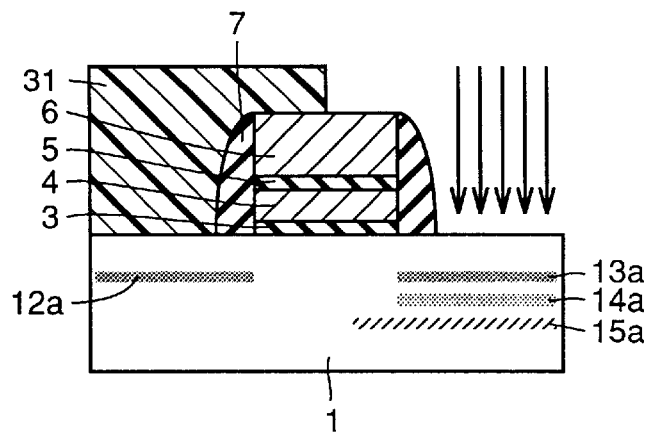
FIGS. 49 to 52 are schematic cross sections showing, in accordance with the order of steps, a method of manufacturing the nonvolatile semiconductor memory device of the embodiment 5 of the invention.

Referring to FIG. 49, a resist pattern 31 covering the source formation region of the memory transistor is formed by the conventional photolithography. Using resist pattern 31, control gate electrode 6 and side wall insulating layer 7 as a mask, arsenic (As) is ion-implanted into the main surface of p-type silicon substrate 1 under the conditions of about 35 keV and about $5\times10^{15}$ cm$^{-2}$.

Figure 50:
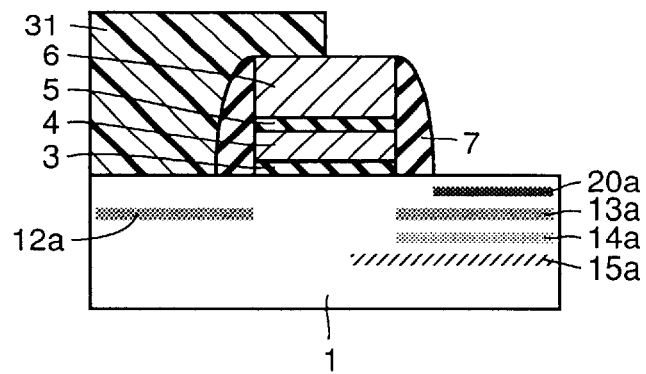
Figure 51:
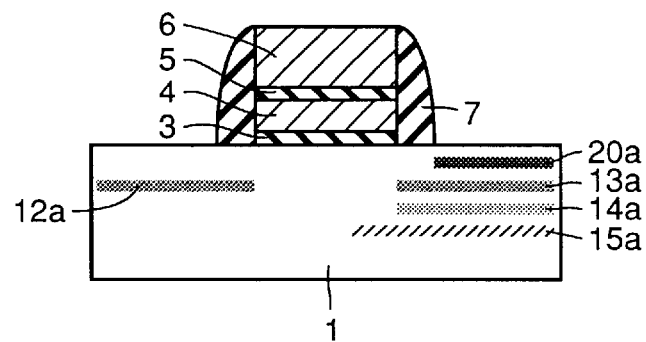

Referring to FIG. 50, this ion-implantation forms an n$^{++}$ impurity region 20a on drain region 13a. Then, resist pattern 31 is removed, and a structure shown in FIG. 51 is formed.

Figure 52:
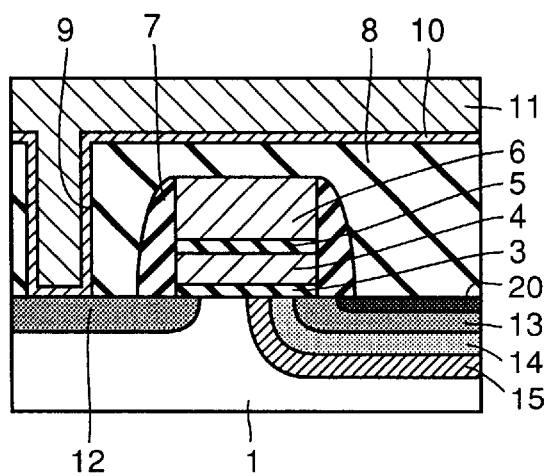

Thereafter, steps similar to those of the embodiment 1 shown in FIGS. 11 to 14 are performed, so that the nonvolatile semiconductor memory device shown in FIG. 52 is completed.

In the nonvolatile semiconductor memory device of this embodiment, n$^{++}$ impurity region 20 having an impurity concentration higher than that of n$^+$ drain impurity region 13 is formed at n$^+$ drain diffusion region 13. Therefore, a parasitic resistance of n$^+$ drain diffusion region 13 is reduced, the current driving capability is increased, and thus improvement of the write capability and increase of reading speed can be expected.

Embodiment 6

Figure 53:
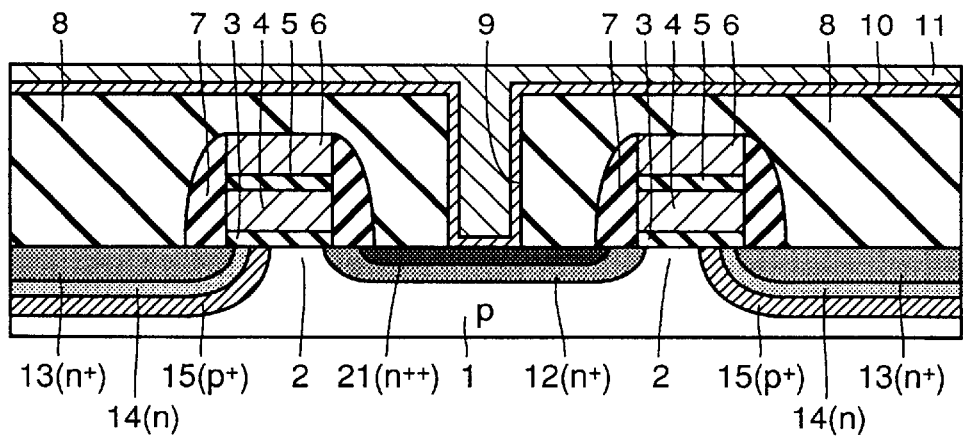
FIG. 53 is a cross section schematically showing a structure of a nonvolatile semiconductor memory device of an embodiment 6 of the invention.

Referring to FIG. 53, a structure of this embodiment differs from the structure of the embodiment 1 shown in FIG. 1 in that it additionally includes an n$^{++}$ impurity region 21. The n$^{++}$ impurity region 21 is arranged at the surface of p-type silicon substrate 1 in n$^+$ source diffusion region 12. The n$^{++}$ impurity region 21 has an impurity concentration higher than that of n$^+$ source diffusion region 12. The n$^{++}$ impurity region 21 does not extend to a region immediately under floating gate 4, and extends only to regions immediately under side wall insulating layers 7.

The $n^{++}$ impurity region has an impurity concentration of about $1 \times 10^{21}$ cm$^{-3}$.

A method of manufacturing the nonvolatile semiconductor memory device of this embodiment will be described below.

In a method of manufacturing the structure of this embodiment, steps similar to those of the embodiment 1 shown in FIGS. 2 to 10 are performed.

Figure 54:
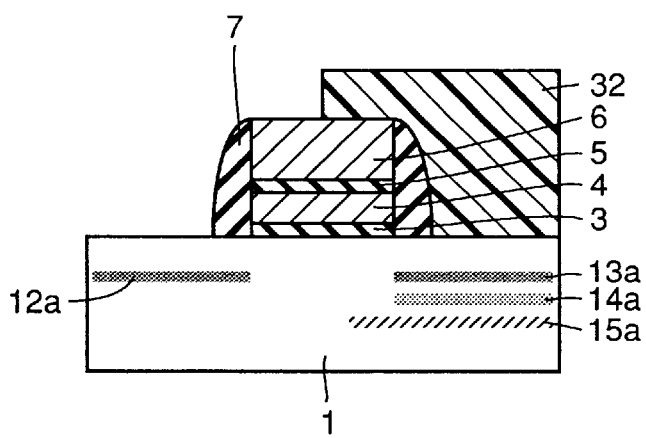
FIGS. 54 to 57 are schematic cross sections showing, in accordance with the order of steps, a method of manufacturing the nonvolatile semiconductor memory device of the embodiment 6 of the invention.

Referring to FIG. 54, a resist pattern 32 covering the drain formation region of the memory transistor is formed by the conventional photolithography. Using resist pattern 32, control gate electrode 6 and side wall insulating layer 7 as a mask, arsenic (As) is ion-implanted into the main surface of p-type silicon substrate 1 under the conditions of about 35 keV and about $5 \times 10^{15}$ cm$^{-2}$.

Figure 55:
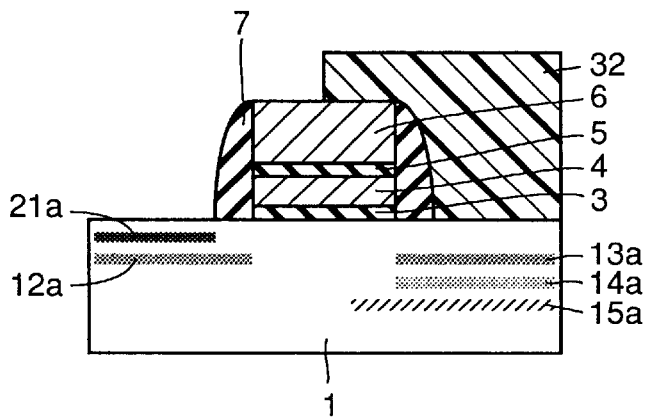
Figure 56:
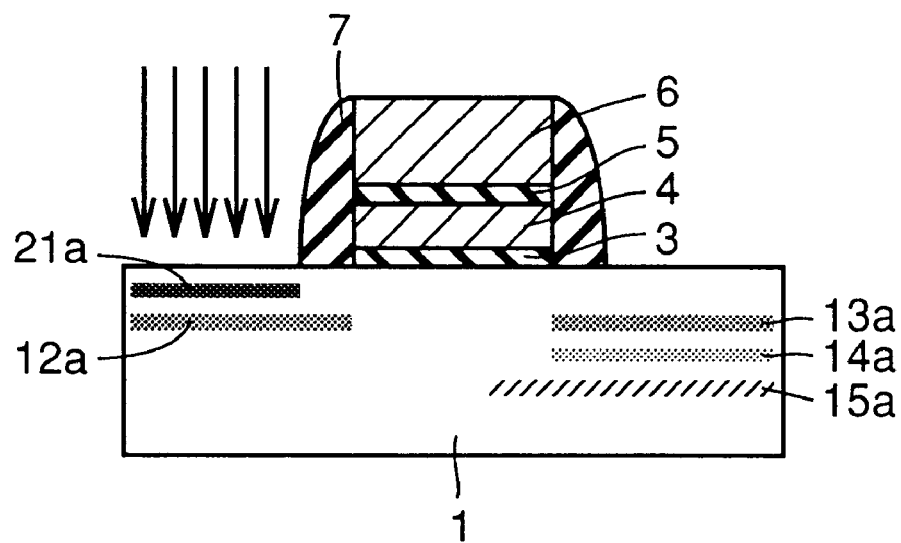

Referring to FIG. 55, this ion-implantation forms an $n^{++}$ impurity region 21a on source region 12a in p-type silicon substrate 1. Then, resist pattern 32 is removed, and a structure shown in FIG. 56 is formed.

Figure 57:
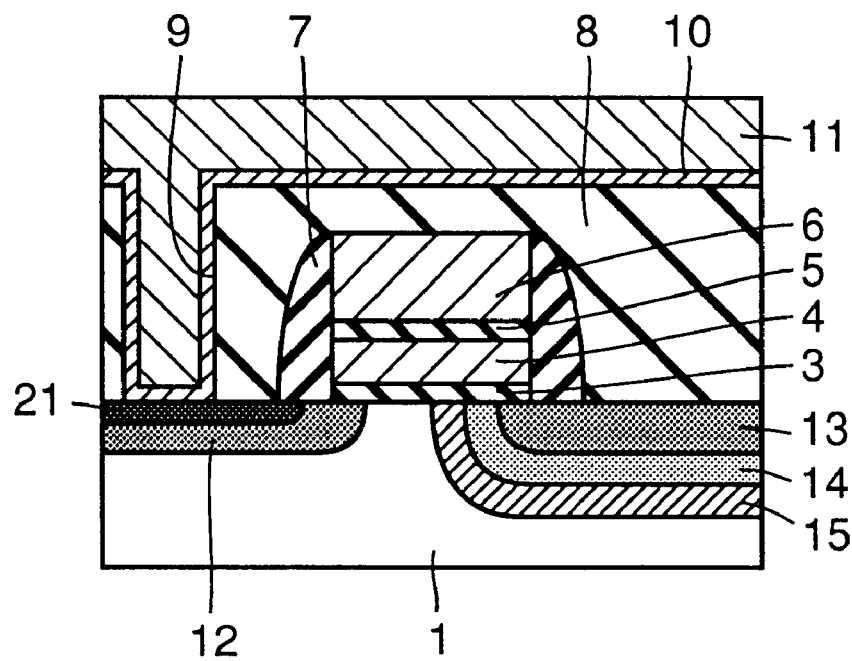

Thereafter, steps similar to those of the embodiment 1 shown in FIGS. 11 to 14 are performed, so that the nonvolatile semiconductor memory device shown in FIG. 57 is completed.

In the nonvolatile semiconductor memory device of this embodiment, $n^{++}$ impurity region 21 having an impurity concentration higher than that of $n^+$ source impurity region 12 is formed at $n^+$ source diffusion region 12. Therefore, a parasitic resistance of $n^+$ source diffusion region 12 is reduced, the current driving capability is increased, and thus improvement of the write capability and increase of reading speed can be expected.

Embodiment 7

Figure 58:
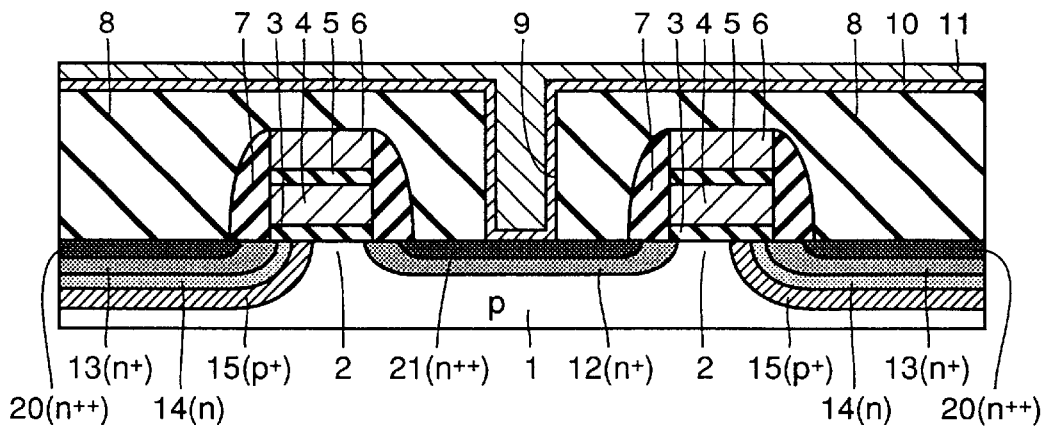
FIG. 58 is a cross section schematically showing a structure of a nonvolatile semiconductor memory device of an embodiment 7 of the invention.

Referring to FIG. 58, a structure of this embodiment differs from the structure of the embodiment 1 shown in FIG. 1 in that it additionally includes $n^{++}$ impurity regions 20 and 21. The $n^{++}$ impurity region 20 is arranged at the surface of p-type silicon substrate 1 in $n^+$ drain diffusion region 13. The $n^{++}$ impurity region 20 has an impurity concentration higher than that of $n^+$ drain diffusion region 13.

The $n^{++}$ impurity region 21 is arranged at the surface of p-type silicon substrate 1 in $n^+$ source diffusion region 12. The $n^{++}$ impurity region 21 has an impurity concentration higher than that of $n^+$ source diffusion region 12.

The $n^{++}$ impurity regions 20 and 21 do not extend to a region immediately under floating gate 4, and extend only to regions immediately under side wall insulating layers 7.

Each of $n^{++}$ impurity regions 20 and 21 has an impurity concentration of about $1 \times 10^{21}$ cm$^{-3}$.

Since structures other than the above are substantially the same as those of the embodiment 1, the same or similar portions and members bear the same reference characters and will not be described below.

A method of manufacturing the nonvolatile semiconductor memory device of this embodiment will be described below.

In the manufacturing method of this embodiment, steps similar to those of the embodiment 1 shown in FIGS. 2 to 10 are performed.

Figure 59:
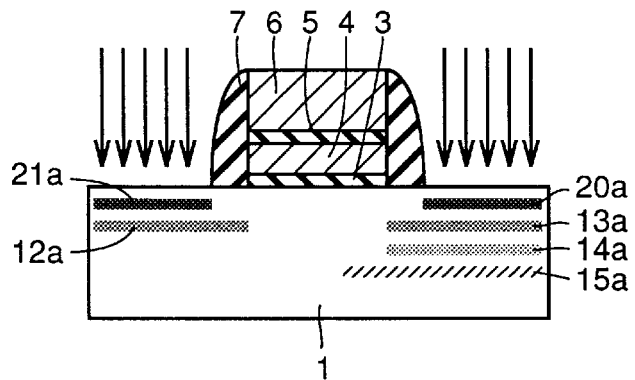
FIGS. 59 and 60 are schematic cross sections showing, in accordance with the order of steps, a method of manufacturing the nonvolatile semiconductor memory device of the embodiment 7 of the invention.

Then, referring to FIG. 59, using control gate electrode 6 and side wall insulating layer 7 as a mask, arsenic (As) is ion-implanted into the main surface of p-type silicon substrate 1 under the conditions of about 35 keV and about $5 \times 10^{15}$ cm$^{-2}$. Thereby, $n^{++}$ regions 21a and 20a are formed on source region 12a and drain region 13a in p-type silicon substrate 1, respectively.

Figure 60:
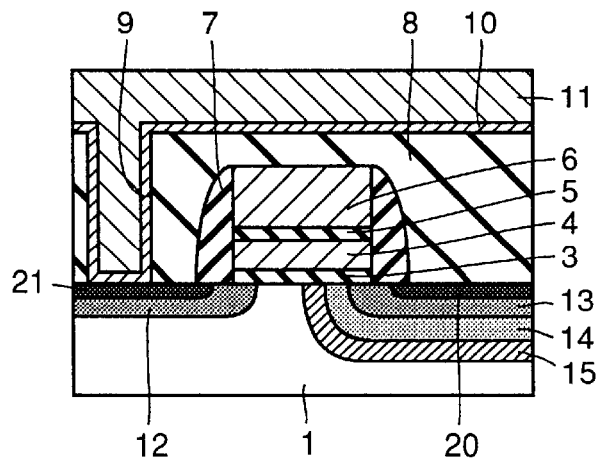

Thereafter, steps similar to those of the embodiment 1 shown in FIGS. 11 to 14 are performed, so that the nonvolatile semiconductor memory device shown in FIG. 60 is completed.

In the nonvolatile semiconductor memory device of this embodiment, $n^{++}$ impurity regions 21 and 20 are arranged in $n^+$ source diffusion region 12 and $n^+$ drain diffusion region 13, respectively. The $n^{++}$ impurity regions 20 and 21 have the impurity concentrations higher than those of $n^+$ source diffusion region 12 and $n^+$ drain diffusion region 13, respectively. Therefore, parasitic resistances of $n^+$ source diffusion region 12 and $n^+$ drain diffusion region 13 are reduced, current driving capability is increased, and improvement of increase of the reading speed can be expected.

In the manufacturing method of this embodiment, $n^{++}$ impurity regions 20 and 21 are formed in the same ion-implanting step. Therefore, the manufacturing steps can be simplified.

Embodiment 8

Figure 61:
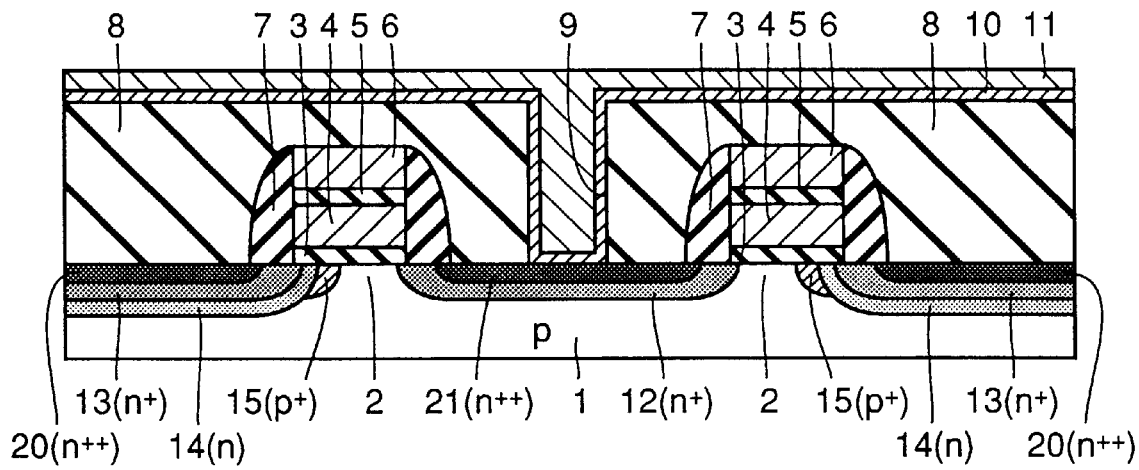
FIG. 61 is a cross section schematically showing a structure of a nonvolatile semiconductor memory device of an embodiment 8 of the invention.

Referring to FIG. 61, a structure of this embodiment differs from that of the embodiment 7 shown in FIG. 58 in the structure of $p^+$ pocket region 15. The $p^+$ impurity region 15 forming the pocket region in this embodiment has a depth from the surface of p-type silicon substrate 1, which is smaller that those of $n^+$ drain diffusion region 13 and $n^+$ source diffusion region 12. The $p^+$ impurity region 15 is located at a region immediately under floating gate electrode 4, and is in contact with n-type region 14. The $p^+$ impurity region 15 has an impurity concentration higher than that of p-type silicon substrate 1.

Since structures other than the above are substantially the same as those of the embodiment 7 in FIG. 58, the same or similar portions and members bear the same reference characters and will not be described below.

In the nonvolatile semiconductor memory device of this embodiment, since $p^+$ impurity region 15 is shallower than $n^+$ drain diffusion region 13 and $n^+$ source diffusion region 12, an area of contact between $p^+$ impurity region 15 and n-type region 14 is smaller than that in the structure shown in FIG. 58. Therefore, a junction leak current between the diffusion region and the substrate is small, so that a boost capability is increased. Since the leak current of each of memory cells connected to word lines is small, the sum of leak currents of respective memory cells can be small. Therefore, increase in number of transistors per block can be expected.

Embodiment 9

Figure 62:
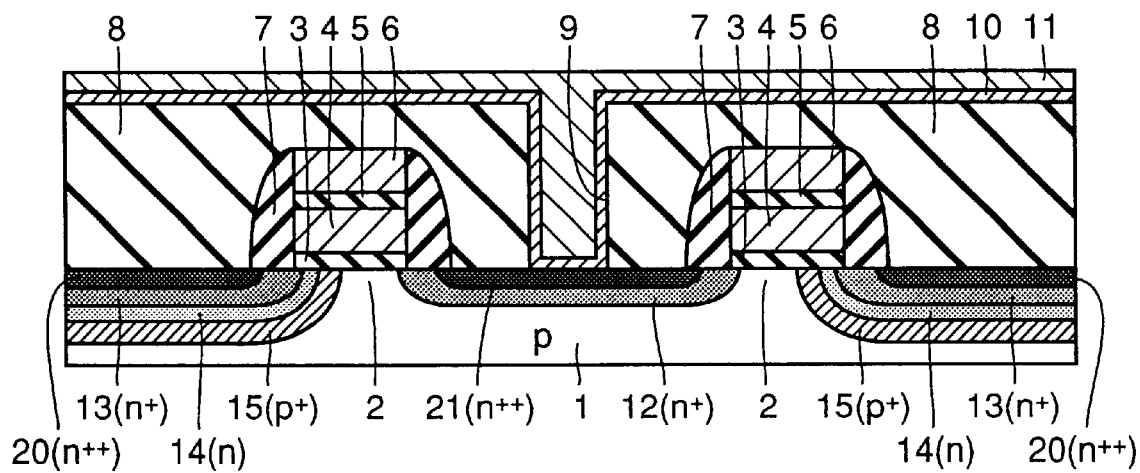
FIG. 62 is a cross section schematically showing a structure of a nonvolatile semiconductor memory device of an embodiment 9 of the invention.

Referring to FIG. 62, a structure of this embodiment differs from that of the embodiment 8 shown in FIG. 61 in the structure of $p^+$ pocket region 15. The $p^+$ pocket region 15 is in contact with n-type region 14, and covers the periphery thereof. The $p^+$ pocket region 15 extends to a region of p-type silicon substrate 1 located immediately under floating gate electrode 4. The $p^+$ pocket region 15 has an impurity concentration higher than that of p-type silicon substrate 1.

Since structures other than the above are substantially the same as those of the embodiment 8 in FIG. 61, the same or similar portions and members bear the same reference characters and will not be described below.

In the nonvolatile semiconductor memory device of this embodiment, since $p^+$ pocket region 15 covers both of $n^+$ drain diffusion region 13 and n-type region 14, a punch through current can be reduced. Therefore, the channel length can be reduced, which allows shrinkage of devices.

Embodiment 10

Figure 63:
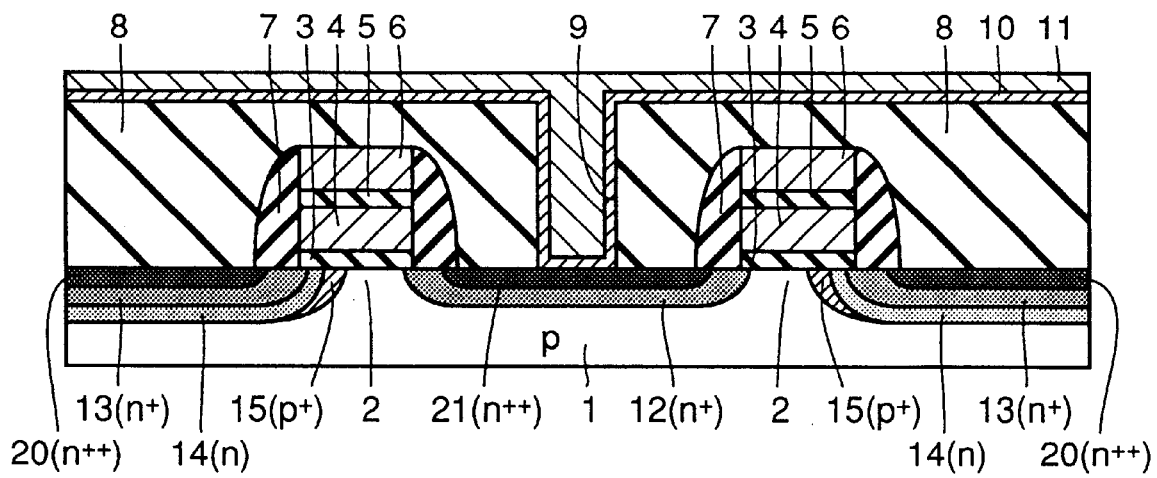
FIG. 63 is a cross section schematically showing a structure of a nonvolatile semiconductor memory device of an embodiment 10 of the invention.

Referring to FIG. 63, a structure of the nonvolatile semiconductor memory device of this embodiment differs from that of the embodiment 7 shown in FIG. 58 in the structure of $p^+$ impurity region 15 forming the pocket region. The $p^+$ impurity region 15 is formed immediately under floating gate electrode 4 and is in contact with n-type region 14. The $p^+$ impurity region 15 has a depth from the surface of p-type silicon substrate 1, which is substantially equal to those of $n^+$ drain diffusion region 13 and n-type region 14. The $p^+$ impurity region 15 has an impurity concentration higher than that of p-type silicon substrate 1.

Since structures other than the above are substantially the same as those of the embodiment 7 shown in FIG. 58, the same or similar portions and members bear the same reference characters and will not be described below.

In the nonvolatile semiconductor memory device of this embodiment, $p^+$ impurity region 15 has a relatively small depth substantially equal to that of $n^+$ drain diffusion region 13 or n-type region 14. Therefore, an area of contact between n-type region 14 and $p^+$ impurity region 15 can be smaller than that in the structure shown in FIG. 62. Accordingly, a junction leak current between the diffusion region and the substrate can be small, and thus improvement of the boost capability and increase in number of transistors per block can be expected.

Since $p^+$ impurity region 15 has a depth similar to that of $n^+$ drain diffusion region 13, it has a portion which covers $n^+$ drain diffusion region 13 and is located deeper than that in the structure shown in FIG. 61. Thereby, a punch through current can be reduced. Accordingly, the channel length can be reduced, which allows shrinkage of the device.

Embodiment 11

Figure 64:
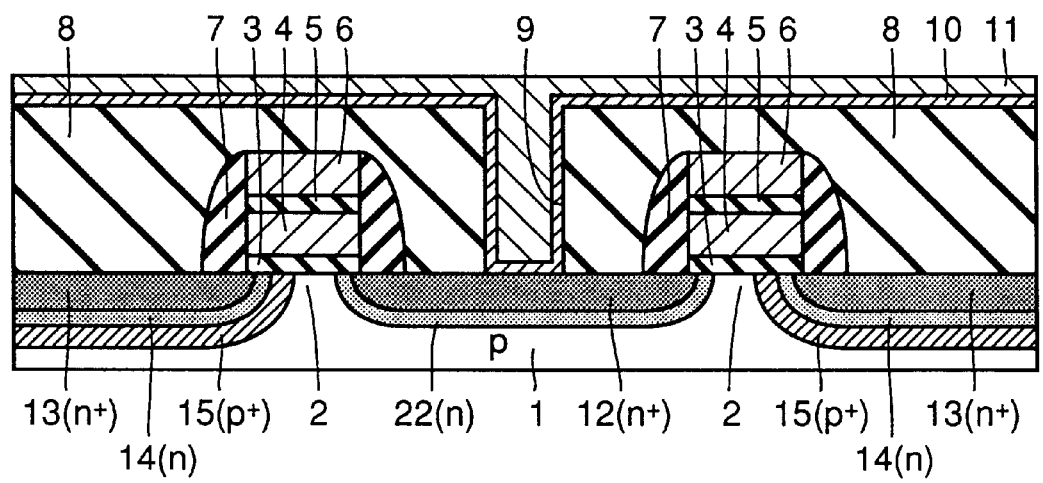
FIG. 64 is a cross section schematically showing a structure of a nonvolatile semiconductor memory device of an embodiment 11 of the invention.

Referring to FIG. 64, a structure of this embodiment differs from the structure of the embodiment 1 shown in FIG. 1 in that it additionally includes n-type impurity region 22. The n-type impurity region 22 is in contact with $n^+$ source diffusion region 12, and covers the periphery thereof. The n-type region 22 has an impurity concentration higher than that of $n^+$ source diffusion region 12. For example, $n^+$ source diffusion region 12 has an impurity concentration of $1\times10^{20}$ cm$^{-3}$, in which case n-type region 22 has an impurity concentration in a range from $1\times10^{18}$ cm$^{-3}$ to $8\times10^9$ cm$^{-3}$.

Since structures other than the above are substantially the same as those of the embodiment 1 shown in FIG. 1, the same or similar portions and members bear the same reference characters and will not be described below.

A method of manufacturing the nonvolatile semiconductor memory device of this embodiment will be described below.

In the manufacturing method of this embodiment, steps similar to those of the embodiment 1 shown in FIGS. 2 to 5 are first performed.

Figure 65:
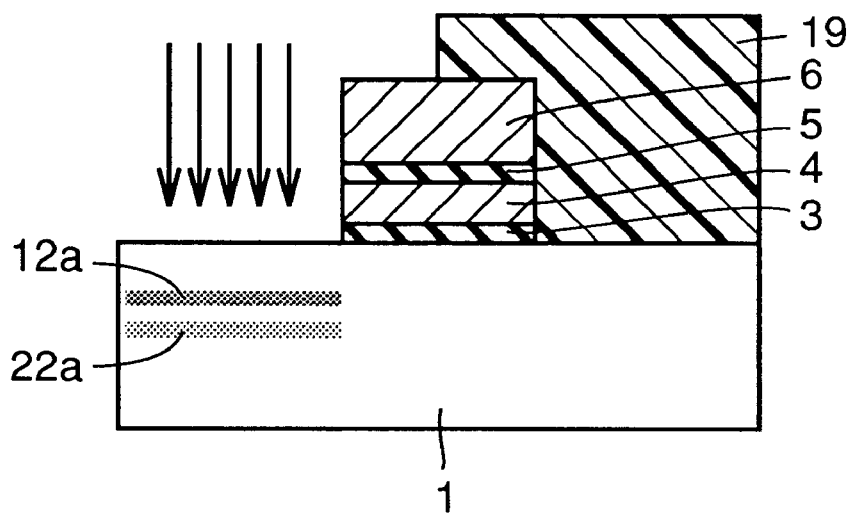
FIGS. 65 and 66 are schematic cross sections showing, in accordance with the order of steps, a method of manufacturing the nonvolatile semiconductor memory device of the embodiment 11 of the invention.

Referring to FIG. 65, using resist pattern 19 and control gate electrode 6 as a mask, phosphorus (P) is ion-implanted into the main surface of p-type silicon substrate 1 under the conditions of about 50 keV and about $1\times10^{13}$ cm$^{-2}$. This forms an n-type region 22a under source region 12a. Thereafter, resist pattern 19 is removed.

Figure 66:
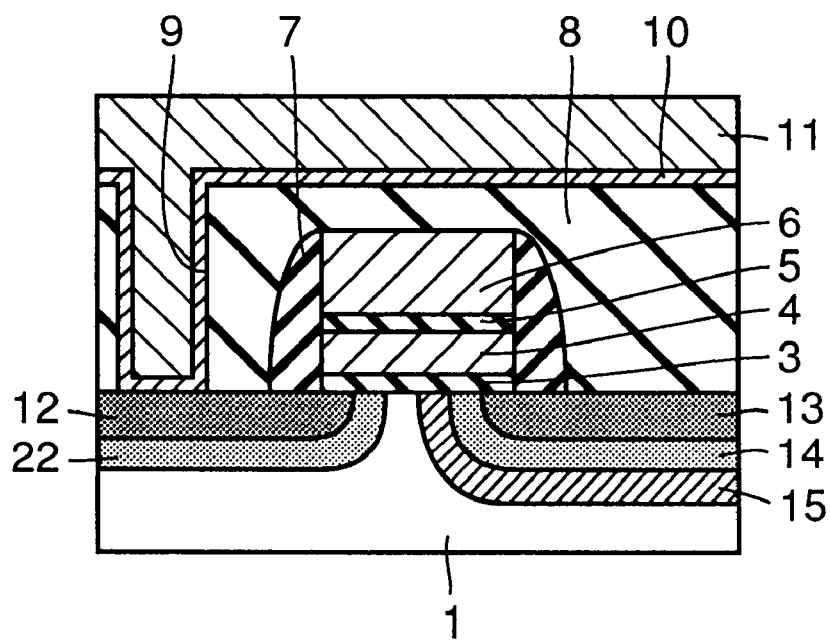

Then, steps similar to those of the embodiment 1 shown in FIGS. 6 to 14 are performed, whereby the nonvolatile semiconductor memory device shown in FIG. 66 is completed.

Since the nonvolatile semiconductor memory device of this embodiment includes n-type region 22 covering $n^+$ source diffusion region 12, this promotes extension of the depletion layer at the source side and thus increases the source breakdown voltage. For example, therefore, a high voltage can be applied to the source when erasing (removal of electrons from floating gate electrode 4) is performed at the source side with the F-N tunneling current.

Embodiment 12

Figure 67:
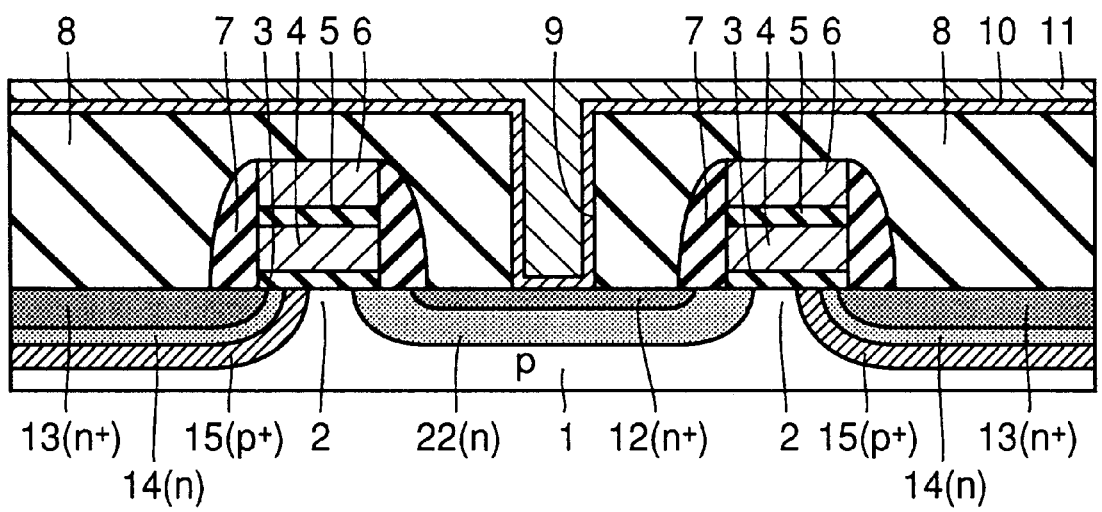
FIG. 67 is a cross section schematically showing a structure of a nonvolatile semiconductor memory device of an embodiment 12 of the invention.

Referring to FIG. 67, a structure of this embodiment differs from that of the embodiment 11 shown in FIG. 64 in that the depth of junction between $n^+$ source diffusion region 12 and $n^+$ drain diffusion region 13 as well as the impurity concentration. More specifically, a depth of $n^+$ drain diffusion region 13 from the surface of p-type silicon substrate 1 is larger than that of $n^+$ source diffusion region 12.

The $n^+$ source diffusion region 12 may have a depth from the surface of p-type silicon substrate 1, which is larger than that of $n^+$ drain diffusion region 13.

The $n^+$ source diffusion region 12 and $n^+$ drain diffusion region 13 may have different impurity concentrations.

Since structures other than the above are substantially the same as those of the embodiment 11 shown in FIG. 64, the same or similar portions and members bear the same reference characters and will not be described below.

Embodiment 13

Figure 68:
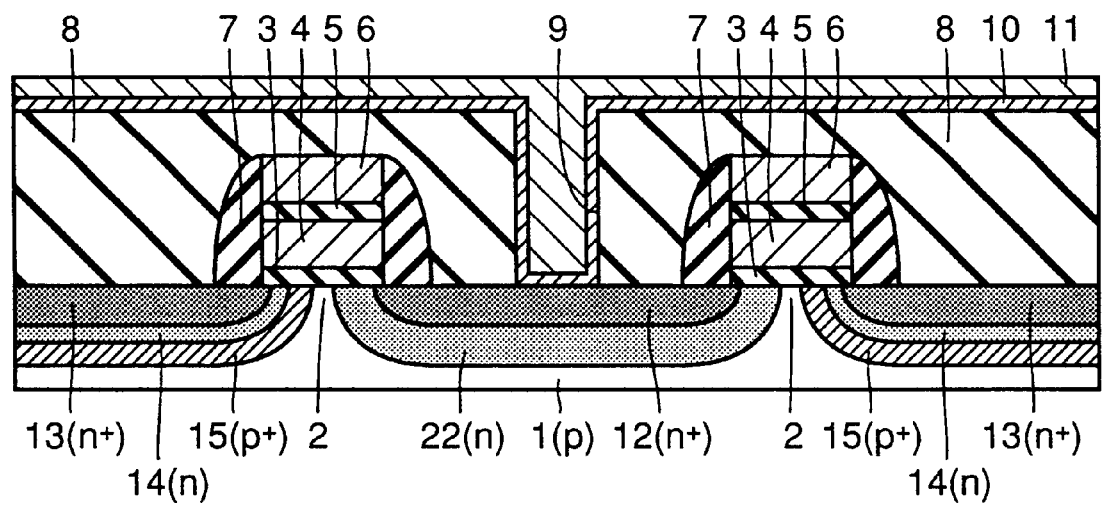
FIG. 68 is a cross section schematically showing a structure of a nonvolatile semiconductor memory device of an embodiment 13 of the invention.

Referring to FIG. 68, a structure of this embodiment differs from the structure of the embodiment 11 shown in FIG. 64 in the depth of junction between n-type region 22 at the source side and n-type region 14 at the drain side, or in the impurity concentration. More specifically, a depth of n-type impurity region 22 at the source side from the surface of p-type silicon substrate 1 is larger than that of n-type impurity region 14 at the drain side.

The n-type region 14 at the drain side may have a depth from the surface of p-type silicon substrate 1, which is larger than that of n-type region 22 at the source side.

The n-type impurity region 22 at the source side and n-type region 14 at the drain side may have different impurity concentrations.

Since structures other than the above are substantially the same as those of the embodiment 11 shown in FIG. 64, the same or similar portions and members bear the same reference characters and will not be described below.

In the nonvolatile semiconductor memory device of this embodiment, implantation may be effect on n-type region 22 at the source side under the conditions different from those under which implantation is effected on n-type region 14 at the drain side, whereby the breakdown voltage at the source diffusion region can be improved more effectively than the embodiment 11 while maintaining the improved write efficiency (depending on conditions for forming n-type region 13).

Embodiment 14

Figure 69:
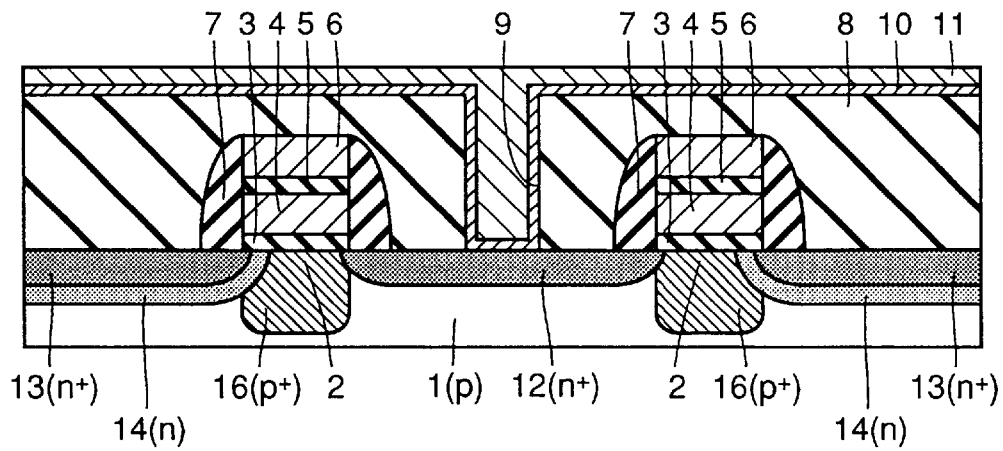
FIG. 69 is a cross section schematically showing a structure of a nonvolatile semiconductor memory device of an embodiment 14 of the invention.

Referring to FIG. 69, a structure of this embodiment differs from that of the embodiment 2 shown in FIG. 25 in the structure of $p^+$ impurity region 16. The $p^+$ impurity region 16 is formed only at a region immediately under floating gate electrode 4 to cover channel region 2, and is in contact with n-type region 14 and $n^+$ source diffusion region 12 only in this region. The $p^+$ impurity region 16 has an impurity concentration higher than that of p-type silicon substrate 1.

Since structures other than the above are substantially the same as those of the embodiment 2 shown in FIG. 25, the same or similar portions and members bear the same reference characters and will not be described below.

A method of manufacturing the nonvolatile semiconductor memory device of this embodiment will be described below.

Figure 70:
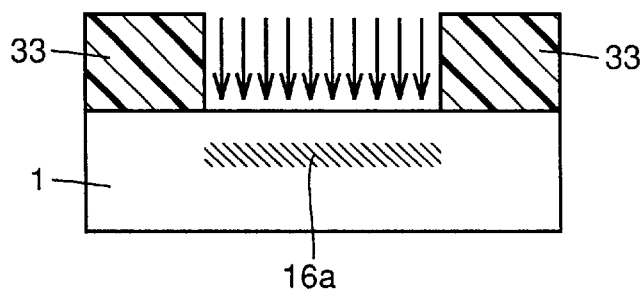
FIGS. 70 and 71 are schematic cross sections showing, in accordance with the order of steps, a method of manufacturing the nonvolatile semiconductor memory device of the embodiment 14 of the invention.

Referring to FIG. 70, a resist pattern 33 having a hole pattern at the floating gate electrode formation region is formed on p-type silicon substrate 1 by the conventional photolithography. Using resist pattern 33 as a mask, boron (B) is ion-implanted into a region immediately under the floating gate electrode formation region in p-type silicon substrate 1 under the conditions of about 80 keV and about $5 \times 10^{12}$ cm$^{-2}$. Thereby, p$^+$ region 16a is formed at a position immediately under the floating gate electrode formation region in p-type silicon substrate 1.

Figure 71:
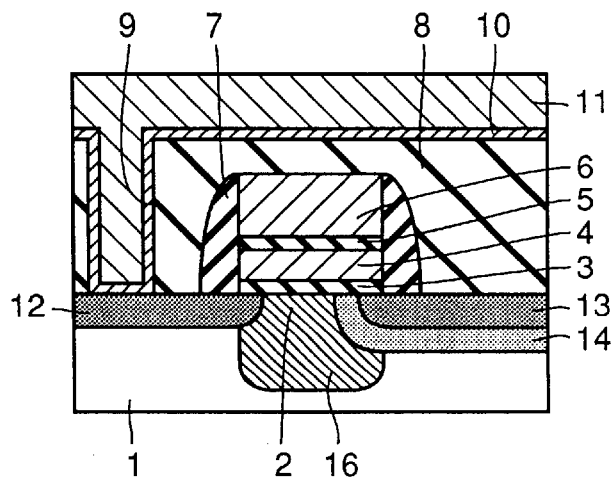

Thereafter, steps similar to those of the embodiment 2 are performed so that the nonvolatile semiconductor memory device shown in FIG. 71 is completed.

In the nonvolatile semiconductor memory device of this embodiment, since p$^+$ impurity region 16 is formed only at the region immediately under floating gate electrode 4, it is in contact with n-type region 14 and n$^+$ source diffusion region 12 only in this region. Therefore, capacitances of the diffusion regions in the source and drain are reduced. Accordingly, increase of the reading speed can be expected.

Embodiment 15

Figure 72:
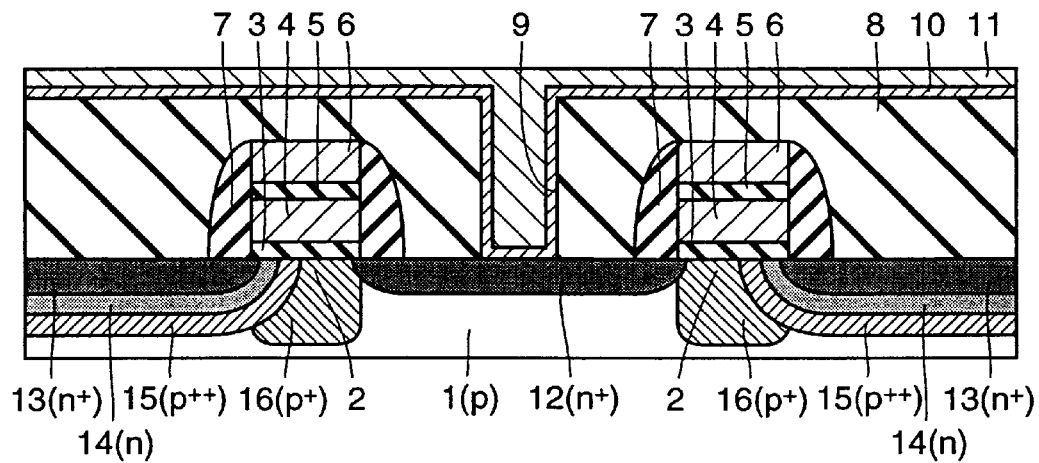
FIG. 72 is a cross section schematically showing a structure of a nonvolatile semiconductor memory device of an embodiment 15 of the invention.

Referring to FIG. 72, a structure of the nonvolatile semiconductor memory device of this embodiment differs from that of the embodiment 4 shown in FIG. 41 in the structure of p$^+$ impurity region 16. The p$^+$ impurity region 16 is formed only at a region immediately under floating gate electrode 4, and is in contact with p$^{++}$ pocket region 15 and n$^+$ source diffusion region 12 only in this region. The p$^+$ impurity region 16 has an impurity concentration which is higher than that of p-type silicon substrate 1 and is lower than that of p$^{++}$ pocket region 15.

According to the nonvolatile semiconductor memory device of this embodiment, capacitances of diffusion regions in the source and drain can be reduced similarly to the embodiment 14, and thus increase of the reading speed can be expected.

Embodiment 16

Figure 73:
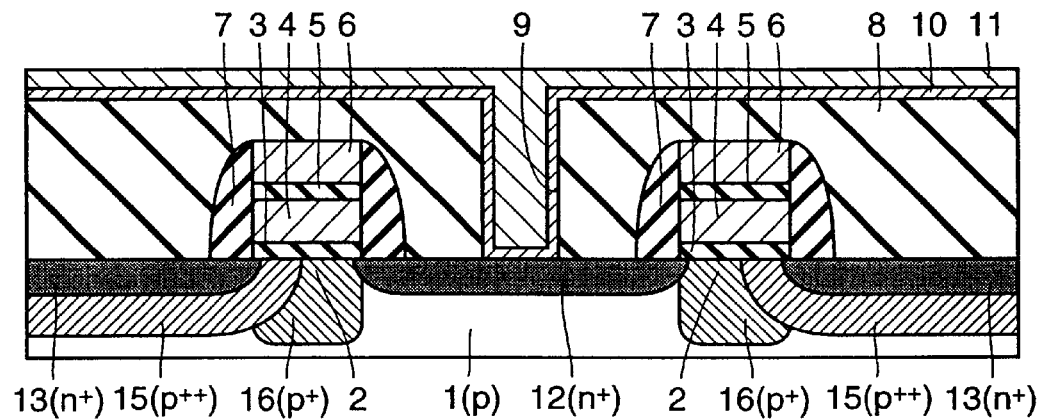
FIG. 73 is a cross section schematically showing a structure of a nonvolatile semiconductor memory device of an embodiment 16 of the invention.

Referring to FIG. 73, a structure of this embodiment differs from that of the embodiment 3 shown in FIG. 31 in the structure of p$^+$ impurity region 16. The p$^+$ impurity region 16 is formed only at a region immediately under floating gate electrode 4, and is in contact with p$^{++}$ pocket region 15 and n$^+$ source diffusion region 12 only in this region. The p$^+$ impurity region 16 has an impurity concentration which is higher than that of p-type silicon substrate 1 and is lower than that of p$^{++}$ pocket region 15.

Since structures other than the above are substantially the same as those of the embodiment 3 shown in FIG. 31, the same or similar portions and members bear the same reference characters and will not be described below.

A method of manufacturing the nonvolatile semiconductor memory device of this embodiment will be described below.

Figure 74:
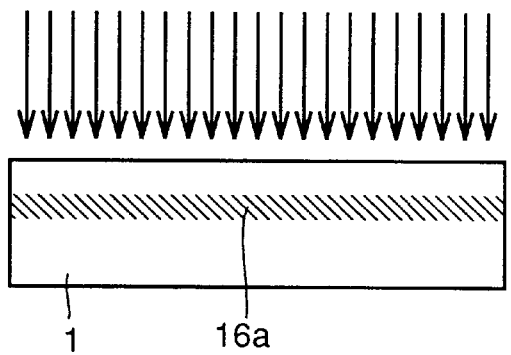
FIGS. 74 to 77 are schematic cross sections showing, in accordance with the order of steps, a method of manufacturing the nonvolatile semiconductor memory device of the embodiment 16 of the invention.

Referring to FIG. 74, boron (B) is ion-implanted into the whole surface of p-type silicon substrate 1 under the conditions of about 80 keV and about $5 \times 10^{12}$ cm$^{-2}$. Thereby, p-type region 16a is formed at a predetermined position in p-type silicon substrate 1.

Figure 75:
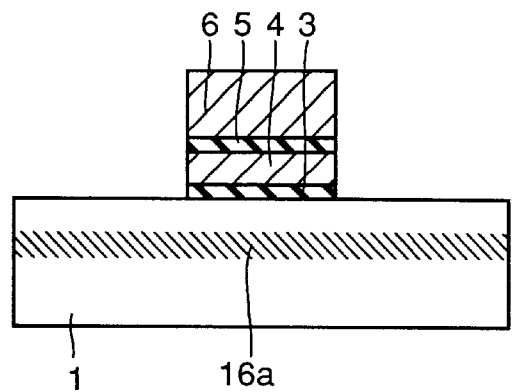

In the manufacturing method of this embodiment, steps similar to those of the embodiment 1 shown in FIGS. 2 to 4 are then executed. Thereafter, resist pattern 17 shown in FIG. 4 is removed to form a structure shown in FIG. 75.

Figure 76:
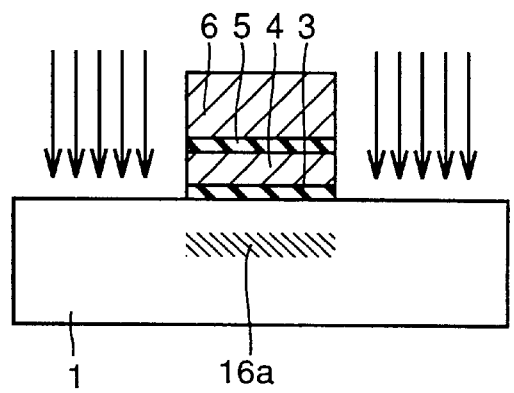
Figure 77:
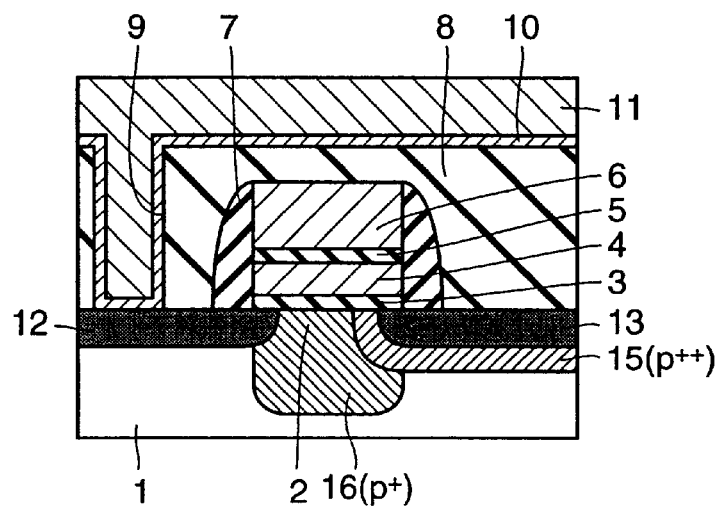

Referring to FIG. 76, impurity exhibiting the polarity opposite to that of boron is implanted in accordance with the range of boron implanted in the step in FIG. 74, using floating gate electrode 6 as a mask. Thereby, p-type region is canceled at the region not covered with floating gate electrode 4. Thus, p-type impurity region 16a remains only at the region immediately under the floating gate electrode 4. Thereafter, steps similar to those of the embodiment 3 are executed, so that the nonvolatile semiconductor memory device shown in FIG. 77 is completed.

According to the nonvolatile semiconductor memory device of this embodiment, capacitances of diffusion regions in the source and drain are reduced similarly to the embodiment 14, and thus increase of the reading speed can be expected.

The manufacturing method of the embodiment 14 can be applied to the embodiments 15 and 16, and the manufacturing method of the embodiment 16 can be applied to the embodiments 14 and 15.

Embodiment 17

Figure 78:
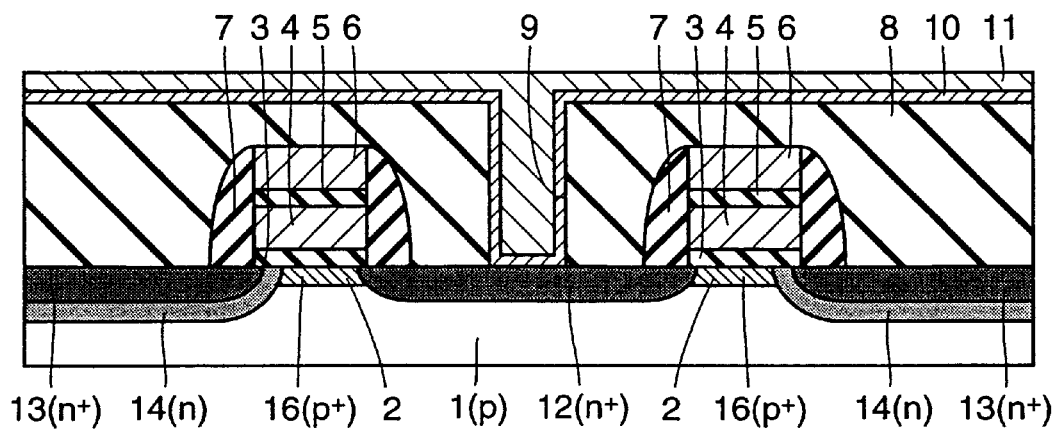
FIGS. 78 to 80 are cross sections schematically showing a structure of a nonvolatile semiconductor memory device of an embodiment 17 of the invention.
Figure 79:
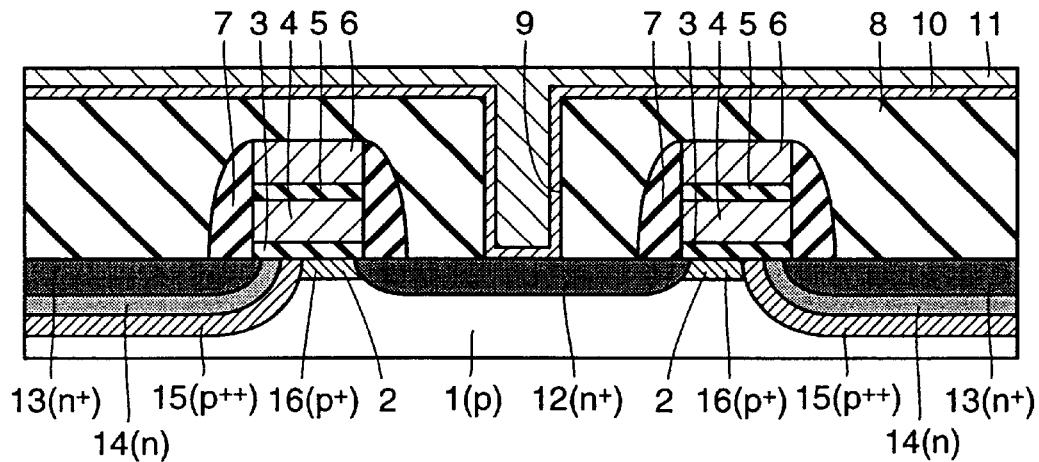
Figure 80:
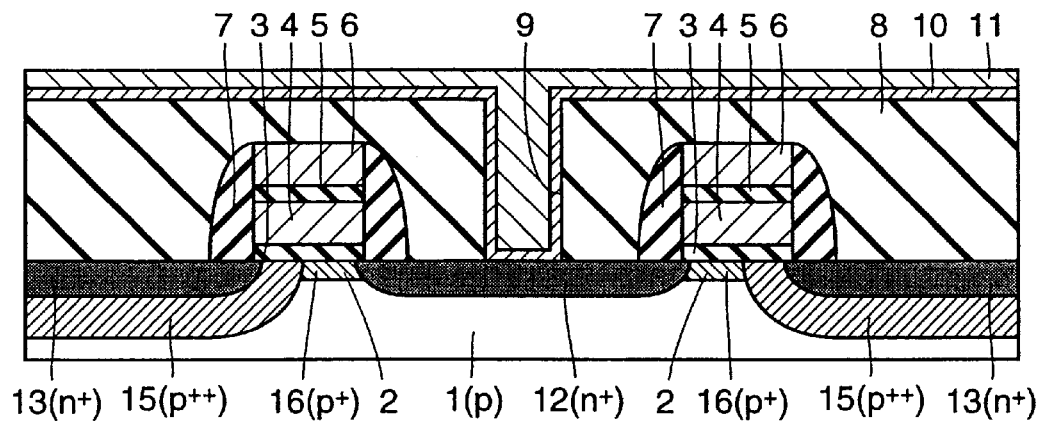
Figure 81:
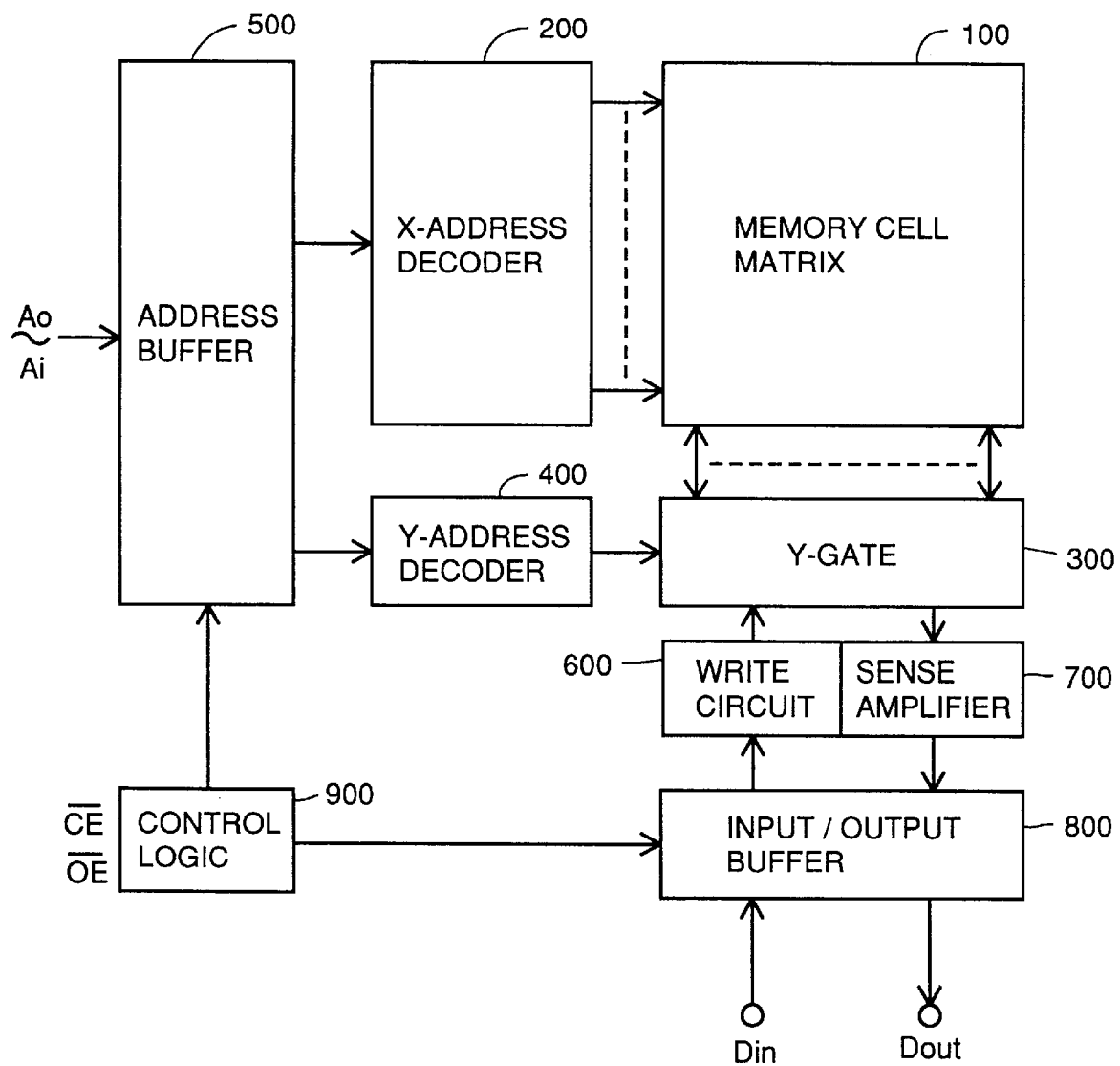
FIG. 81 is a block diagram showing a structure of a conventional flash memory.
Figure 82:
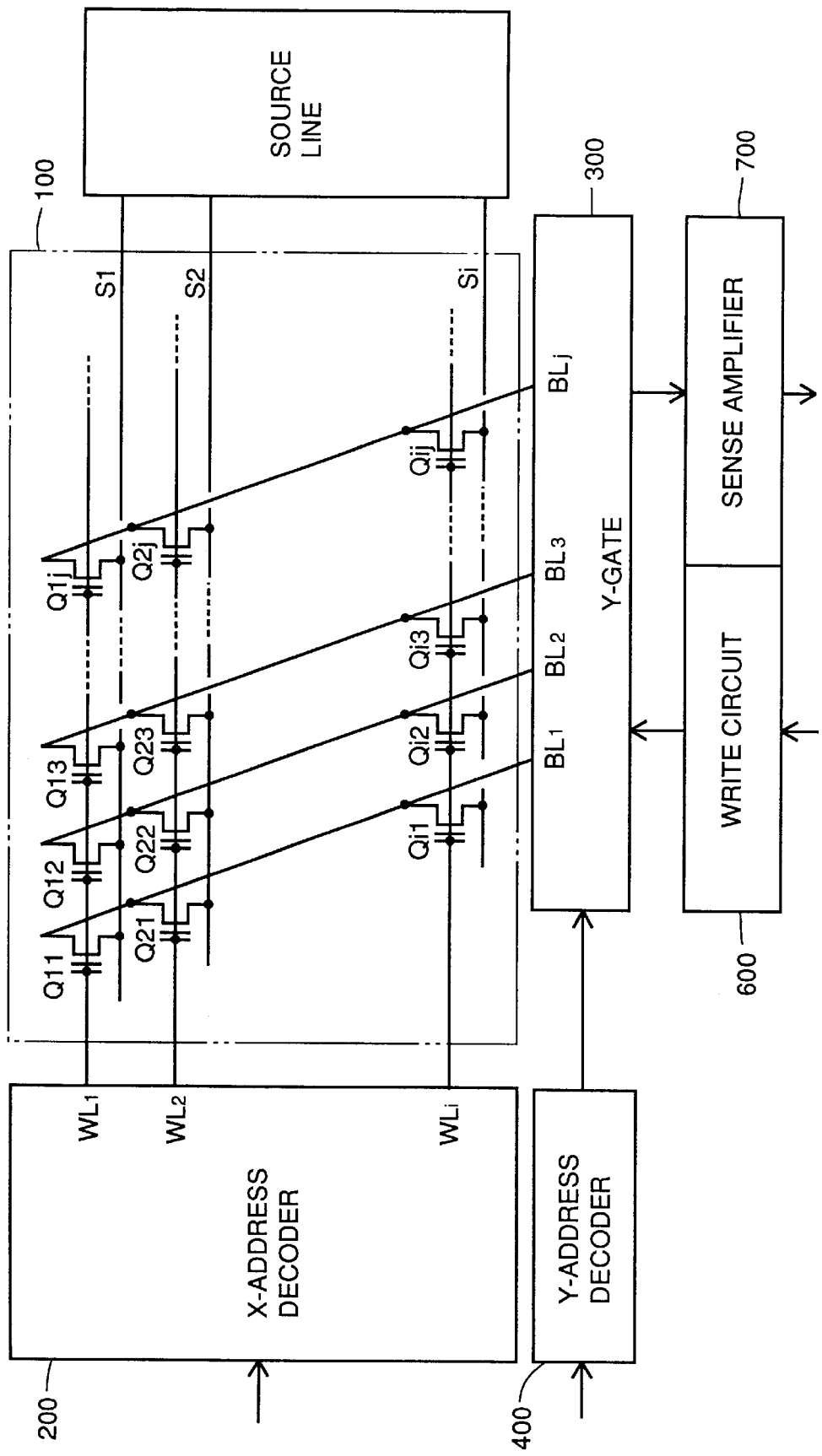
FIG. 82 is an equivalent circuit diagram showing a schematic structure of a memory matrix shown in FIG. 81.
Figure 83:
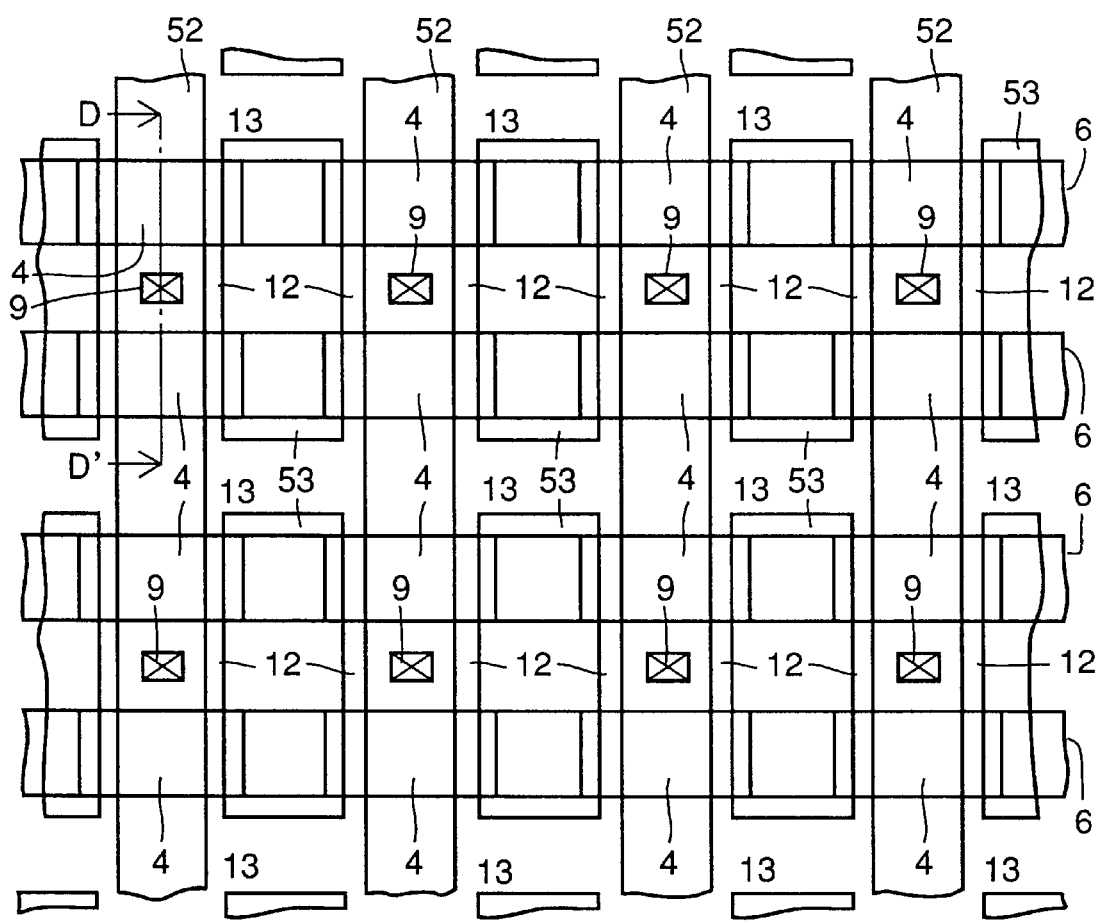
FIG. 83 is a fragmentary plan showing a schematic structure in a memory cell matrix of a conventional flash memory.
Figure 84:
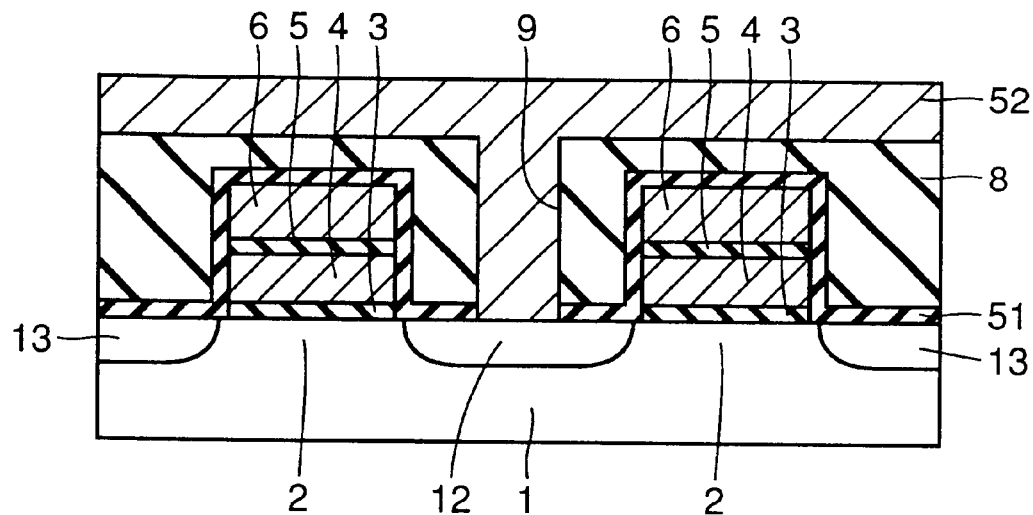
FIG. 84 is a cross section taken along line D–D' in FIG. 83.
Figure 85:
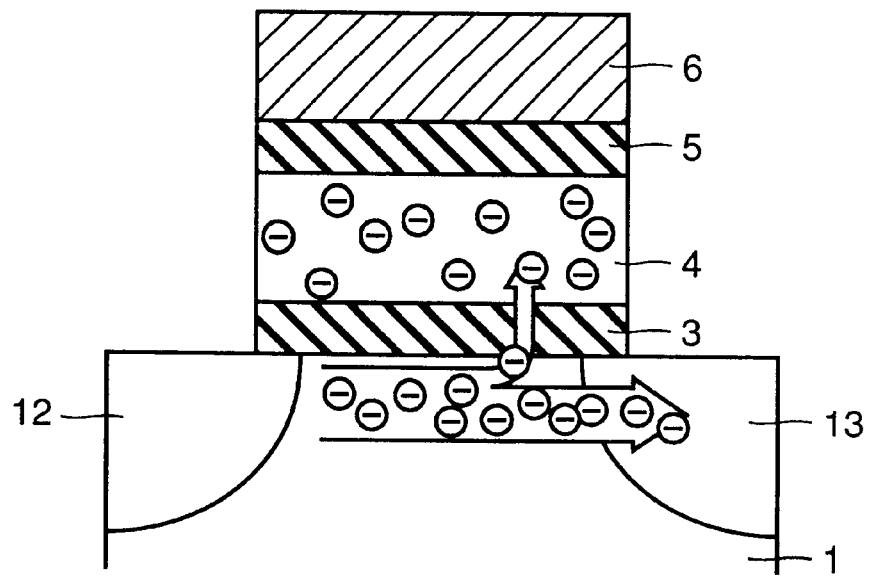
FIG. 85 shows a write operation of a flash EEPROM utilizing channel hot electrons.
Figure 86:
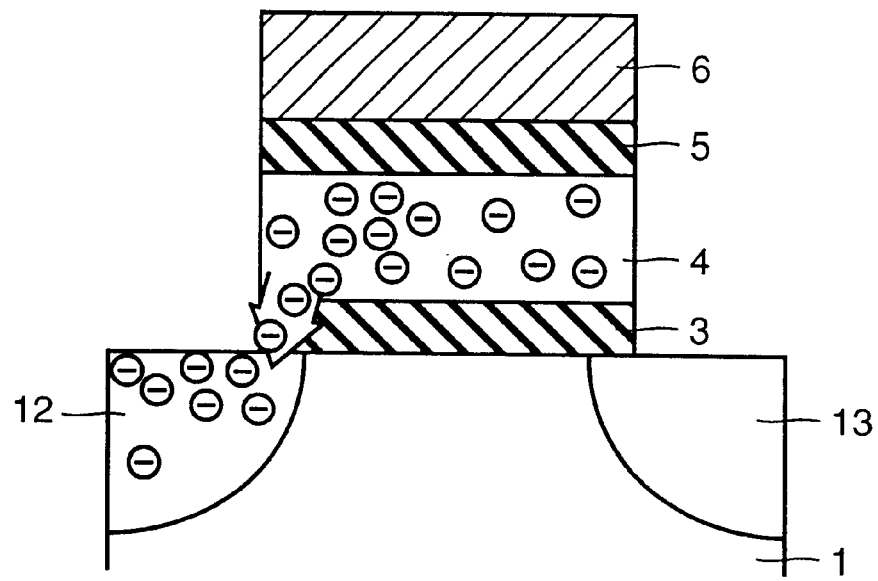
FIG. 86 shows an erase operation utilizing an F-N tunnel phenomenon.
Figure 87:
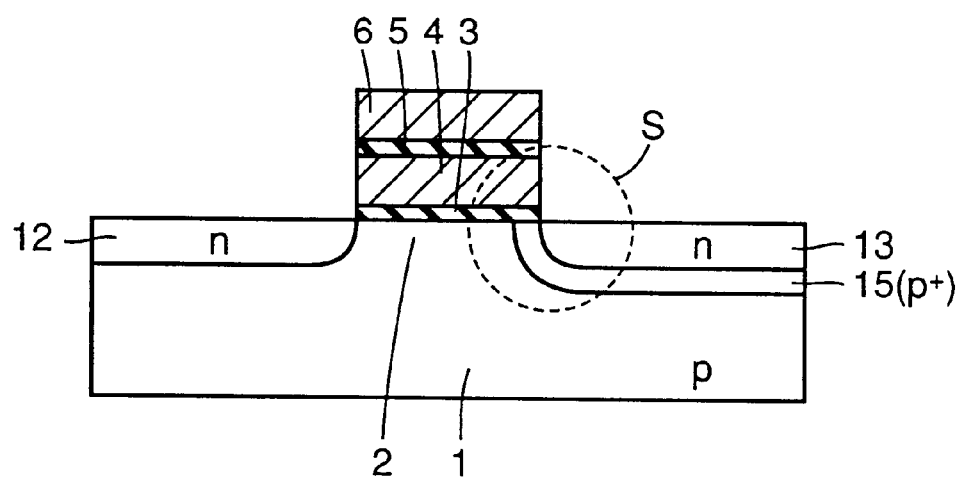
FIG. 87 is a cross section schematically showing a structure of a conventional nonvolatile semiconductor memory device.
Figure 88:
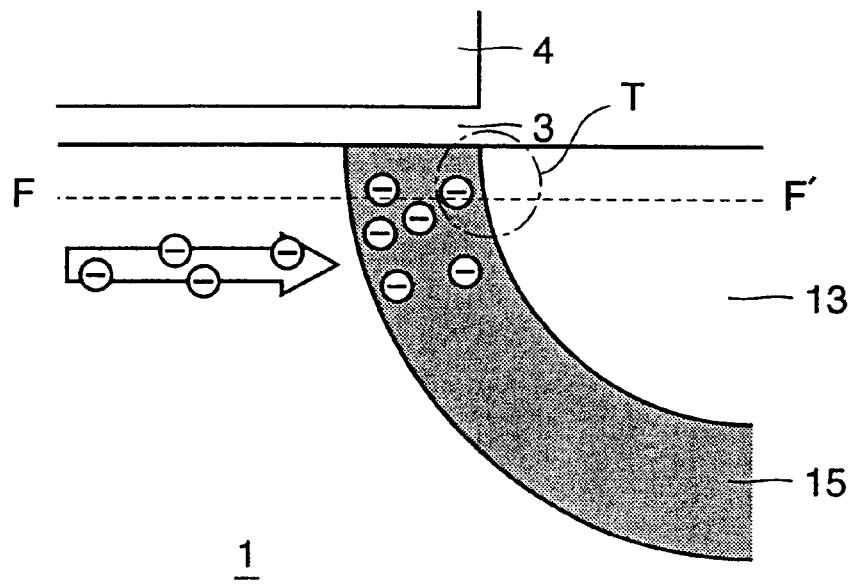
FIG. 88 is a fragmentary cross section showing, on an enlarged scale, a portion S in FIG. 87.
Figure 89:
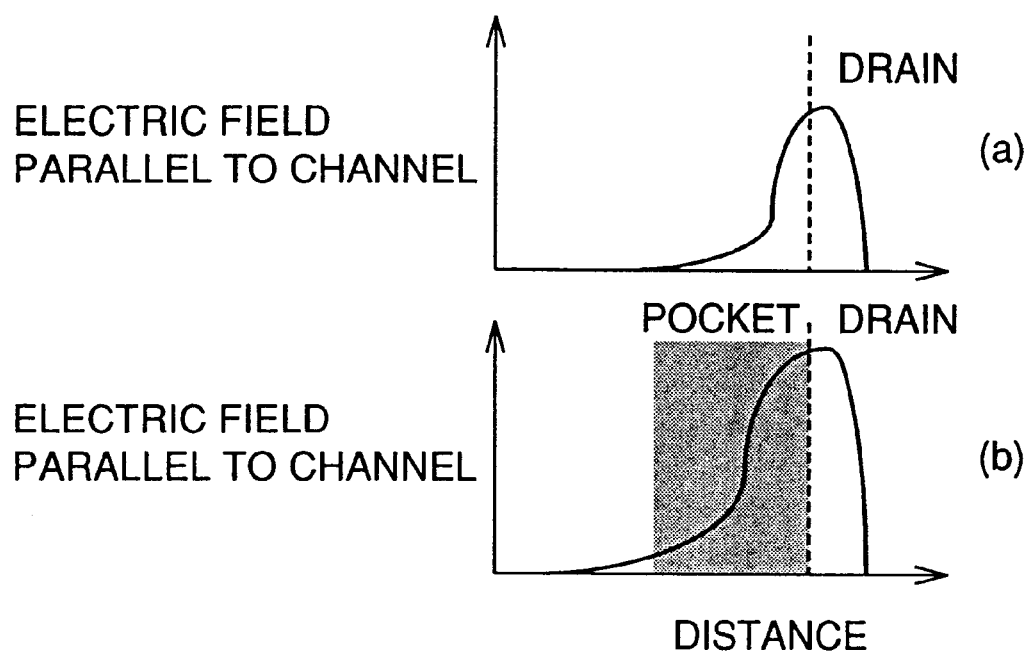
FIG. 89 is a graph showing change of an electric field parallel to a channel in structures provided with a pocket region and not provided with the same.
Figure 90:
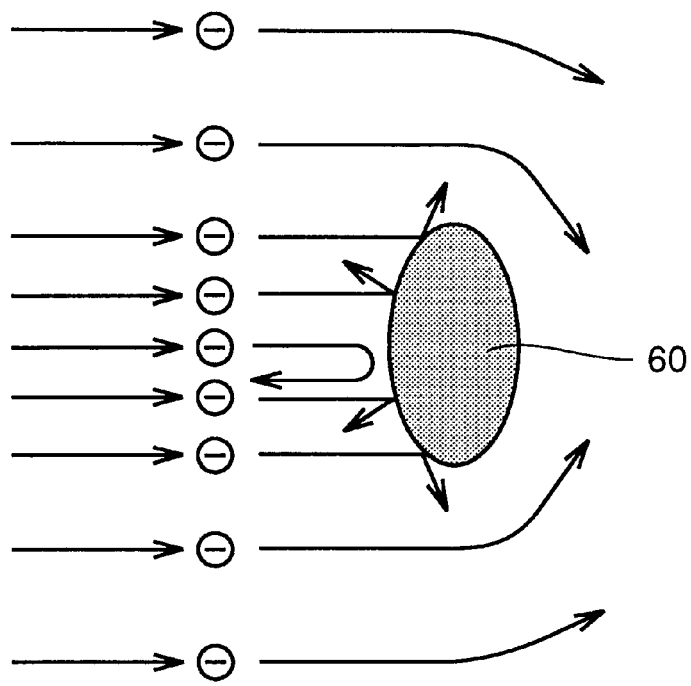
FIG. 90 shows a manner of change of a moving direction of high energy electrons by elastic scattering.
Figure 91:
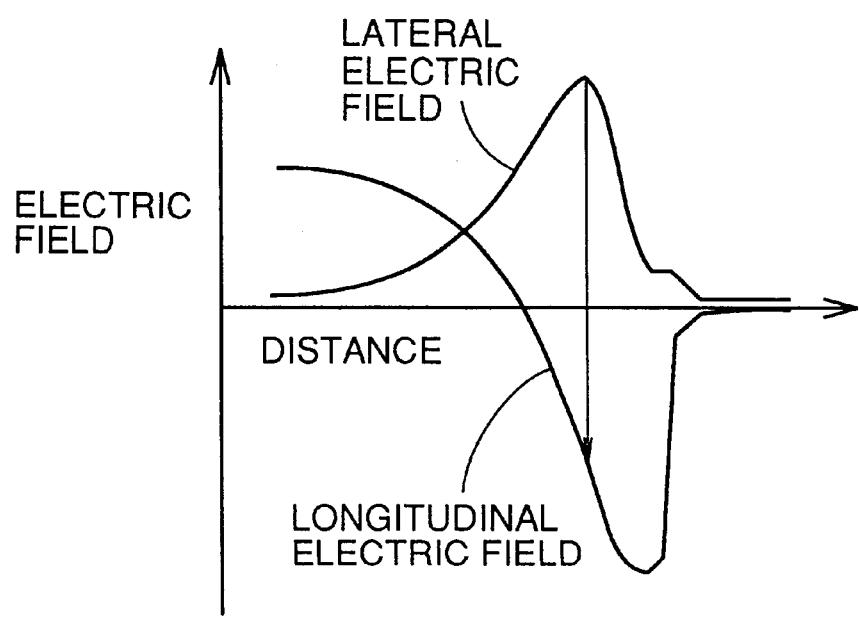
FIG. 91 shows lateral and longitudinal electric fields of an insulating film.
Figure 92A:
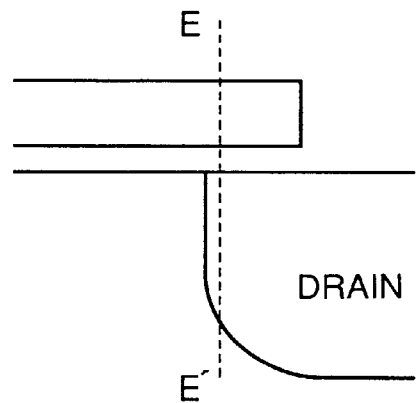
FIG. 92A is a fragmentary cross section showing, on an enlarged scale, a drain end of a conventional MOS transistor.
Figure 92B:
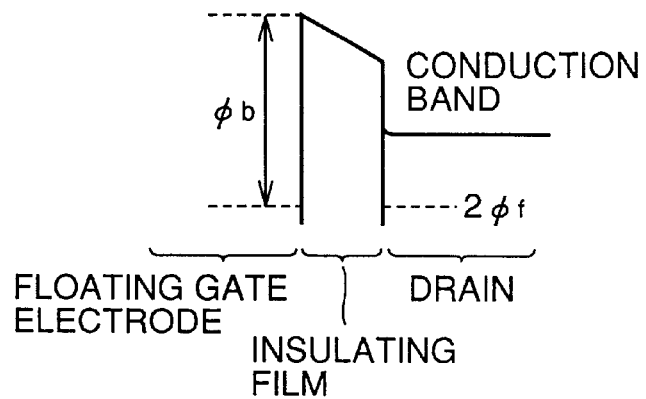
FIG. 92B shows change of a potential distribution in a direction vertical to a channel at the drain end of the conventional MOS transistor.
Figure 93:
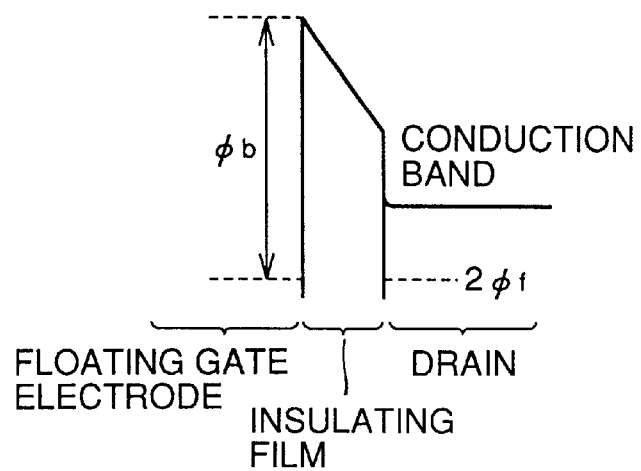
FIG. 93 shows increase in height of a barrier of an insulating film against electrons in accordance with increase of a potential difference at the insulating film.

FIGS. 78, 79 and 80 are cross sections schematically showing structures of the nonvolatile semiconductor memory devices of the embodiment 17 which correspond to improvements of the structures of the embodiments 14 to 16, respectively.

More specifically, the structures shown in FIGS. 78 to 80 correspond to the structures of the embodiments 14 to 16 shown in FIGS. 69, 72 and 73, respectively, except for that p$^+$ impurity region 16 has a depth from the surface of p-type silicon substrate 1 which is smaller than those of n$^+$ source diffusion region 12 and n$^+$ drain diffusion region 13. The p$^+$ impurity region 16 has an impurity concentration higher than that of p-type silicon substrate 1.

In the structures of FIGS. 78 to 80, as described above, p$^+$ impurity region 16 is shallower than those in the structures of the embodiments 14 to 16, whereby it is possible to prevent variation of the threshold voltage which may be caused by variation of the substrate potential. Therefore, it is possible to suppress variation of an unfixed potential of a terminal in an open state.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A nonvolatile semiconductor memory device allowing electrical erasing and writing of data comprising:

a semiconductor substrate of a first conductivity type having a main surface;

a charge accumulating electrode layer formed on the main surface of said semiconductor substrate with a first insulating film therebetween;

a control electrode layer formed on said charge accumulating electrode layer with a second insulating film therebetween;

a pair of source/drain regions of a second conductivity type formed at the main surface of said semiconductor substrate and located at opposite sides of a region of said semiconductor substrate located under said charge accumulating electrode layer, said drain region extending to a region of said semiconductor substrate located immediately under said charge accumulating electrode layer;

a first impurity region of the second conductivity type formed in contact with said drain region at the main surface of said semiconductor substrate located immediately under said charge accumulating electrode layer, and having an impurity concentration lower than that of said drain region;

a second impurity region of the first conductivity type being in contact with said first impurity region at the main surface under said semiconductor substrate located immediately under said charge accumulating electrode layer, and having an impurity concentration higher than that of said semiconductor substrate; and a third impurity region of the first conductivity type covering peripheries of said source region and said second impurity region while being in contact with said source region and said second impurity region, and having an impurity concentration higher than that of said semiconductor substrate and lower than that of said second impurity region, wherein a lateral electric field of a region where said first impurity region is in contact with said drain region in the vicinity of the main surface of said semiconductor substrate is lower than that of a region where said first impurity region is in contact with said second impurity region in the vicinity of the main surface of said semiconductor substrate.

2. The nonvolatile semiconductor memory device according to claim 1, wherein said third impurity region is in contact with said source region at the main surface of said semiconductor substrate directly below said charge accumulating electrode layer.

3. The nonvolatile semiconductor memory device according to claim 2, wherein said device further comprises a third impurity region of the first conductivity type covering said first impurity region while being in contact with said first impurity region, and having an impurity concentration higher than that of said second impurity region, and said third impurity region exists between said second impurity region and said first impurity region.

4. The nonvolatile semiconductor memory device according to claim 1, wherein said first impurity region is in contact with and surrounding said drain region, and said third impurity region covers peripheries of said source region and said first impurity region.

5. A nonvolatile semiconductor memory device allowing electrical erasing and writing of data comprising:

a semiconductor substrate of a first conductivity type having a main surface;

a charge accumulating electrode layer formed on the main surface of said semiconductor substrate with a first insulating film therebetween;

a control electrode layer formed on said charge accumulating electrode layer with a second insulating film therebetween;

a pair of source/drain regions of a second conductivity type formed at the main surface of said semiconductor substrate and located at opposite sides of a region of said semiconductor substrate located under said charge accumulating electrode layer;

said drain region extending to a region of said semiconductor substrate located immediately under said charge accumulating electrode layer;

a first impurity region of the second conductivity type in contact with said drain region at the main surface of said semiconductor substrate located immediately under said charge accumulating electrode layer, and having an impurity concentration lower than that of said drain region;

a second impurity region of the first conductivity type being in contact with said first impurity region at the main surface of said semiconductor substrate located immediately under said charge accumulating electrode layer, and having an impurity concentration higher than that of said semiconductor substrate, wherein a lateral electric field of a region where said first impurity region is in contact with said drain region in the vicinity of the main surface of said semiconductor substrate is lower than that of a region where said first impurity region is in contact with said second impurity region in the vicinity of the main surface of said semiconductor substrate; and a third impurity region of the second conductivity type formed in at least one of said drain region and said source region having an impurity concentration higher than that of said drain region and said source region.

6. A nonvolatile semiconductor memory device allowing electrical erasing and writing of data comprising:

a semiconductor substrate of a first conductivity type having a main surface;

a charge accumulating electrode layer formed on the main surface of said semiconductor substrate with a first insulating film therebetween;

a control electrode layer formed on said charge accumulating electrode layer with a second insulating film therebetween;

a pair of source/drain regions of a second conductivity type formed at the main surface of said semiconductor substrate and located at opposite sides of a region of said semiconductor substrate located under said charge accumulating electrode layer;

said drain region extending to a region of said semiconductor substrate located immediately under said charge accumulating electrode layer;

a first impurity region of the second conductivity type in contact with said drain region at the main surface of said semiconductor substrate located immediately under said charge accumulating electrode layer, and having an impurity concentration lower than that of said drain region;

a second impurity region of the first conductivity type being in contact with said first impurity region at the main surface of said semiconductor substrate located immediately under said charge accumulating electrode layer, and having an impurity concentration higher than that of said semiconductor substrate, wherein a lateral electric field of a region where said first impurity region is in contact with said drain region in the vicinity of the main surface of said semiconductor substrate is lower than that of a region where said first impurity region is in contact with said second impurity region in the vicinity of the main surface of said semiconductor substrate; and a third impurity region covering a periphery of said source region while being in contact with said source region, extending to a region of said semiconductor substrate immediately under said charge accumulating electrode layer, and having an impurity concentration lower than that of said source region.

7. The nonvolatile semiconductor memory device according to claim 6, wherein said source region and said drain region have different depths from the main surface of said semiconductor substrate.

8. The nonvolatile semiconductor memory device according to claim 6, wherein said source region and said drain region have different impurity concentrations.

9. The nonvolatile semiconductor memory device according to claim 6, wherein said third impurity region and said drain region have different depths from the main surface of said semiconductor substrate.

10. The nonvolatile semiconductor memory device according to claim 6, wherein said third impurity region and said drain region have different impurity concentrations.

11. A nonvolatile semiconductor memory device allowing electrical erasing and writing of data comprising:
   a semiconductor substrate of a first conductivity type having a main surface;
   a charge accumulating electrode layer formed on the main surface of said semiconductor substrate with a first insulating film therebetween;
   a control electrode layer formed on said charge accumulating electrode layer with a second insulating film therebetween;
   a pair of source/drain regions of a second conductivity type formed at the main surface of said semiconductor substrate, and located at opposite sides of a region of said semiconductor substrate located under said charge accumulating electrode layer;
   said drain region extending to a region of said semiconductor substrate located immediately under said charge accumulating electrode layer, and containing impurity at a concentration of $1 \times 10^{20}$ cm$^{-3}$ or more;
   a first impurity region of the first conductivity type covering a periphery of said drain region while being in contact with said drain region, and having an impurity concentration larger than that of said semiconductor substrate; and
   a second impurity region of the first conductivity type formed in contact with said source region and said first impurity region at a region of said semiconductor substrate located immediately under said charge accumulating electrode layer, and having an impurity concentration higher than that of said semiconductor substrate and lower than that of said first impurity region.

12. The nonvolatile semiconductor memory device according to claim 11, wherein a depth of said second impurity region from the main surface of said semiconductor substrate is smaller than that of said source/drain regions.

13. The nonvolatile semiconductor memory device according to claim 11, wherein said second impurity region covers peripheries of said source region and said first impurity region while it is in contact with said source region and said first impurity region.

14. A nonvolatile semiconductor memory device allowing electrical erasing and writing of data comprising:
   a semiconductor substrate of a first conductivity type having a main surface;
   a charge accumulating electrode layer formed on the main surface of said semiconductor substrate with a first insulating film therebetween;
   a control electrode layer formed on said charge accumulating electrode layer with a second insulating film therebetween;
   a pair of source/drain regions of a second conductivity type formed at the main surface of said semiconductor substrate and located at opposite sides of a region of said semiconductor substrate located under said charge accumulating electrode layer,
   said drain region extending to a region of said semiconductor substrate located immediately under said charge accumulating electrode layer;
   a first impurity region of the first conductivity type covering a periphery of said drain region and having an impurity concentration higher than that of said semiconductor substrate; and
   a second impurity region of the first conductivity type formed in contact with said source region and said first impurity region at a region of said semiconductor substrate located immediately under said charge accumulating electrode of said semiconductor substrate and lower than that of said first impurity region.

15. The nonvolatile semiconductor memory device according to claim 14, wherein depth of said second impurity region from the main surface of said semiconductor substrate is smaller than that of said source/drain regions.

16. The nonvolatile semiconductor memory device according to claim 14, wherein said second impurity region covers peripheries of said source region and said first impurity region while it is in contact with said source region and said first impurity region.

17. The nonvolatile semiconductor memory device according to claim 14, further comprising a third impurity region of the second conductivity type formed between said drain region and said first impurity region and having an impurity concentration lower than that of said drain region.

18. The nonvolatile semiconductor memory device according to claim 14, wherein
   said second impurity region is in contact with said source region at the main surface of said semiconductor substrate located immediately under said charge accumulating electrode layer.

19. A nonvolatile semiconductor memory device allowing electrical erasing and writing of data comprising:
   a semiconductor substrate of a first conductivity type having a main surface;
   a charge accumulating electrode layer formed on the main surface of said semiconductor substrate with a first insulating film therebetween;
   a control electrode layer formed on said charge accumulating electrode layer with a second insulating film therebetween;
   a pair of source/drain regions of a second conductivity type formed at the main surface of said semiconductor substrate and located at opposite sides of a region of said semiconductor substrate located under said charge accumulating electrode layer,
   said drain region extending to a region of said semiconductor substrate located immediately under said charge accumulating electrode layer;
   a first impurity region of the first conductivity type covering a periphery of said drain region while being in contact with said drain region and having an impurity concentration higher than that of said semiconductor substrate; and
   a second impurity region of the second conductivity type formed in at least one of said source region and said drain region and having an impurity concentration higher than said source region and said drain region.

20. The nonvolatile semiconductor memory device according to claim 19, further comprising a third impurity region of the second conductivity type located between said drain region and said first impurity region and having an impurity concentration lower than that of said drain region.

* * * * *